US012531178B2

(12) United States Patent
Khaligh et al.

(10) Patent No.: US 12,531,178 B2
(45) Date of Patent: Jan. 20, 2026

(54) MULTIPLE WINDING INTEGRATED TRANSFORMERS

(71) Applicant: University of Maryland, College Park, College Park, MD (US)

(72) Inventors: Alireza Khaligh, Arlington, VA (US); Shenli Zou, Redondo Beach, CA (US); Akshay Singh, Mountain View, CA (US); Chanaka Singhabahu, College Park, MD (US)

(73) Assignee: University of Maryland, College Park, College Park, MD (US)

( * ) Notice: Subject to any disclaimer, the term of this patent is extended or adjusted under 35 U.S.C. 154(b) by 1021 days.

(21) Appl. No.: 17/539,117

(22) Filed: Nov. 30, 2021

(65) Prior Publication Data
US 2022/0172880 A1 Jun. 2, 2022

Related U.S. Application Data

(60) Provisional application No. 63/119,615, filed on Nov. 30, 2020.

(51) Int. Cl.
*H01F 27/28* (2006.01)
*H01F 27/24* (2006.01)
*H05K 1/16* (2006.01)

(52) U.S. Cl.
CPC ......... *H01F 27/2804* (2013.01); *H01F 27/24* (2013.01); *H05K 1/165* (2013.01); *H01F 2027/2809* (2013.01)

(58) Field of Classification Search
CPC ................. H01F 27/2804; H01F 27/24; H01F 2027/2809; H05K 1/165
See application file for complete search history.

(56) References Cited

U.S. PATENT DOCUMENTS 7,187,263 B2 * 3/2007 Vinciarelli .......... H01F 27/2804
336/200
8,896,403 B2 * 11/2014 Beyer ................. H01F 27/2804
336/173

(Continued)

FOREIGN PATENT DOCUMENTS

JP       5998774 B2 *  9/2016

OTHER PUBLICATIONS

Baek et al., "Isolation transformer for 3-port 3-phase dual-active bridge converters in medium voltage level." IEEE Access 7 (2019): 19678-19687.

(Continued)

*Primary Examiner* — Malcolm Barnes
(74) *Attorney, Agent, or Firm* — Quarles & Brady LLP; Yakov S. Sidorin

(57) ABSTRACT

A set of multi-winding transformer designs that achieve leakage integration in multi-port power electronics systems is presented. The magnetic design structures are extendable to realize an N-port multi-winding transformer with or without leakage inductance integration, that interfaces different voltage levels (high-voltage and/or low-voltage) with galvanic isolation. The disclosed designs enable: (i) reduced number of discrete magnetic components (ii) high efficiency and high power density; (iii) reduced transformer parasitic capacitances. Furthermore, a global transformer optimization approach that considers magnetizing and leakage inductances, core and winding losses, and parasitic capacitances is presented to systemize the sophisticated multi-winding integrated leakage transformer design process.

9 Claims, 58 Drawing Sheets

(56) References Cited

U.S. PATENT DOCUMENTS

| | | | |
|---|---|---|---|
| 9,931,951 B2 | 4/2018 | Khaligh et al. | |
| 2004/0145445 A1* | 7/2004 | Yang | H01F 27/2804 336/223 |
| 2019/0075657 A1* | 3/2019 | Esposito | H01F 27/24 |
| 2019/0371512 A1* | 12/2019 | Dai | H01F 27/255 |
| 2020/0219647 A1* | 7/2020 | Ji | H01F 3/08 |
| 2021/0155100 A1 | 5/2021 | Khaligh et al. | |

OTHER PUBLICATIONS

Fei et al., "High-Efficiency High-Power-Density LLC Converter With an Integrated Planar Matrix Transformer for High-Output Current Applications," in IEEE Transactions on Industrial Electronics, vol. 64, No. 11, pp. 9072-9082, Nov. 2017, doi: 10.1109/TIE.2017.2674599.

Garcia-Bediaga et al., "Multiobjective Optimization of Medium-Frequency Transformers for Isolated Soft-Switching Converters Using a Genetic Algorithm," IEEE Transactions on Power Electronics, vol. 32, No. 4, pp. 2995-3006, Apr. 2017.

He et al., "High-power-density high-efficiency LLC converter with an adjustable-leakage-inductance planar transformer for data centers," IET Power Electronics, vol. 12, No. 2, pp. 303-310, 2019, doi: 10.1049/iet-pel.2018.5299.

Knabben et al., "New PCB Winding "Snake-Core" Matrix Transformer for Ultra-Compact Wide DC Input Voltage Range Hybrid B+DCM Resonant Server Power Supply," in 2018 IEEE International Power Electronics and Application Conference and Exposition (PEAC), Nov. 2018, pp. 1-6. doi: 10.1109/PEAC.2018.8590430.

Ouyang et al. "Four Quadrants Integrated Transformers for Dual-Input Isolated DC-DC Converters," IEEE Transactions on Power Electronics, vol. 27, No. 6, pp. 2697-2702, Jun. 2012.

Tang et al., "An Integrated Dual-Output Isolated Converter for Plug-in Electric Vehicles," IEEE Transactions on Vehicular Technology, vol. 67, No. 2, pp. 966-976, Feb. 2018.

Zhang et al., "Leakage Inductance Calculation for Planar Transformers With a Magnetic Shunt," IEEE Transactions on Industry Applications, vol. 50, No. 6, pp. 4107-4112, Nov. 2014, doi: 10.1109/TIA.2014.2322140.

Zou et al., "Modelling and control of a triple-active-bridge converter." IET Power Electronics, 13: 961-969. 2020.

* cited by examiner

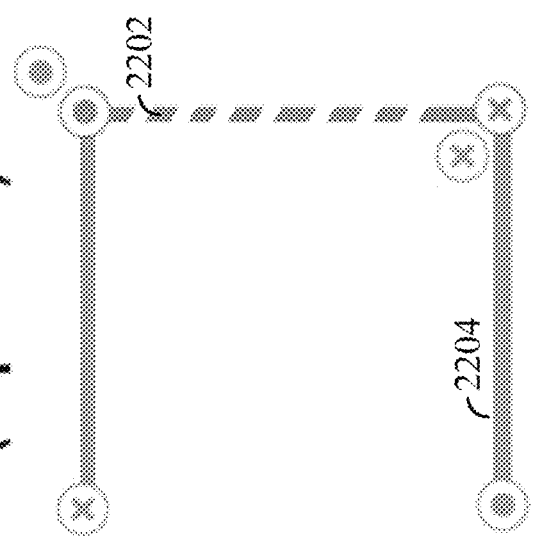
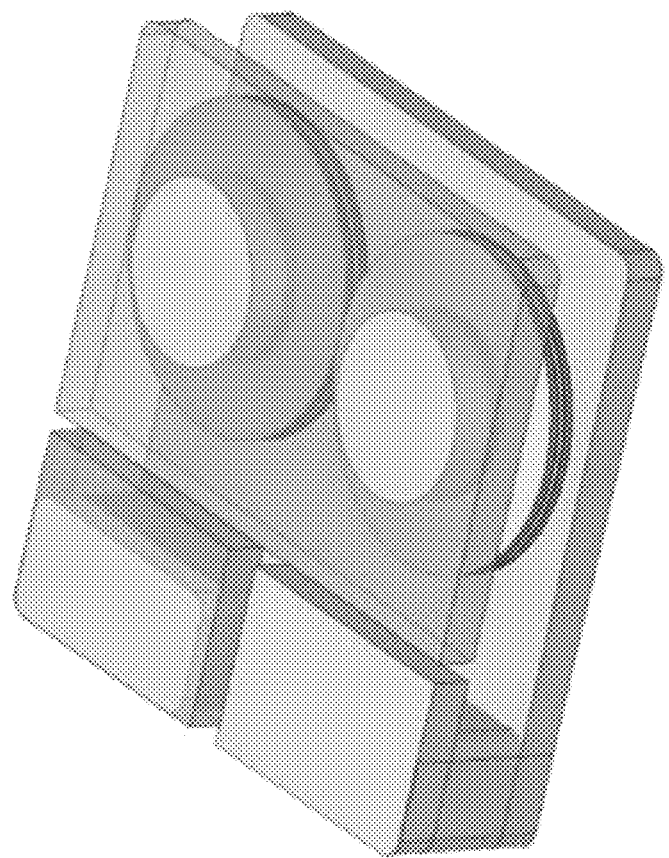
FIG. 22(b)

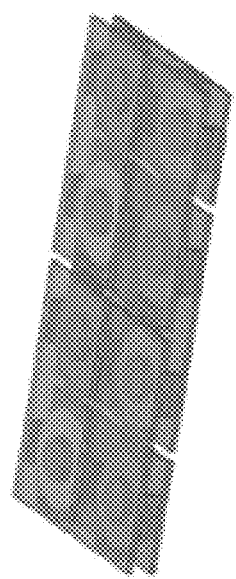
FIG. 29(c) Final Assembly
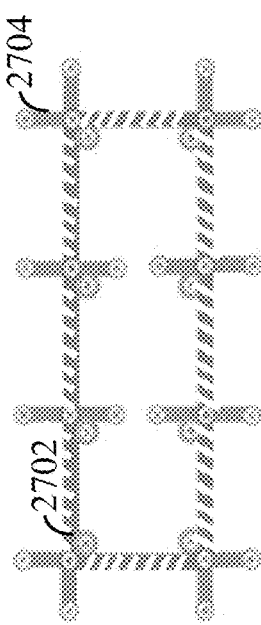
FIG. 29(b) Exploded View
FIG. 29(a) Equivalent Main and Leakage flux paths (top view)

MULTIPLE WINDING INTEGRATED TRANSFORMERS

CROSS-REFERENCE TO RELATED APPLICATIONS

This application claims the benefit of U.S. Provisional Patent Application No. 63/119,615, filed Nov. 30, 2020, which is incorporated by reference herein in its entirety for all purposes.

STATEMENT OF GOVERNMENT SUPPORT

This invention was made with government support under IIP1602012 awarded by the National Science Foundation. The government has certain rights in the invention.

STATEMENT OF GOVERNMENT SUPPORT

Technical Field

The disclosure relates to multi-winding transformers in power electronic systems.

Background and Description of the Related Art

There are several power electronic parts/systems that significantly benefit from magnetic integration of electrical ports that interface different voltage levels. Magnetic integration can be achieved through multi-winding transformers or coupled inductors. This disclosure addresses magnetic integration through multi-winding transformers with various core/winding geometries and structures. There are several target applications for such multi-winding/multi-port transformers, including, but not limited to, electric vehicle (EV) charging systems, data center power distribution, renewable energy, next-generation DC home distribution, and more electric aircraft (MEA) power distribution.

An example of the benefits of such magnetic integration is the integrated on-board charger and auxiliary power module system for EVs. Conventionally, there are two independent battery charger units inside an EV. An on-board charger (OBC) is used to charge the vehicle main high voltage (HV) traction battery. An auxiliary power module (APM) is another separate power unit to charge the low voltage (LV) battery, supplying consumer electronics on vehicles. To reduce the total volume and weight of these battery charger units, it is desirable to integrate both units, either mechanically or electrically. Mechanical integration means that OBC and APM are still two separate systems electrically while they share the same enclosure, connectors, and cooling system. On the other hand, electrical integration is more promising due to the fewer component counts and capability of providing additional operation modes, see A. Khaligh and Y. Tang, "Integrated dual-output grid-to-vehicle (G2V) and vehicle-to-grid (V2G) onboard charger for plug-in electric vehicles," U.S. Pat. No. 9,931,951B2, Apr. 3, 2018; and A. Khaligh, J. Lu, A. Mallik, and S. Zou, "Vehicle On-Board Charger for Bi-directional Charging of Low/High Voltage Batteries." PCT Application No. PCT/US19/26779.

Most importantly, simultaneous charging of both HV and LV batteries can be realized only through electrical integration. This function means that the input power flows from one port to the other two ports simultaneously, which is essentially needed when both batteries have a low state of charge (SoC). Another key application area for such multi-winding transformers is for integration of the energy routing system into a single unit, for the next-generation smart DC homes. In such smart home DC distribution systems, power converters interface the AC grid to various DC voltage buses (such as 1200V, 800V, 400V, 48V, 24V, 12V, etc.). While most current architectures use at least two conversion stages and multiple discrete converters for each pair of voltage level conversion, the disclosed technology integrates all power electronics into a single-stage multi-port energy router with multi-directional (multiple-input multiple-output, or MIMO) power transfer capability. This results in substantial benefits in the converter power density and efficiency, compared to discrete two-stage converters.

The key idea of this disclosure is a set of multi-winding integrated transformer designs with controllable leakage inductance and high efficiency (minimal transformer losses). The integration techniques presented herein form a key technology to magnetically integrate multiple isolated power conversion units into a single unit.

Three-winding transformers have been investigated in the literature, see Xusheng Chen and S. S. Venkata, "A three-phase three-winding core-type transformer model for low-frequency transient studies," IEEE Transactions on Power Delivery, vol. 12, no. 2, pp. 775-782, April 1997; S. Baek and S. Bhattacharya, "Isolation Transformer for 3-Port 3-Phase Dual-Active Bridge Converters in Medium Voltage Level," IEEE Access, vol. 7, pp. 19678-19687, 2019; and A. Garcia-Bediaga, I. Villar, A. Ruj as, L. Mir, and A. Rufer, "Multiobjective Optimization of Medium-Frequency Transformers for Isolated Soft-Switching Converters Using a Genetic Algorithm," IEEE Transactions on Power Electronics, vol. 32, no. 4, pp. 2995-3006, April 2017. The traditional approach of using a three-winding transformer with a center leg twice the width of the outer legs, see Xusheng Chen and S. S. Venkata; and S. Baek and S. Bhattacharya, is not suitable in this case due to the inherently unbalanced flux distribution of the core. On the other hand, research on the three-winding integrated transformers in the single-phase system have been conducted. In Y. Tang, J. Lu, B. Wu, S. Zou, W. Ding, and A. Khaligh, "An Integrated Dual-Output Isolated Converter for Plug-in Electric Vehicles," IEEE Transactions on Vehicular Technology, vol. 67, no. 2, pp. 966-976, February 2018, a three-winding transformer is developed for the CLLC and LLC resonant converter integration, as shown in FIG. 1. The tertiary winding is made of copper bar and needs massive labor, making it difficult for commercial manufacturing. Moreover, the implementation of a standard EE core limits the simultaneous charging function due to high winding loss.

FIG. 2 shows a configuration in which the split-winding structure is utilized for the integration, see Z. Zhang, B. He, D. Hu, X. Ren, and Q. Chen, "Multi-Winding Configuration Optimization of Multi-Output Planar Transformers in GaN Active Forward Converters for Satellite Applications," IEEE Transactions on Power Electronics, vol. 34, no. 5, pp. 4465-4479, May 2019. The minimum leakage inductance is achieved from a mathematical model. The leakage magnetic field energy is computed to screen out all possible winding configurations. Compared with simply interleaving primary and secondary windings in two winding transformers, this method realizes the traversal of all the possible configurations while maintaining the low winding losses. However, in this design, the leakage inductance is not large enough to account for the required shim inductance in phase-shifted based converter (i.e., dual-active-bridge converter) and resonant converter (i.e., CLLC converter). Moreover, since the system is operated at low power, the analysis on parasitic capacitances with the interleaved winding structure is out of the scope. In Z. Ouyang, Z. Zhang, M. A. E. Andersen, and O. C. Thomsen, "Four Quadrants Integrated Transformers for Dual-Input Isolated DC-DC Converters," IEEE Transactions on Power Electronics, vol. 27, no. 6, pp. 2697-2702, June 2012, and FIG. 3, an integrated multiple-winding transformer based on 3-D space orthogonal flux is disclosed. Two square-shaped cores form the integrated transformer. With the decoupled primary windings, this configuration optimizes the utilization of input sources. However, four quadrants structure limit the maximum current rating of the system and the thermal dissipation capability. Moreover, this winding structure may cause a higher and uncontrollable leakage inductance than that of a traditional transformer.

SUMMARY

The embodiments presented herein relate to a set of universal design structures and design ideas applicable and extendable to any kind of multi-port magnetically integrated power electronic system, with or without integrated leakage inductances. In one example, non-limiting embodiment, a three-winding transformer design integrating an OBC and an APM in the case of an EV is disclosed. In particular, a new three-winding planar transformer design is disclosed, which can be used within any three-port isolated converter. It enables two output voltage levels with high step-down ratios. In addition, a global transformer optimization approach that considers magnetizing and leakage inductances, core and winding losses, and parasitic capacitances, is disclosed. Thus, a truly extendable generalized N-port multi-winding integrated leakage transformer is disclosed herein.

This summary section does not specify every embodiment and/or novel aspect of the present application. Instead, this summary only provides a preliminary discussion of different embodiments. Additional details and/or possible perspectives of the disclosed embodiments are described in the Detailed Description section and corresponding Figures of the present disclosure as further discussed below.

BRIEF DESCRIPTION OF THE DRAWINGS

The application will be better understood in light of the description, which is given in a non-limiting manner, accompanied by the attached drawings in which:

FIG. 22(b) shows a visual illustration of an another exemplary MWIT structure using the disclosed design method.

FIG. 29(a) shows a main and leakage flux path of an 8M-16L structure.

FIG. 29(b) shows an exploded view of an 8M-16L structure.

FIG. 29(c) shows 3D model of the fully assembled 8M-16L MWIT.

DETAILED DESCRIPTION

Figure 1:
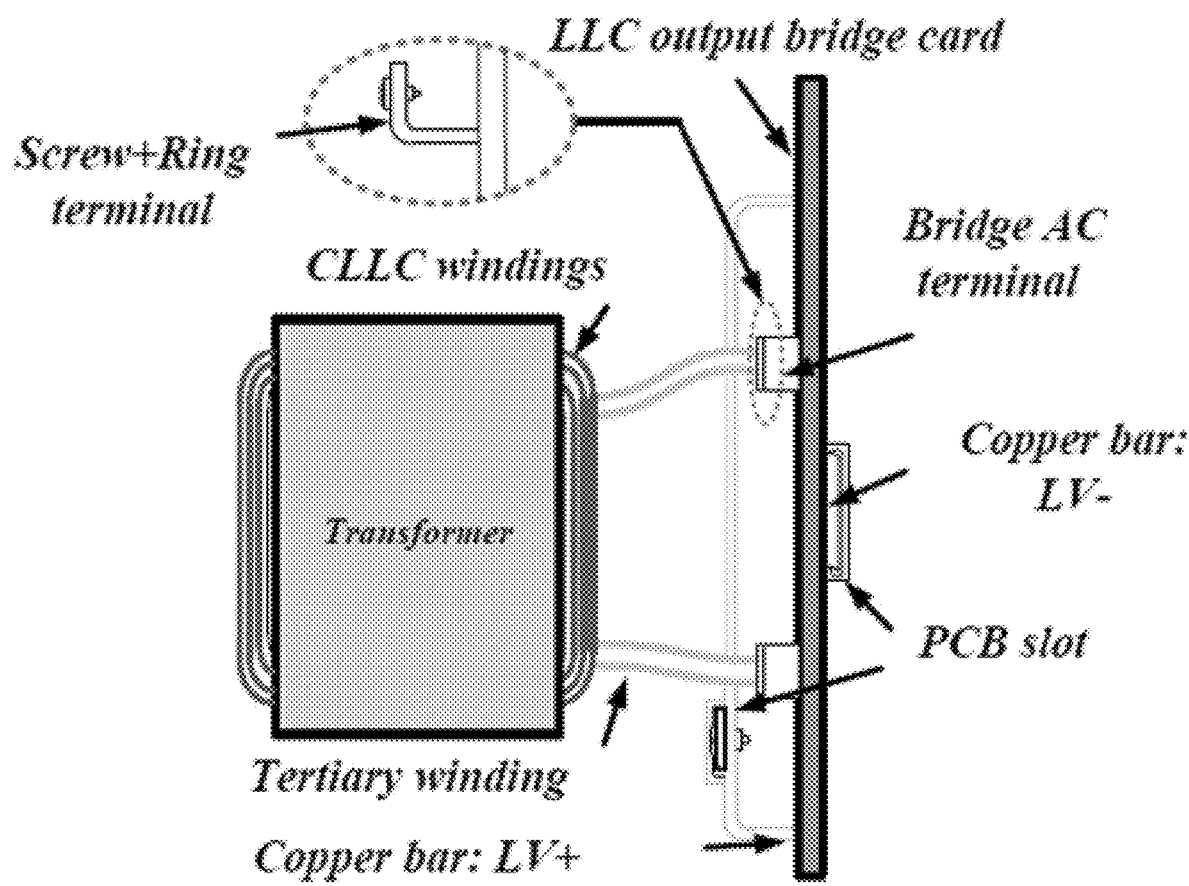
FIG. 1 shows a top overview of a conventional three-winding transformer with copper bar configuration.
Figure 2:
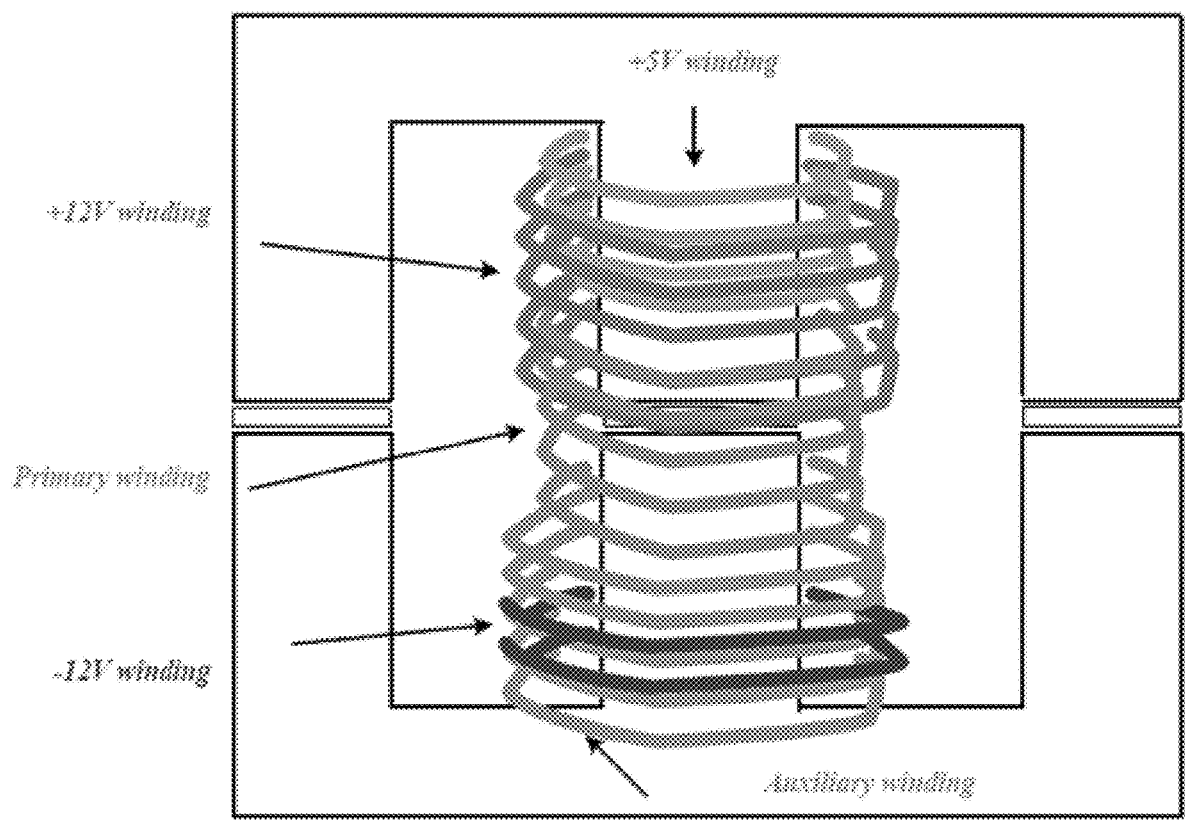
FIG. 2 shows a diagram of a conventional multi-winding transformer with split winding structure.
Figure 3:
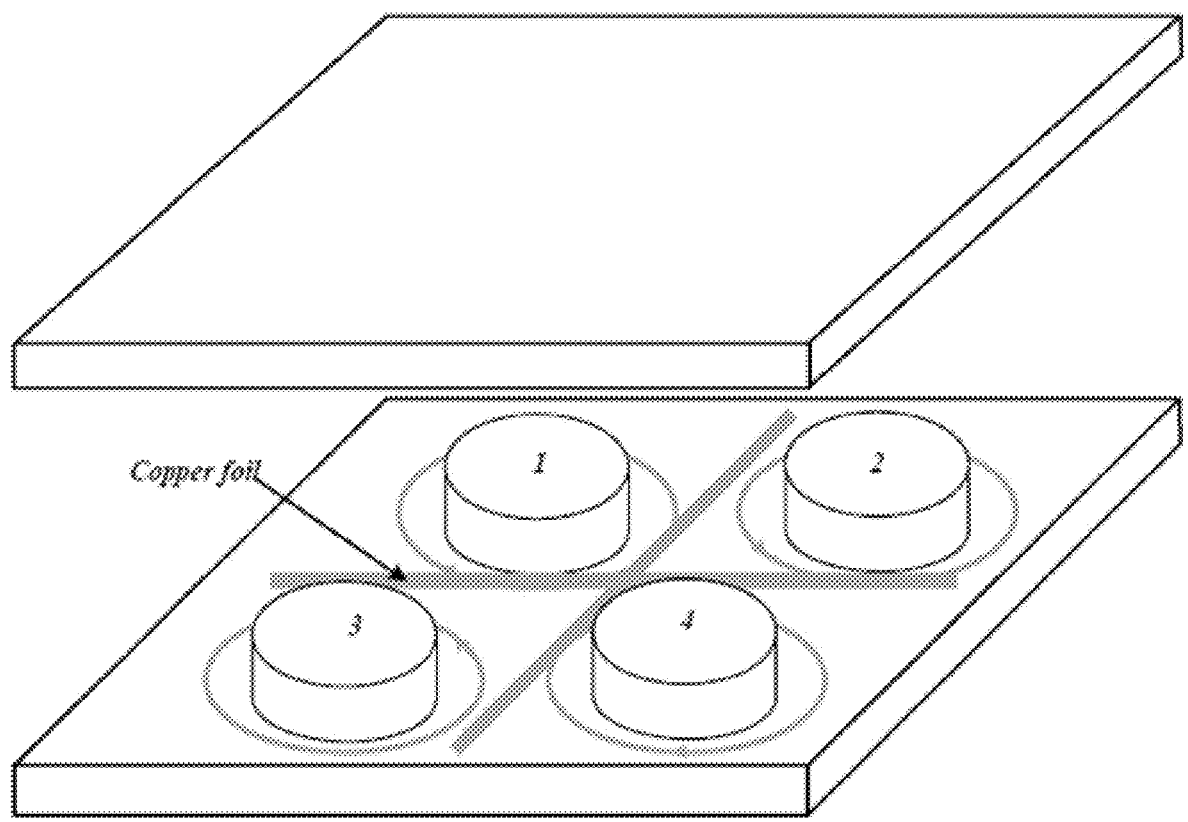
FIG. 3 shows a conventional integrated transformer with four quadrant structure.

This invention was made with government support under IIP1602012 awarded by the National Science Foundation. The government has certain rights in the invention.

Many example embodiments are described herein that realize electromagnetic integration by means of different core and winding configurations, which is highly desirable in several applications, including but not limited to simultaneous charging of EVs and multi-port energy router systems. They can be implemented in both single-phase and three-phase systems. The core geometry selections are determined based on the various application requirements, i.e. power rating, weight, volume, and cost. For instance, EE-shape may be a good candidate for certain applications as it provides enough space for the three-winding structure. Besides, UU-shape, EI-shape or PQ-shape can also be utilized with the customized dimensions. There are variations in the winding configurations, including conductor type, arrangement, thickness, and width for both Litz wire and PCB windings, which result in all the possible winding structures.

Besides, the leakage inductance of the transformer can be controlled by the adjustment of the core geometry, winding configuration and air gap, which provides great flexibility in the shim inductor placement: it can either be an external inductor or integrated as the leakage inductance of the transformer. The air gap is implemented in all the transformer variations to reduce the core loss and avoid the magnetic saturation. In summary, the transformer variations, including both core shapes and winding configurations, are given in Table 1.

TABLE 1

Summary of the transformer variations

| Type | Remarks | Core shape | Winding Configuration |
|---|---|---|---|
| 1 | Single-phase two-leg core | UU; UI | Litz non-interleaved side-leg winding; Litz interleaved side-leg winding; PCB non-interleaved side-leg winding; PCB interleaved side-leg winding; Litz interleaved side-leg concentric windings |

TABLE 1-continued

Summary of the transformer variations

| Type | Remarks | Core shape | Winding Configuration |
|------|---------|-----------|----------------------|
| 2 | Single-phase three-leg core | EE; EI; PQ; ER; UR | Litz non-interleaved side-leg winding; Litz interleaved side-leg winding; PCB non-interleaved side-leg winding; PCB interleaved side-leg winding; PCB non-interleaved center-leg winding; PCB interleaved center-leg winding; Litz interleaved side-leg concentric windings |
| 3 | Three-phase core | UU; UI; EE; EI; PQ; ER; UR | Litz non-interleaved side-leg winding; Litz interleaved side-leg winding; PCB non-interleaved side-leg winding; PCB interleaved side-leg winding; Litz non-interleaved center-leg winding; Litz interleaved center-leg winding; PCB non-interleaved center-leg winding; PCB interleaved center-leg winding; Litz interleaved side-leg concentric windings |

1. Transformer Core/Winding Variations

The variations of the winding configuration are essentially related to the trade-off among the magnetizing inductance $L_m$, leakage inductance $L_k$ and winding AC resistance $R_{AC}$. All the factors contribute to the winding conductor type, arrangement, thickness, and width. For instance, if the transformer windings are placed in a sandwich-type configuration, the coupling factor between primary and secondary windings is close to 1, which means they are well interleaved and the $R_{AC}$ is minimized. However, $L_k$ is infinitesimally small under this condition, making it impossible to be utilized as a separate inductor. On the other hand, the winding location can be changed to adjust $L_k$ and $R_{AC}$. However, $L_m$ would be affected if the windings are no longer placed around the center leg. Thus, different kinds of the winding configurations are formed considering all the mentioned factors. Therefore, a global optimization algorithm for all the transformer parameters may compute the core dimension accurately with the wide operation frequency range from kHz to MHz levels. Both core and winding losses are substantially reduced in the present disclosure. In general, there are three types of core structure as follows.

Type-1: Single-Phase Two-Leg Category

Single-phase two-leg transformers are formed by the UU-shape and UI-shape cores. Some typical transformer designs in Type-1 are demonstrated in FIG. 4(a)-4(f) and FIG. 6(a)-6(c). The width a and height h of side legs can be adjusted to reduce the core loss while maintaining enough magnetizing inductance. The increase of the thickness d reduces the effective reluctance and core loss, however, it leads to a smaller window area.

Figure 4A:
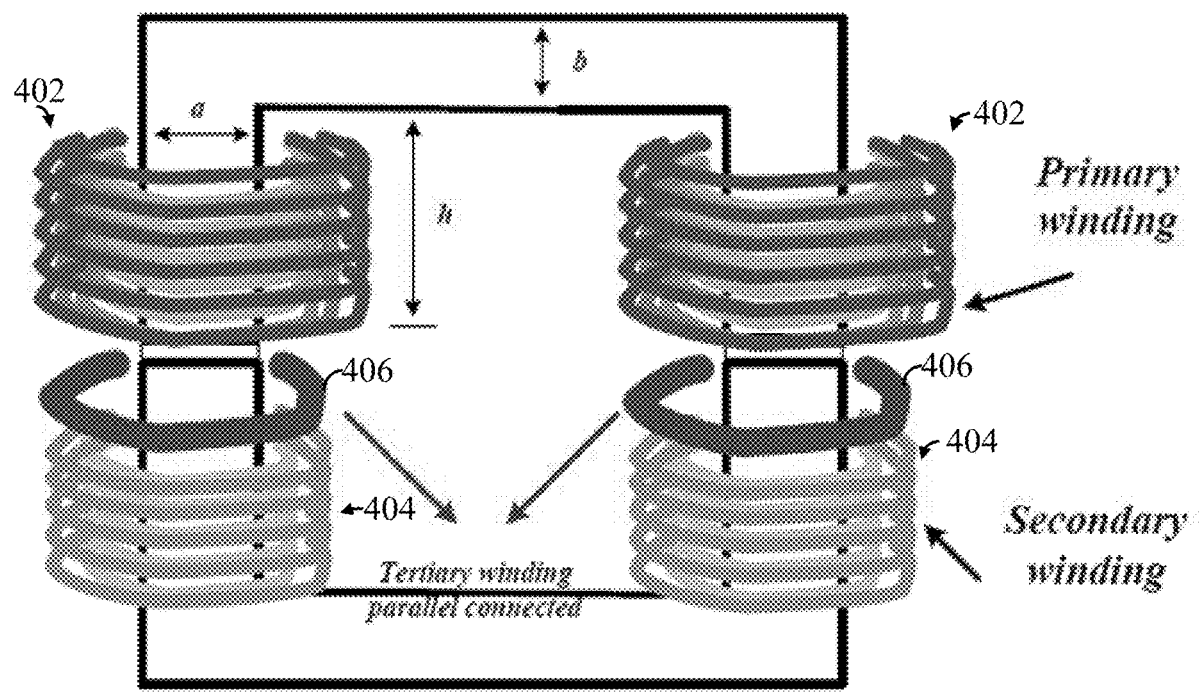
FIG. 4(a) shows a Type-1 three-winding Litz wire-based integrated transformer with two-leg core geometry: UU-shape core with the Litz non-interleaved side-leg windings (primary winding in the top).
Figure 4B:
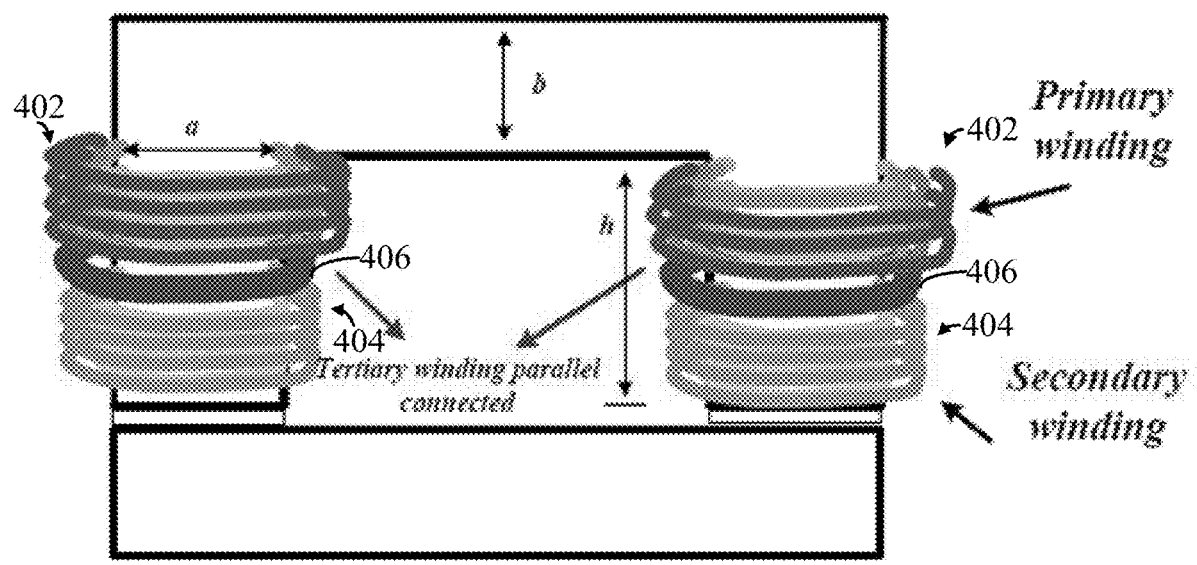
FIG. 4(b) shows a Type-1 three-winding Litz wire-based integrated transformer with two-leg core geometry: UI-shape core with the Litz non-interleaved side-leg windings (primary winding in the top).
Figure 4C:
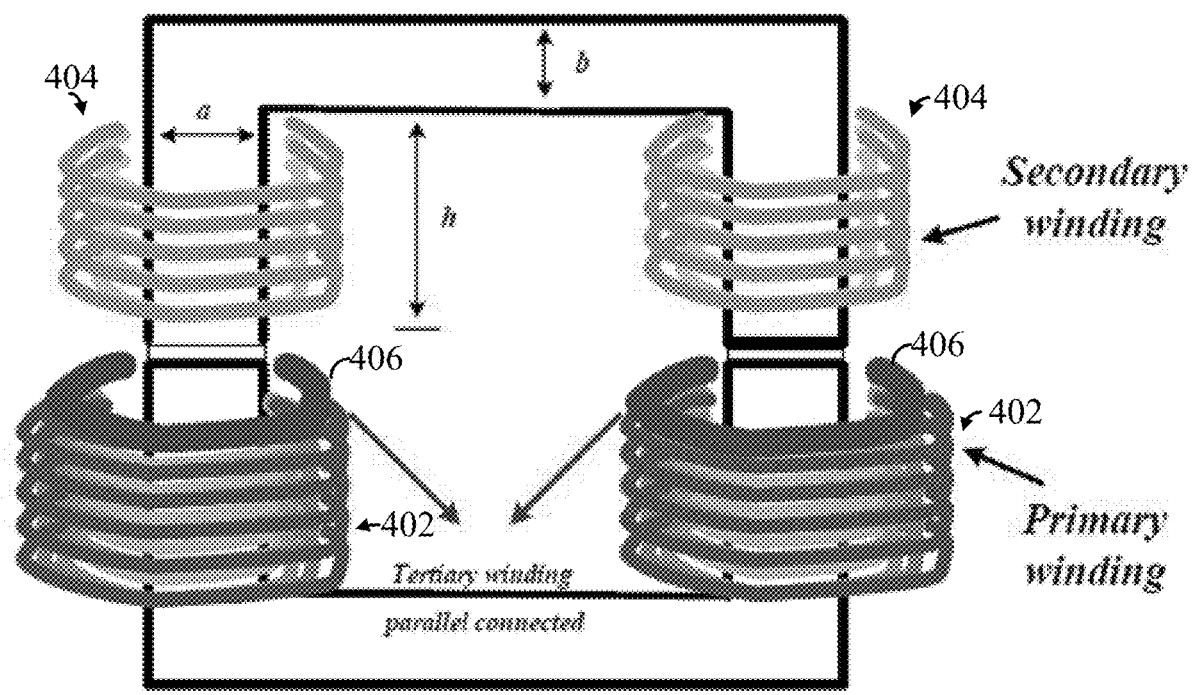
FIG. 4(c) shows a Type-1 three-winding Litz wire-based integrated transformer with two-leg core geometry: UU-shape core with the Litz non-interleaved side-leg windings (secondary winding in the top).
Figure 4D:
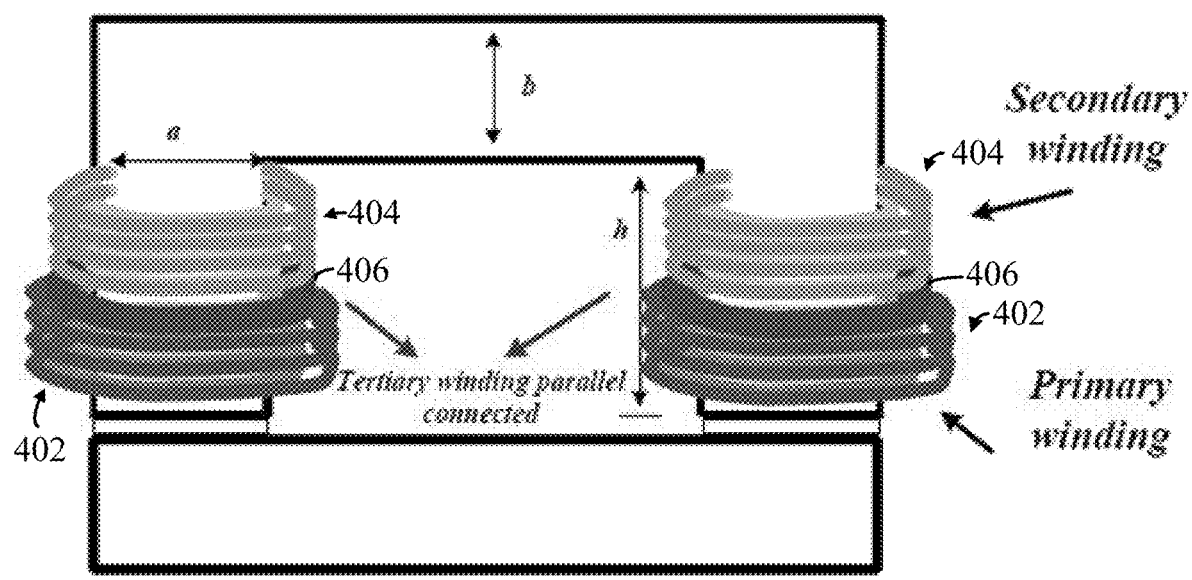
FIG. 4(d) shows a Type-1 three-winding Litz wire-based integrated transformer with two-leg core geometry: UI-shape core with the Litz non-interleaved side-leg windings (secondary winding in the top).
Figure 4E:
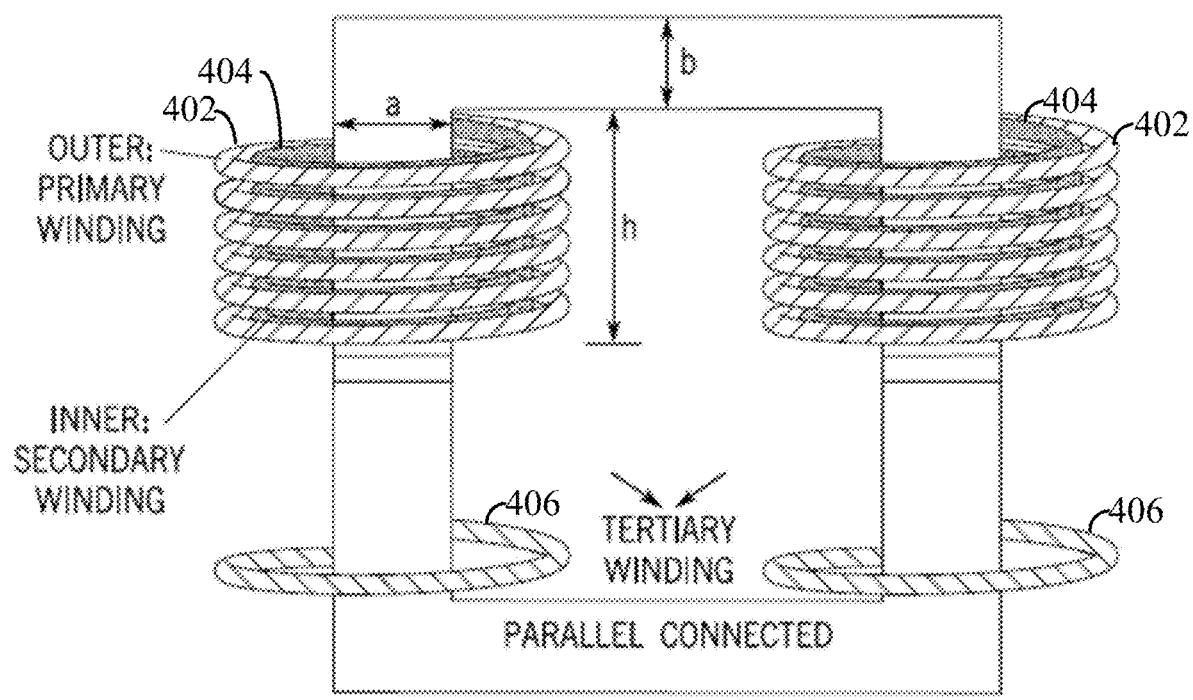
FIG. 4(e) shows a Type-1 three-winding Litz wire-based integrated transformer with two-leg core geometry: UU-shape core with the Litz interleaved side-leg concentric windings.
Figure 4F:
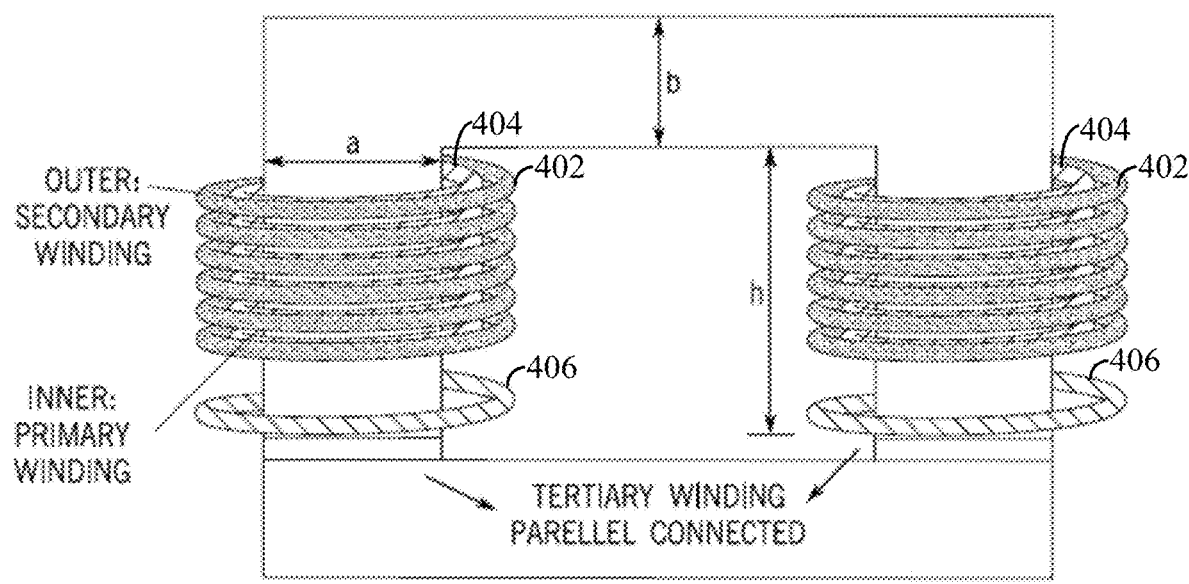
FIG. 4(f) shows a Type-1 three-winding Litz wire-based integrated transformer with two-leg core geometry: UI-shape core with the Litz interleaved side-leg concentric windings.

The winding arrangement variations are the interleaved and non-interleaved windings. For the non-interleaved winding configurations, the placement of each winding is realized through customized bobbins. The vertical distance of the primary winding 402, secondary winding 404, and tertiary winding 406 gives the freedom of the leakage inductance adjustment. Moreover, all the windings are placed away from the air gap to reduce the fringing effect. It is noted that both Litz wire and planar PCB winding trace can be implemented as the winding conductor type. In the range of ~100 kHz, the skin effect is negligible if Litz wire is suitably selected. However, the proximity effect takes a significant portion of the winding loss. Thus, the selection of Litz conductor gauge and the wire structure is based on a wide range of factors, including the operation frequency, the effective winding window of the core, winding arrangement and the current rating. The winding placement order of the non-interleaved windings can be varied, as shown in FIG. 4(a)-4(d). On the other hand, the interleaved winding structure can be achieved by the Litz wire. Each limb is wound with a group of windings, consisting of both primary and secondary turns which can be concentric cylinders, as shown in FIGS. 4(e) and 4(f). The outer windings can be primary or secondary turns, and the tertiary winding 406 is placed separately in the bottom considering the high current rating. In the case of the tertiary winding where the high step-down turns ratio is not needed, it can be configured with the same winding arrangement in the primary/secondary windings. Moreover, the primary winding in the left leg has the polarity arranged so that a current in the side of the primary winding that produces an upwards flux in the left leg. Thus, the primary winding 402 in the right leg produces a downward flux in the right leg. Similarly, the secondary winding 404 has the polarity arranged so that a current in the side of the secondary winding 404 on the left leg that produces a downwards flux in the left leg. Thus, the secondary winding 404 in the right leg produces an upwards flux in the right leg. For the high step-down winding, i.e. the tertiary winding 406, it has the polarity in the left leg arranged so that a current in the side of the tertiary winding that produces a downwards flux in the left leg. And the tertiary winding 406 in the right leg produces an upwards flux in the right leg. The windings may include different numbers of turns or may be formed in different directions. These and other variations may be desirable for various types of applications.

Figure 5:
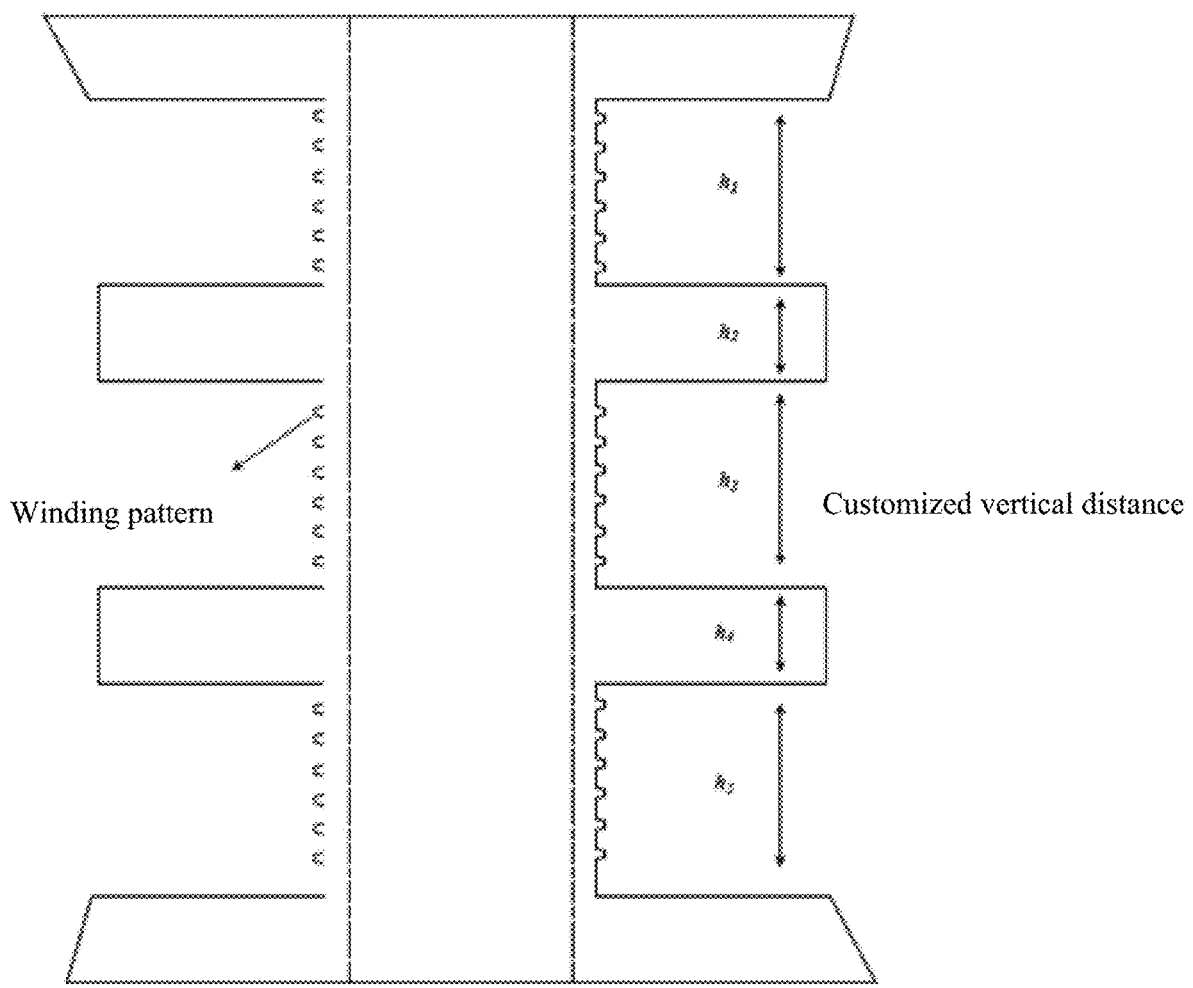
FIG. 5 shows a cross section view of the customized transformer bobbin for the Litz non-interleaved winding.

The customized transformer bobbin for the Litz non-interleaved winding is illustrated in FIG. 5, which can be utilized for both side-leg and center-leg concentric winding structures. Each slot is made for one side winding. The vertical distance ($h_{1-5}$) and the winding patterns can be adjusted according to the winding configuration, and the whole bobbin can be 3-D printed. Furthermore, the selection of the bobbin materials including thermoplastic and thermoset depends on the application specifications.

On the other hand, the PCB winding configuration is designed with the full examination of the parasitic capacitance and AC loss. The thickness of the copper depends on the current rating and the skin effect consideration. To reduce the winding loss (mainly from proximity effect), the winding turns in each PCB layer should be minimal. Moreover, the dielectric layer and the overlapping copper area are designed to minimize the parasitic capacitance. The planar transformer with the disclosed PCB winding configuration is combined to improve the manufacturability, power density, and efficiency.

Figure 6A:
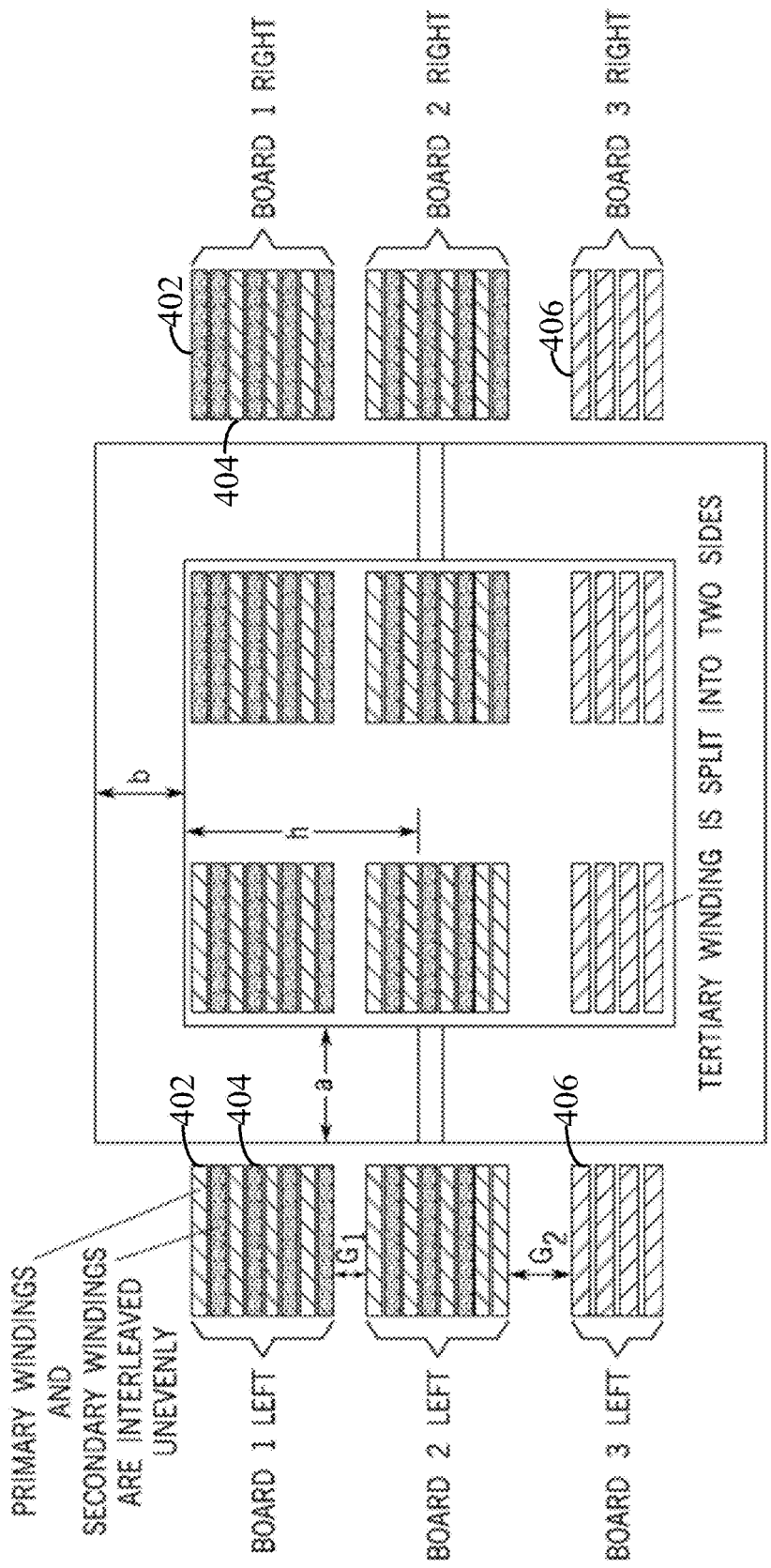
FIG. 6(a) shows a Type-1 PCB-winding integrated transformer with two-leg core geometry: UU-shape core with the PCB interleaved side-leg windings.
Figure 6B:
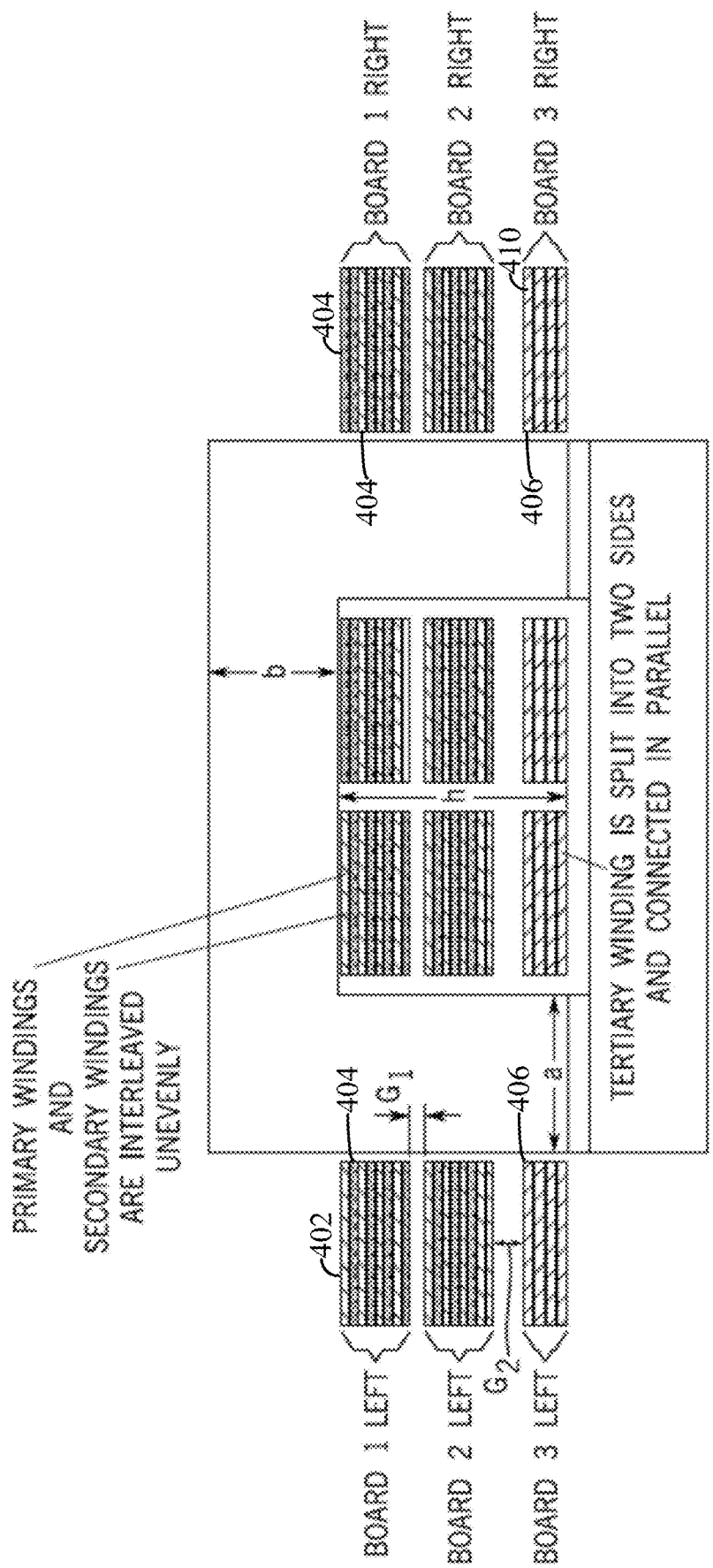
FIG. 6(b) shows a Type-1 PCB-winding integrated transformer with two-leg core geometry: UI-shape core with the PCB interleaved side-leg windings.
Figure 6C:
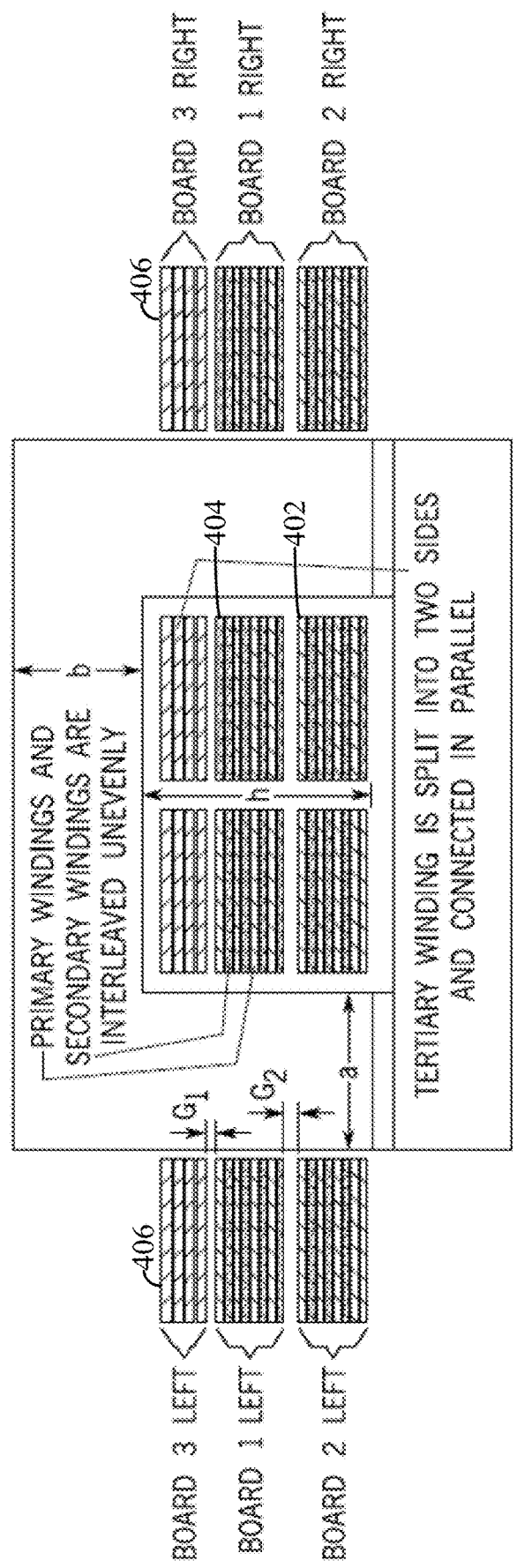
FIG. 6(c) shows a Type-1 PCB-winding integrated transformer with two-leg core geometry: UI-shape core with the PCB interleaved side-leg windings (tertiary winding in the top).

As can be seen in FIG. 6(a)-6(c), the primary 402 and secondary 404 windings of the transformer are split unevenly in both side legs; the tertiary windings 406 are connected in parallel from the two legs to maintain the flux balance, which can be either placed in the top or bottom. It is noted that the primary winding 402 and secondary winding 404 are asymmetrically interleaved in two legs. The reasons are: (1) to compensate the magnetizing inductance reduction due to the interleaved structure; and (2) to obtain a controllable leakage inductance (can either be 0 or a certain desired value).

Figure 7A:
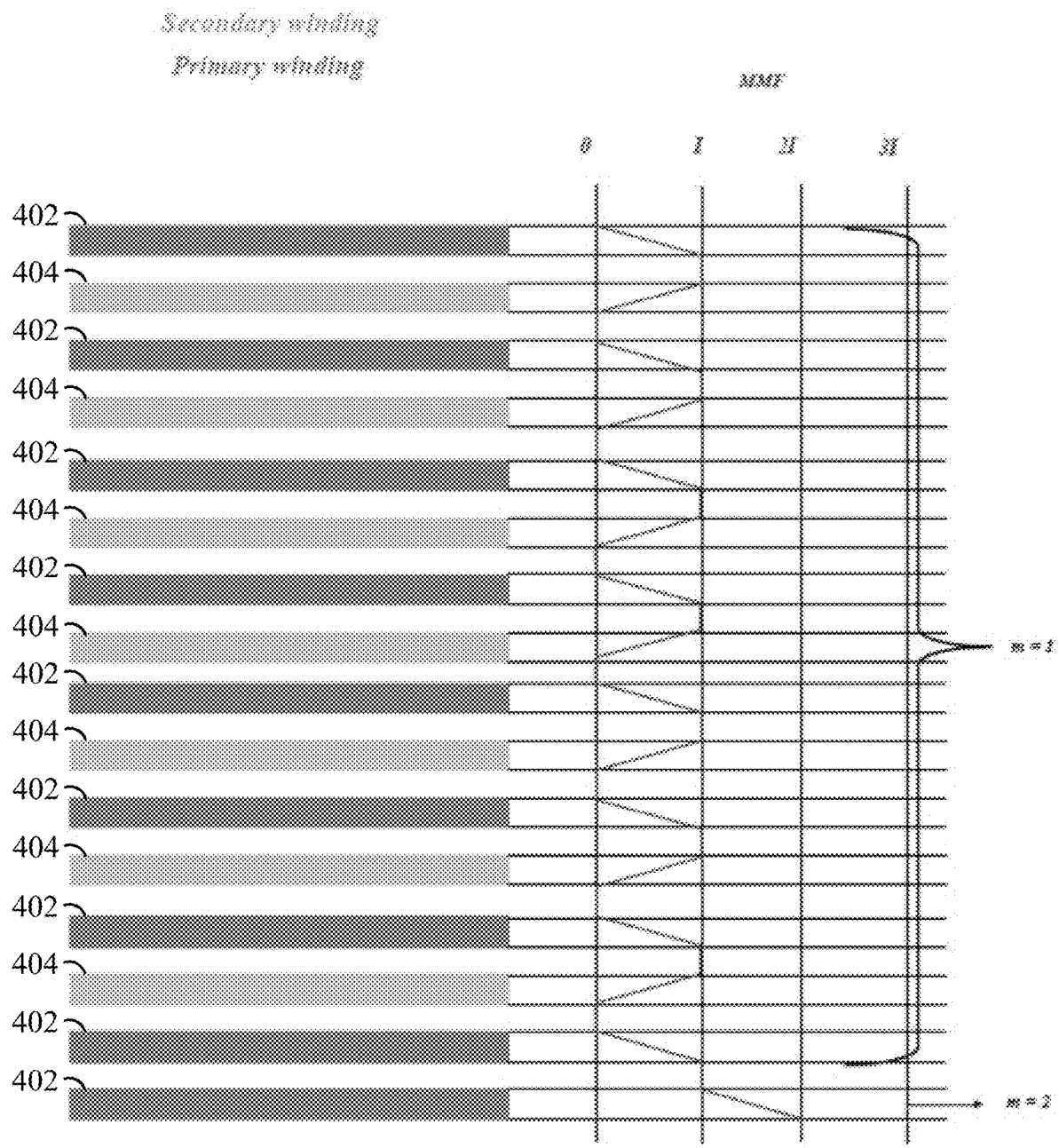
FIG. 7(a) shows an example winding configuration: a one side leg winding configuration with corresponding MMF distribution.

The winding loss is mainly determined by the monotonic magnetomotive force (MMF) distribution, which means that the winding layer structure needs to be carefully considered. The MMFs are suppressed using the interleaved winding structure, where the primary winding 402 and secondary winding 404 are asymmetrically placed in both side legs. The top two boards 1 and 2 are composed of the primary winding 402 and secondary winding 404 while all the tertiary winding 406 is located in the bottom board 3, where the distances between the boards are denoted as $G_1$ and $G_2$, as shown in FIG. 6(a)-6(c). The layer change for the same winding is realized by the vias. Both left and right printed circuit board (PCB) layers with the same vertical height share the same PCB board. The disclosed winding structure along with the MMF distribution is shown in FIG. 7(a). The connections between boards are realized in the main board.

Figure 7B:
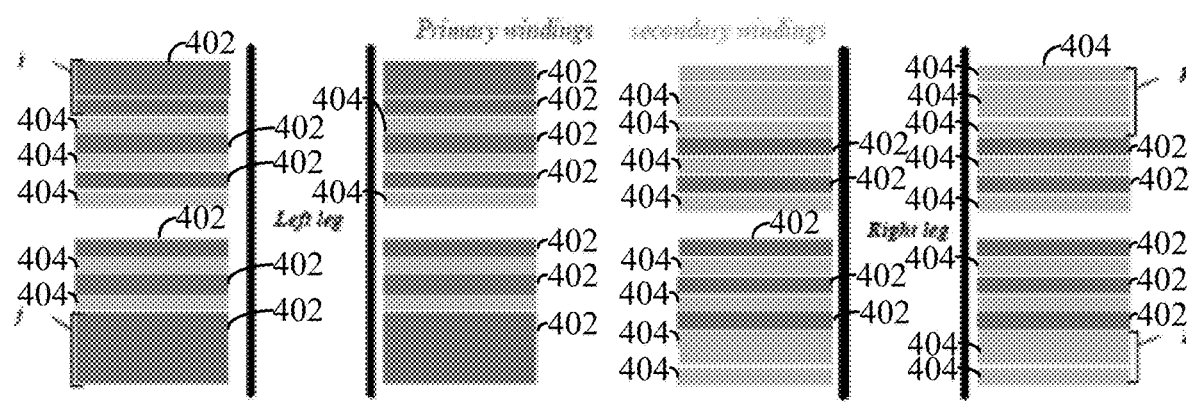
FIG. 7(b) shows an example winding configuration: generalized non-interleaved winding configuration.

Consequently, only the bottom two layers have the non-interleaved windings in the left leg, and the top two layers in the right leg have non-interleaved windings. This kind of winding configuration takes the advantage of interleaving to reduce the winding loss while maintaining the magnetizing and leakage inductances. In general, N (e.g. i, j, k, and l in FIG. 7(b)) bottom/top layers can be implemented as the non-interleaved windings to achieve the desired inductances. The increase of N leads to larger magnetizing and leakage inductances, and winding loss. As shown in FIG. 7(b), i, j, k and l are denoted as the number of non-interleaved windings in the left top, left bottom, right top, and right bottom, respectively. They can be the same or different values, depending on the design specifications.

Figure 8:
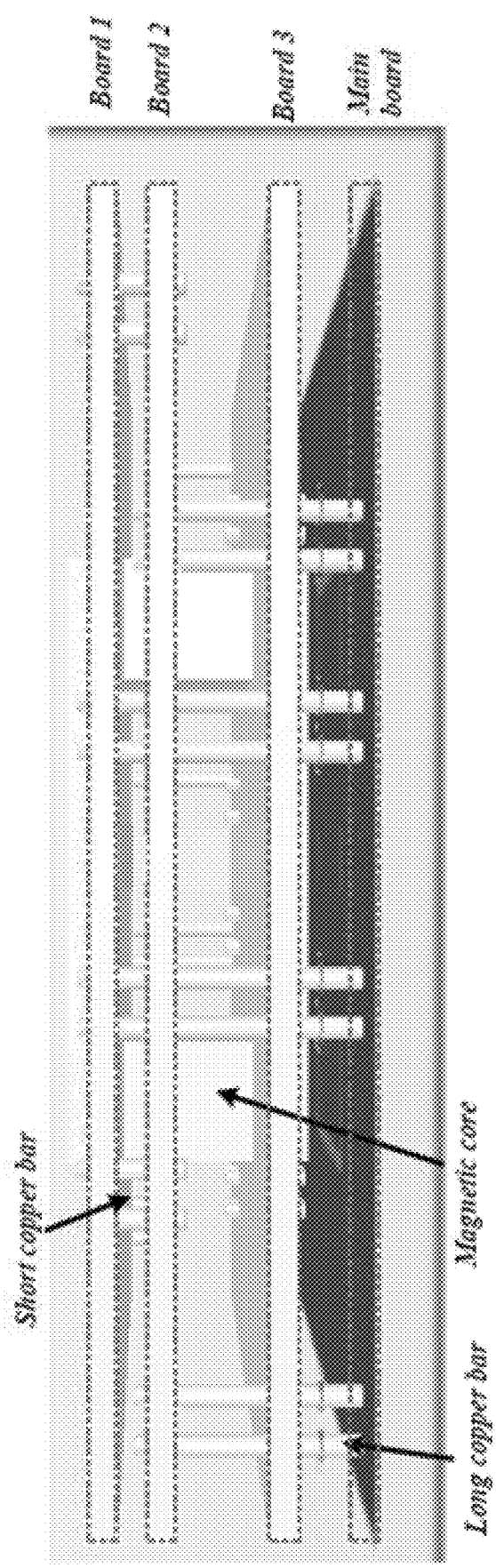
FIG. 8 shows a 3D model of the disclosed UU-shape transformer winding structure.

Meanwhile, the winding loss can be further reduced by settling the layer thickness less than the skin depth, which allows the effective cross-section area to be increased. Considering the high current rating, the tertiary windings can be split into two parts and wound around the side legs to maintain the flux balance. The mechanical structure of the PCB windings is different from the Litz wire arrangement, where spacers are needed to maintain the vertical board distances as $G_1$ and $G_2$, and keep the boards firm. As shown in FIG. 8, primary and secondary windings in the top two boards can be connected in series with short copper bars with a length of $G_1$. Tertiary windings in the bottom board can be connected in parallel or series, depending on the turns ratio requirement. Moreover, long copper bars are used as the connectors between winding PCBs and the main power board to make the entire transformer as a through-hole type component to enhance the manufacturability. Furthermore, these copper bars can be designed using different mechanical structures including press-fit pins to increase the reliability and manufacturability.

In addition, the parasitic capacitances are suppressed in the PCB design method. The overlap area between the adjacent layers is optimized to reduce the parasitic capacitances while maintaining the low winding loss. Moreover, the thickness of the dielectric material can be increased to further reduce the intra-winding/inter-winding capacitances. Teflon or Polyimide can be the insulation material due to its higher permittivity compared to FR4.

Type-2: Single-Phase Three-Leg Category

Figure 9A:
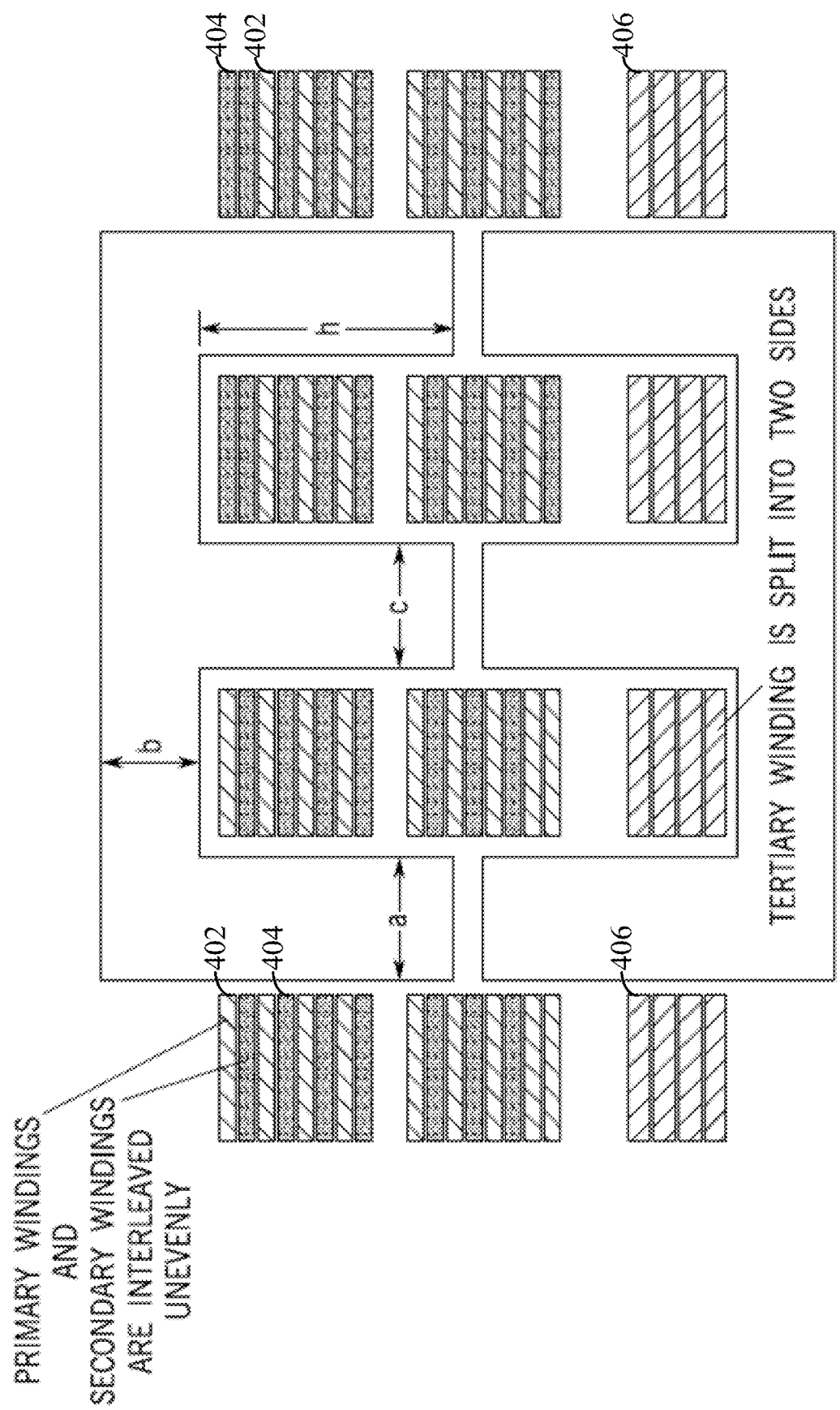
FIG. 9(a) shows a schematic diagram of a single-phase integrated transformer using EE-shape core with the split PCB interleaved side-leg windings: tertiary winding in the bottom.
Figure 9B:
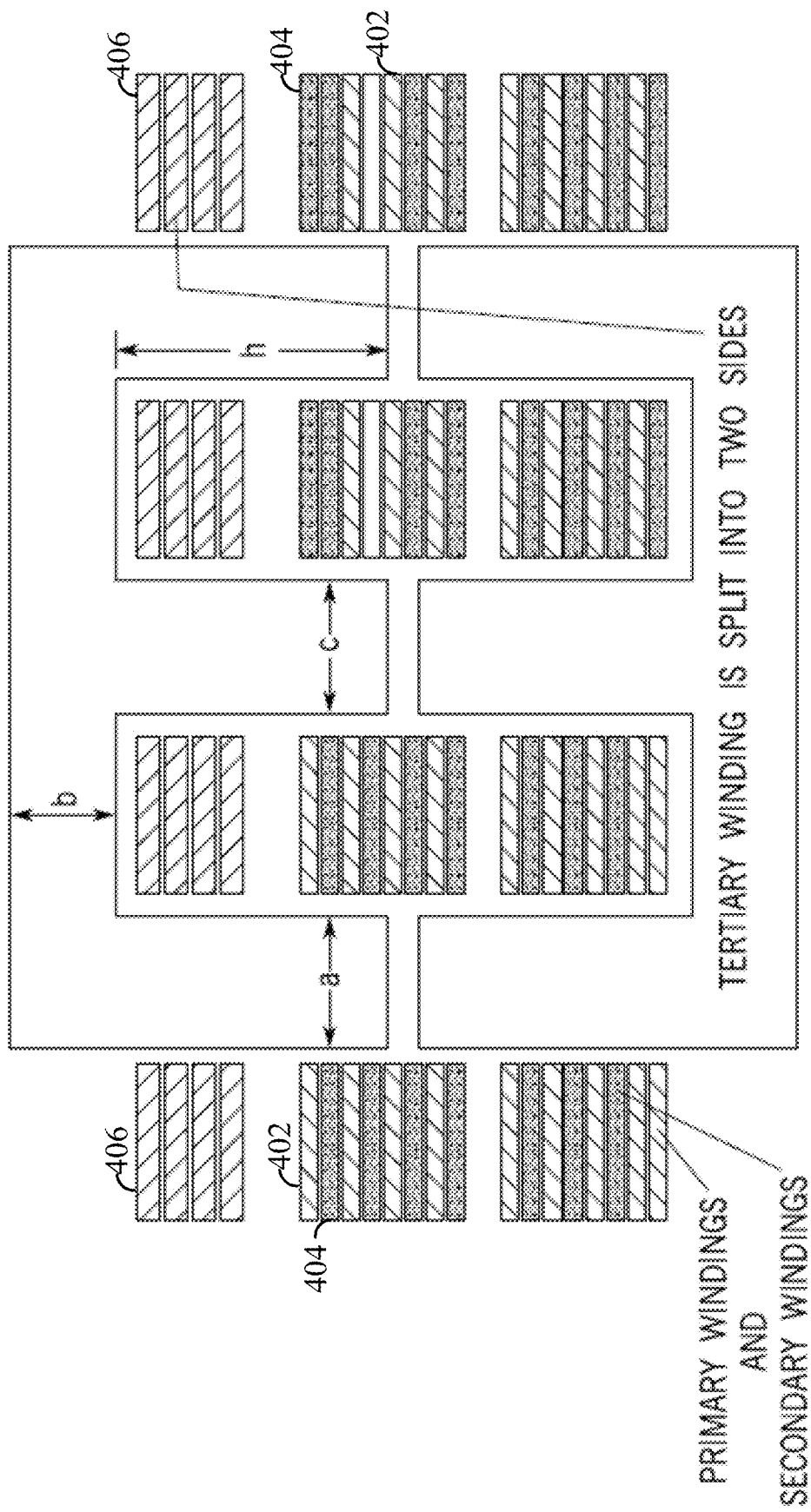
FIG. 9(b) shows a schematic diagram of a single-phase integrated transformer using EE-shape core with the split PCB interleaved side-leg windings: tertiary winding in the top.

In this type, three-leg cores are utilized to achieve the integrated transformer, i.e., EE-shape core, PQ-shape core, and EI-shape core, where all the windings are placed in the side legs. Compared to Type-1, three-leg cores provide more control on the leakage inductance by the adjustment of the center leg width c, as shown in FIG. 9(a)-9(b). The width a and height h of side legs can be adjusted to reduce the core loss while maintaining enough magnetizing inductance. The increase of the thickness d reduces the effective reluctance and core loss, however, it leads to a smaller window area. The width ratio $$k = \frac{c}{a}$$

between the center and side legs contributes to the core loss and the leakage inductance. It is noted that the center leg enables the leakage flux path, which is determined by the reluctance of the center leg air gap. If the center leg air-gap reluctance is large, less leakage flux will flow through it, resulting in smaller leakage inductance. Consequently, the leakage flux in the disclosed magnetic structure is confined within the core instead of in the air. The confined flux can contribute to the less radiated EMI and eddy current loss in the surrounding metals.

Type-3: Matrix Transformer Category

Figure 10A:
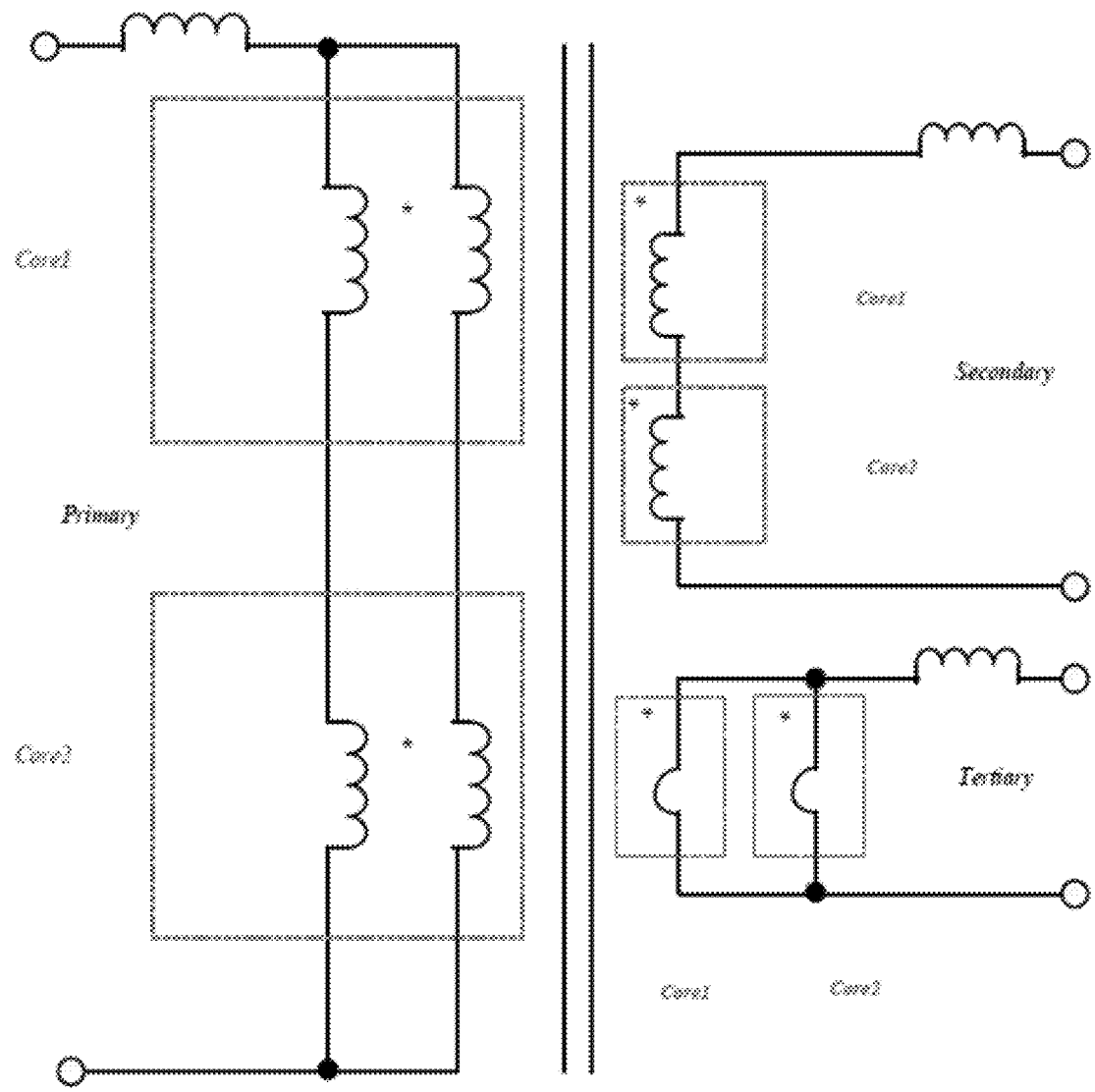
FIG. 10(a) shows a connection diagram of the matrix transformers: two-core structure.
Figure 10B:
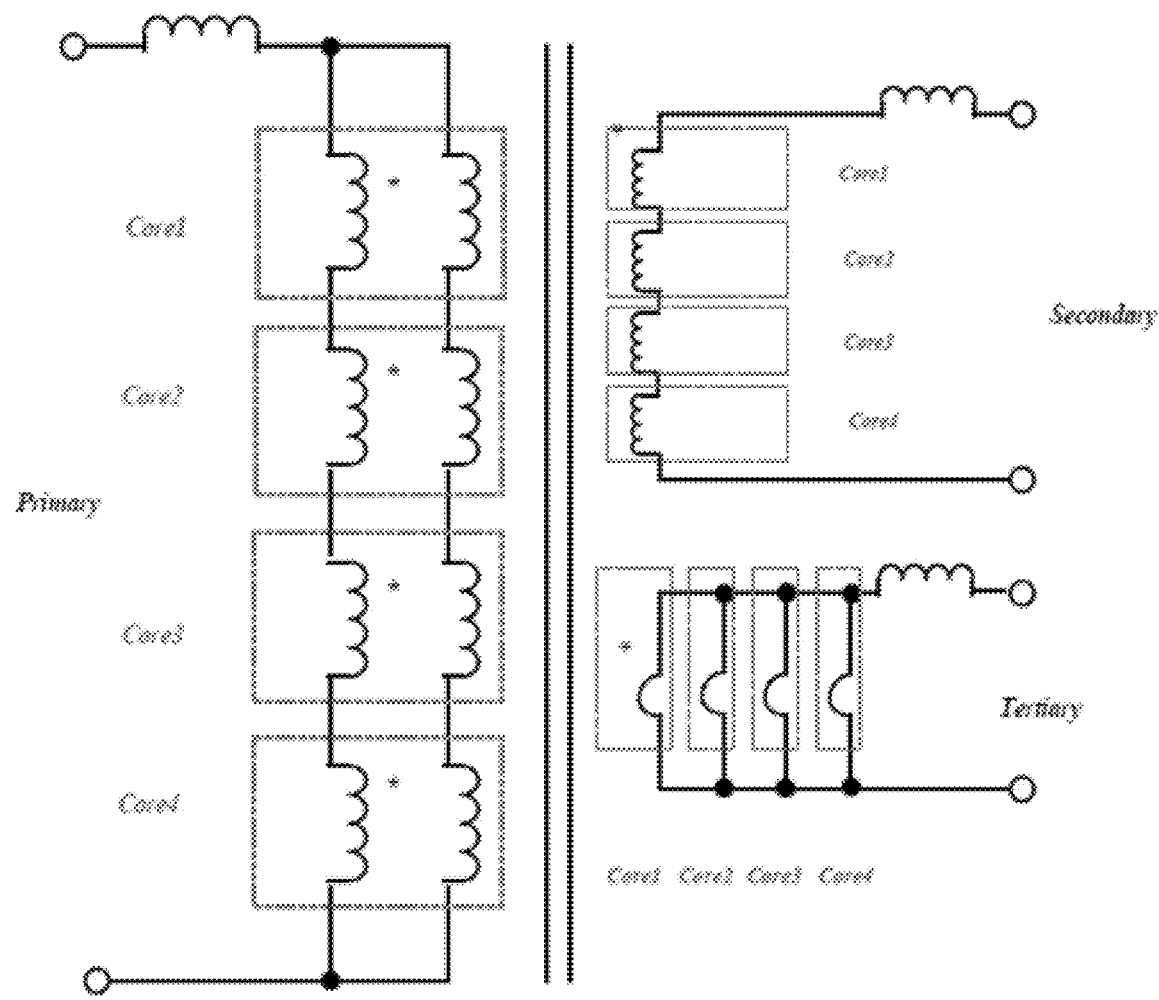
FIG. 10(b) shows a connection diagram of the matrix transformers: four-core structure.

In this category, matrix transformer structure is used to reduce the turns ratio between primary and tertiary windings due to high step-down characteristics. Moreover, matrix transformers help increase the output current capability by distributing the tertiary current with multiple cores, where flux cancelation technique is implemented to reduce the core size and loss. Thus, the primary winding 402 and secondary winding 404 in matrix transformers can be connected in series while the tertiary windings 406 can be connected in parallel to reduce the turns ratio. The winding terminal variations are shown in FIG. 10(a)-10(b).

Figure 11A:
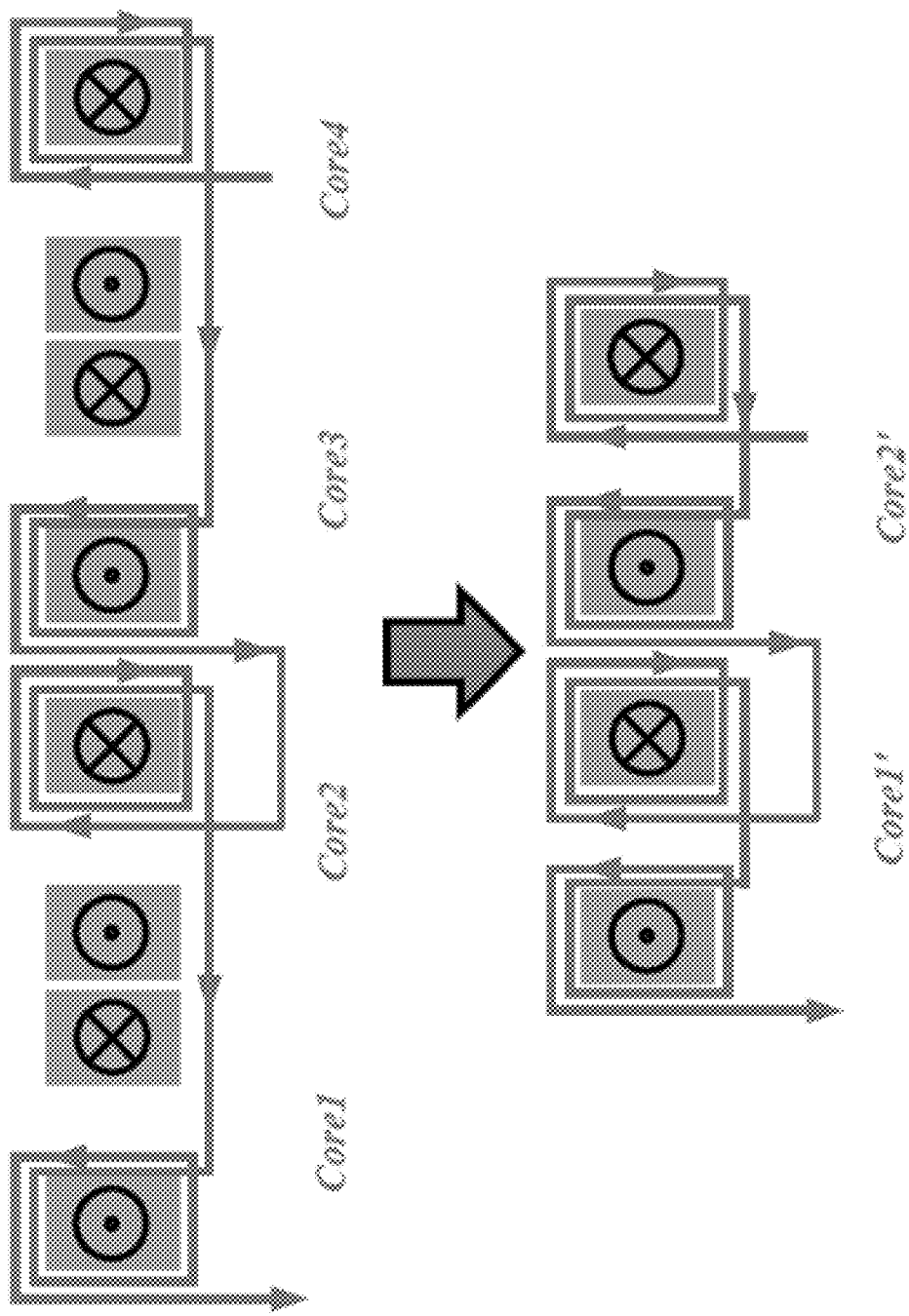
FIG. 11(a) shows flux cancellation with different winding polarities in the primary and secondary windings using UI core.
Figure 11B:
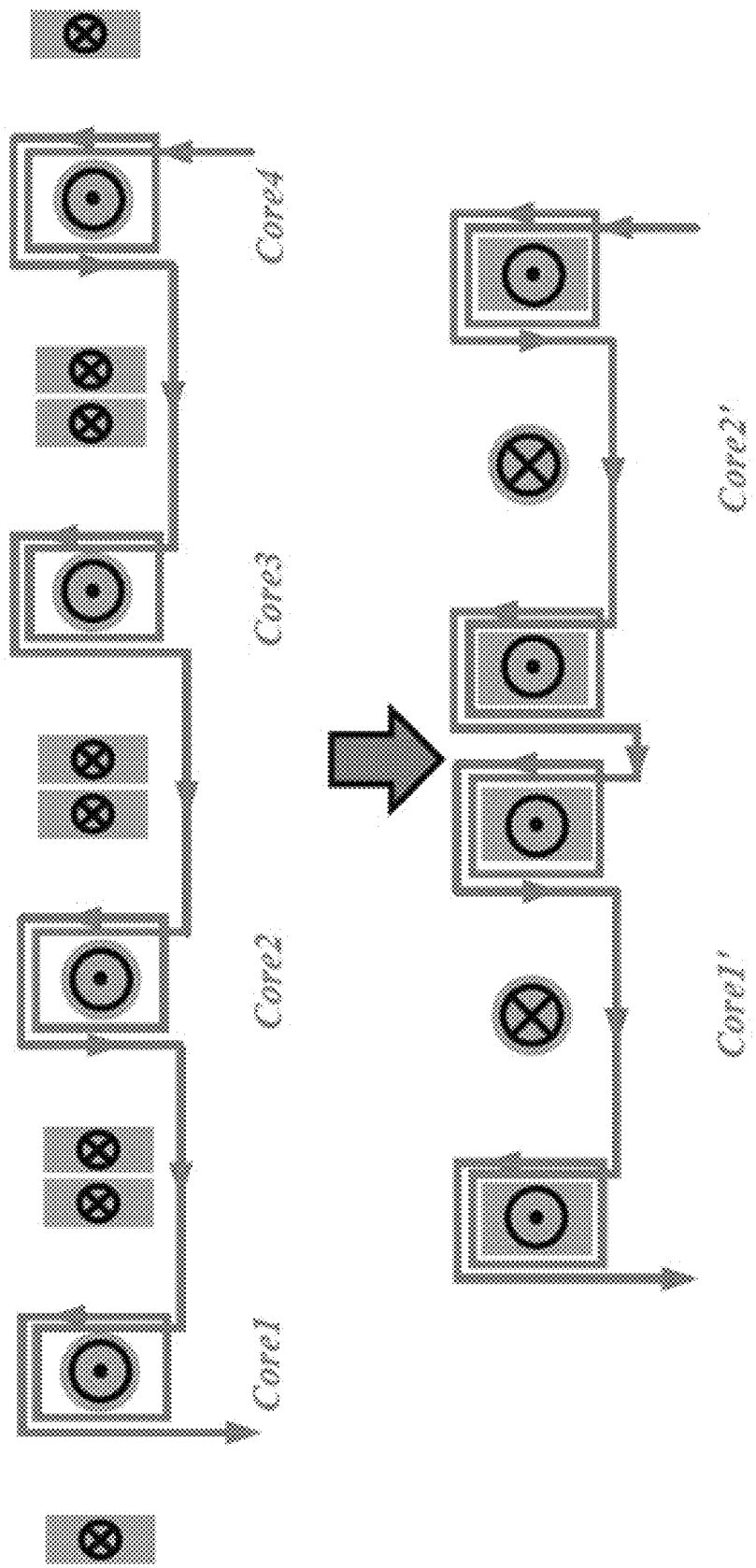
FIG. 11(b) shows flux cancellation with different winding polarities in the primary and secondary windings using ER core.

The winding arrangements are shown in FIG. 6(a)-6(c) and FIG. 9(a)-9(b). EE-shape, UU-shape, EI-shape, ER-shape, UI-shape, or PQ-shape can be utilized with the customized dimensions and flux cancellation technique. Thus, the number of cores can be reduced. FIG. 11(a)-11(b) illustrates two cases of flux cancellation with the disclosed three-winding transformer design.

Figure 12A:
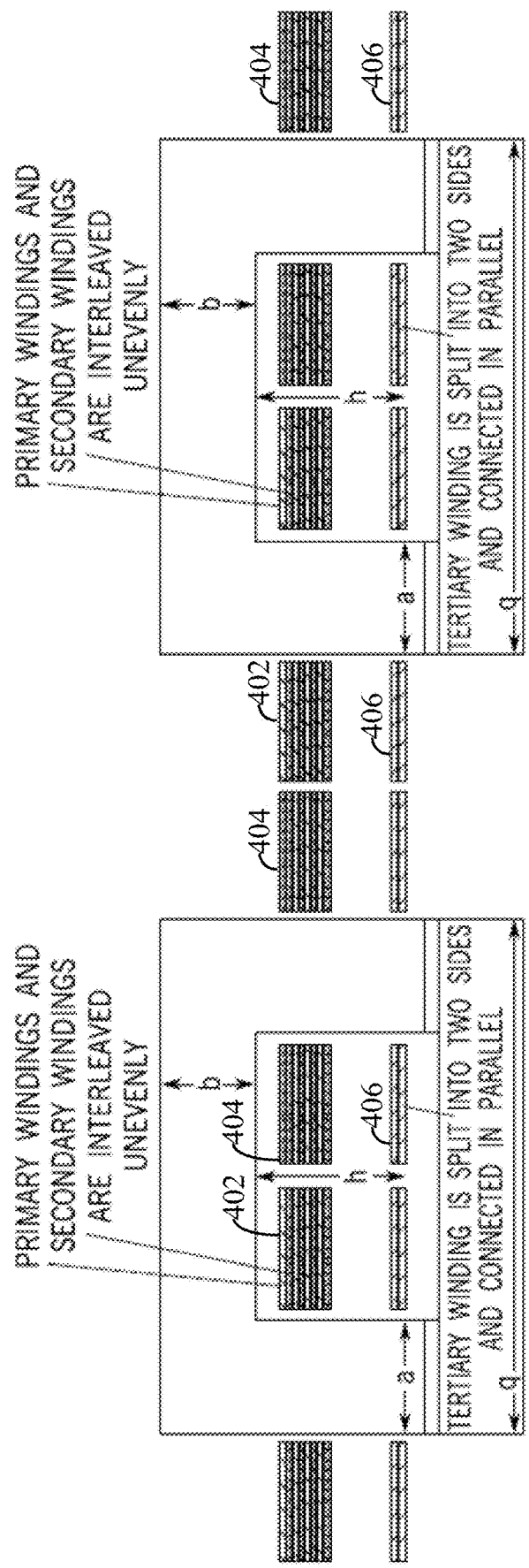
FIG. 12(a) shows matrix transformer with UI cores.
Figure 12B:
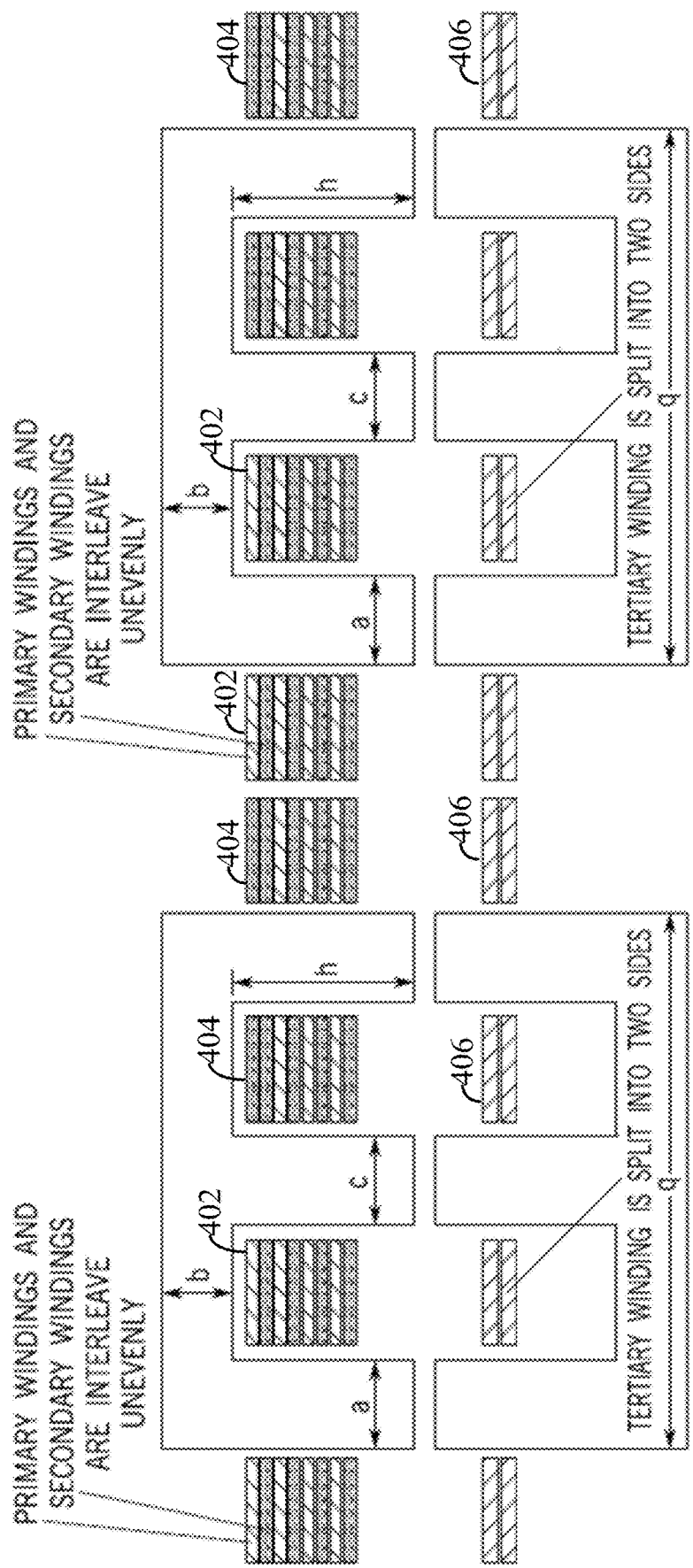
FIG. 12(b) shows matrix transformer with EE cores.

Moreover, the width a and height h of side legs can be adjusted to reduce the core loss while maintaining enough magnetizing inductance. The increase of the thickness d reduces the effective reluctance and core loss, however, it leads to a smaller window area. The increase of the breadth width q leads to more magnetizing inductance. The width ratio $$k = \frac{c}{a}$$

between the center and side legs contributes to the core loss and the leakage inductance. FIG. 12(a)-12(b) shows two cases of matrix transformers, where the turns ratio and parasitic impedance (capacitance/inductance) are reduced.

Figure 13:
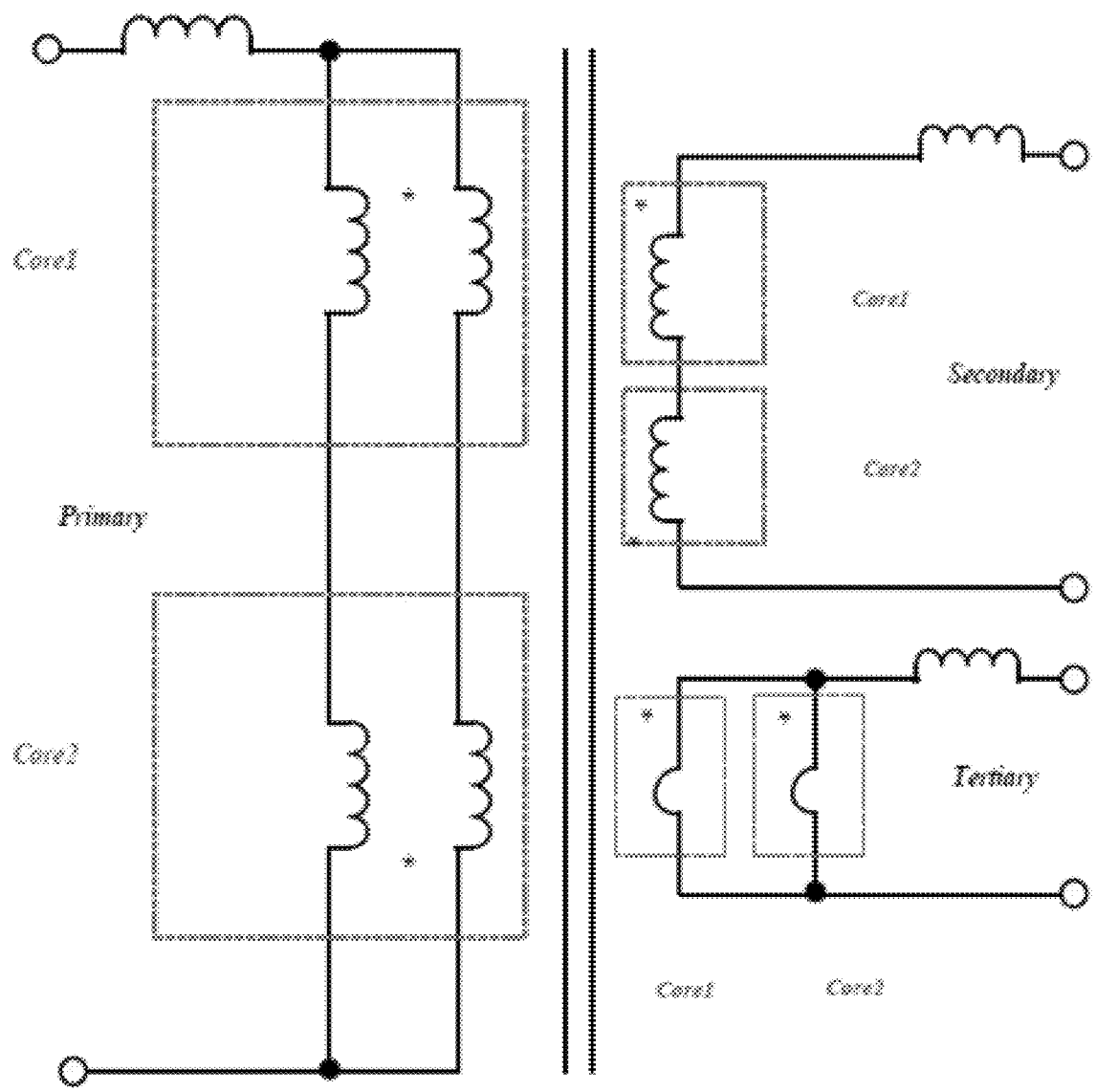
FIG. 13 shows a connection diagram of a two-core structure matrix transformer with different winding polarity.
Figure 14A:
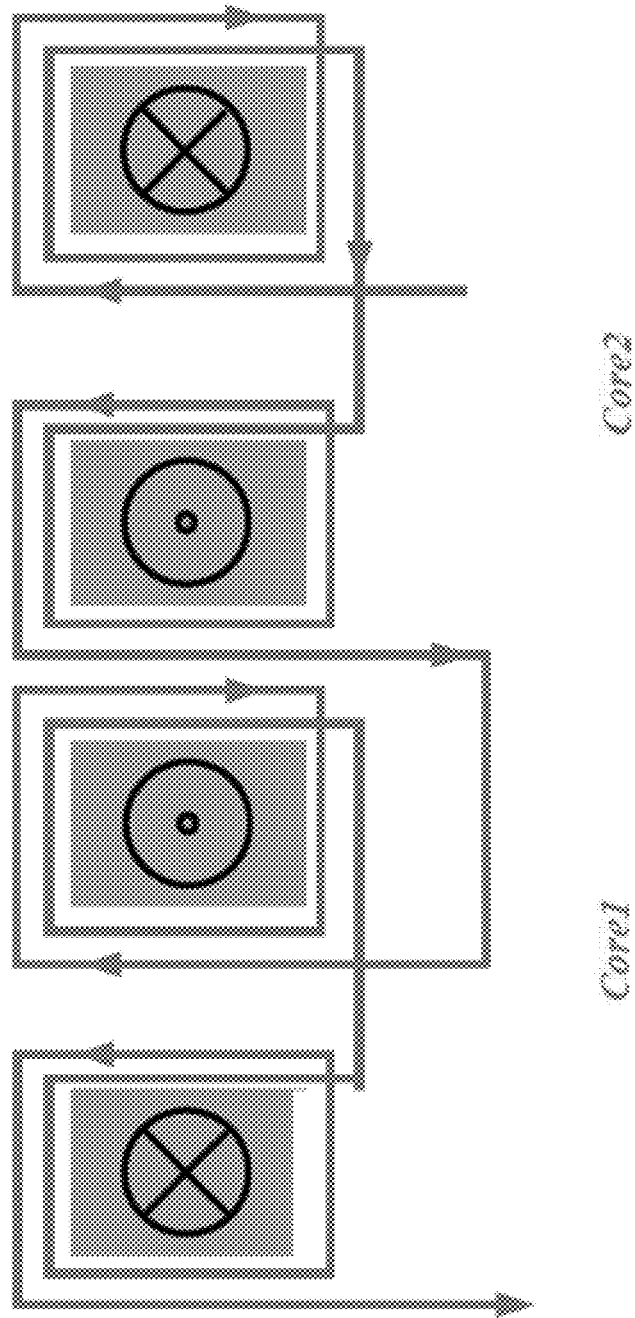
FIG. 14(a) shows flux cancellation with different winding polarities in the primary and secondary windings using UI core.
Figure 14B:
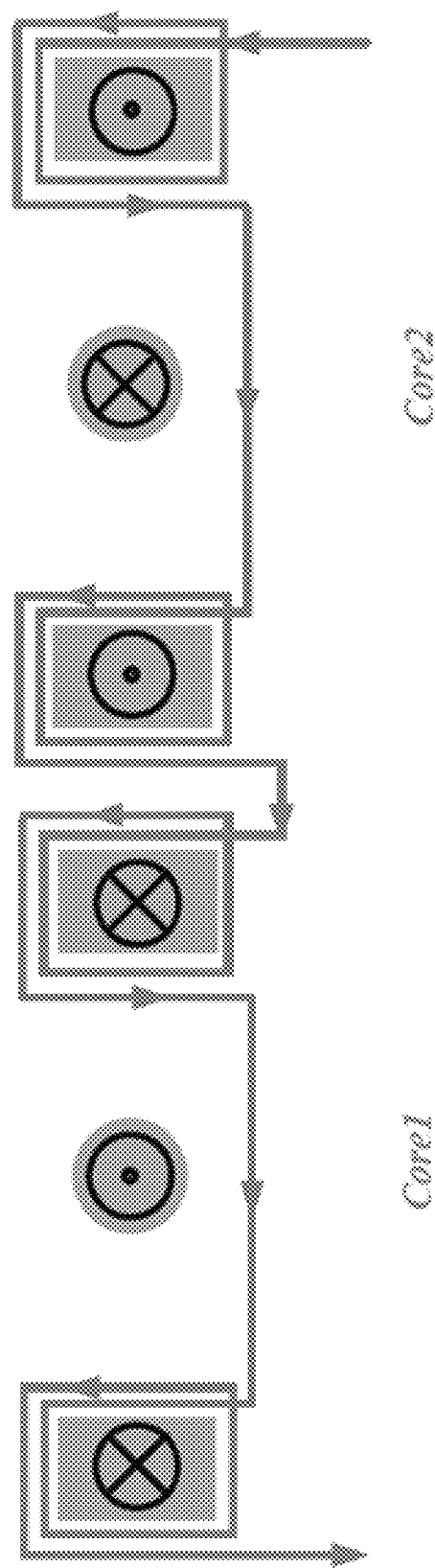
FIG. 14(b) shows flux cancellation with different winding polarities in the primary and secondary windings using ER core.

Furthermore, if the winding polarities on side legs are different, the magnetomotive force in one of the windings can cancel the other one, such that the output voltage and the equivalent turns ratio are reduced. The diagram is shown in FIG. 13, where the winding polarities of the matrix transformer primary/secondary side are different. As can be seen from FIG. 14(a)-14(b), the flux cancellation is formed by changing the flux density direction of one core. In the tertiary side, the winding polarities can be kept the same as they are connected in parallel.

Figure 15A:
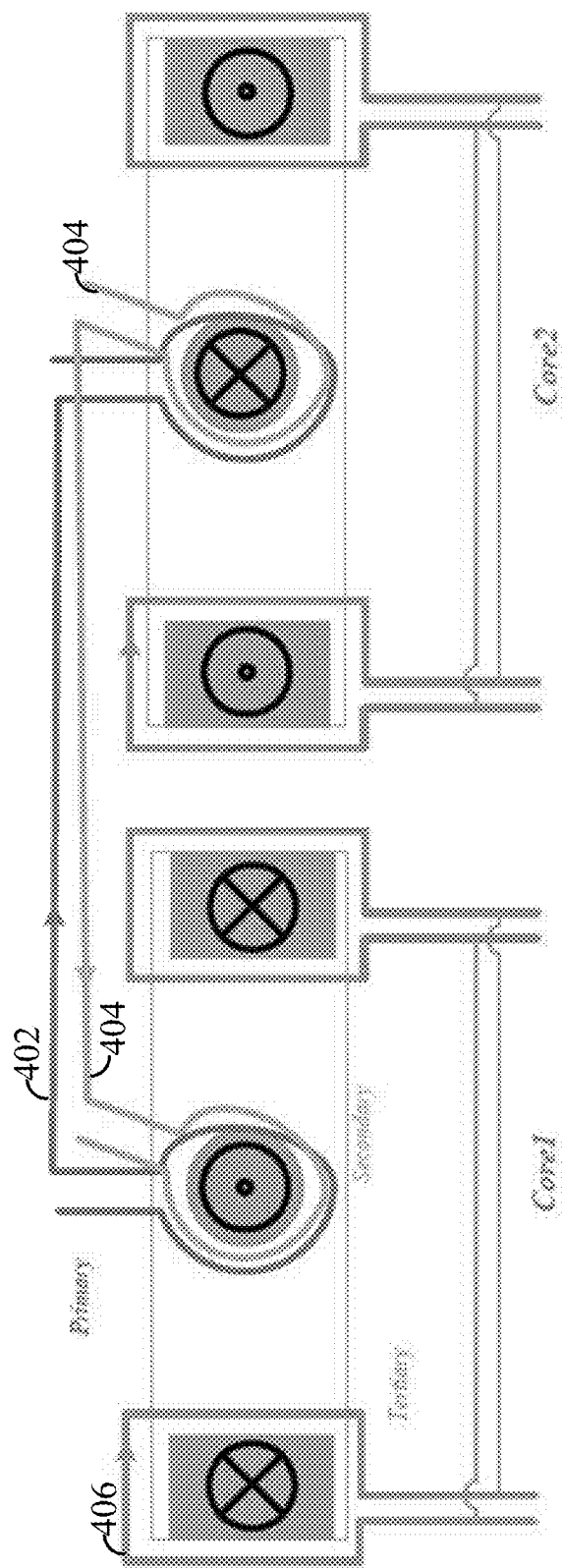
FIG. 15(a) shows fractional-turn showcase: two transformer cores with half-turn configuration for tertiary winding.
Figure 15B:
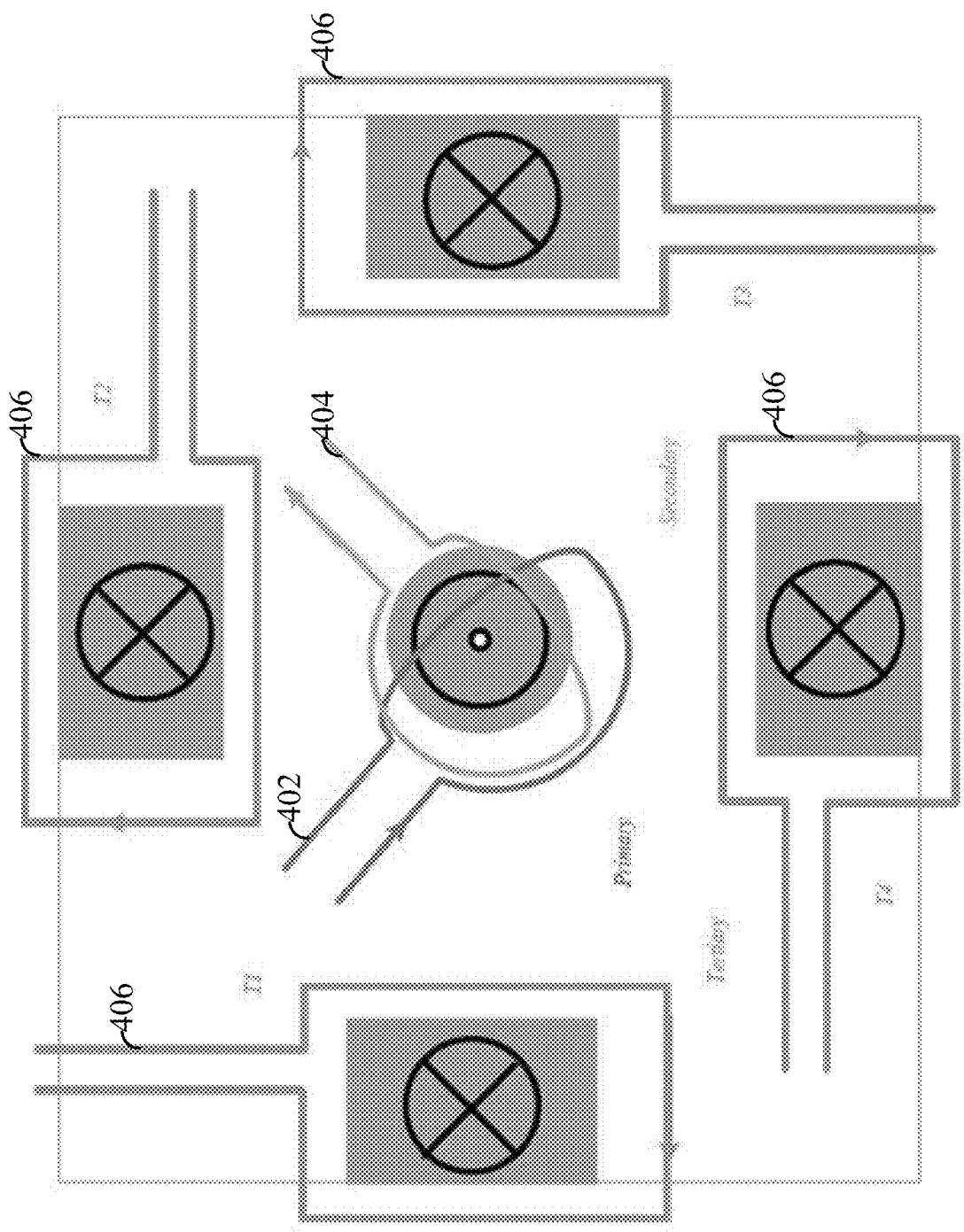
FIG. 15(b) shows fractional-turn showcase: single transformer core with quarter-turn configuration for tertiary winding (T1-T4 in parallel).

Moreover, the fractional-turn can be used for the disclosed multi-winding matrix transformer family. The fractional-turn enables fractional flux coupled in single complete turn on separate core legs or a single complete turn divided into parallel fractional components on the same leg. These windings can be connected in parallel to achieve effective Np: 1/n transformers and low copper loss, where n is the number of secondary windings 404 that are parallelized in this manner. Effectively, the fractional-turn can be half-turn, third-turn, quarter-turn and so on, depending on the core geometry and winding configurations. Thus, high step-down/step-up transformer ratio can be achieved. The fractional-turn showcase for the half-turn and quarter-turn configurations is shown in FIG. 15(a)-15(b).

Figure 16A:
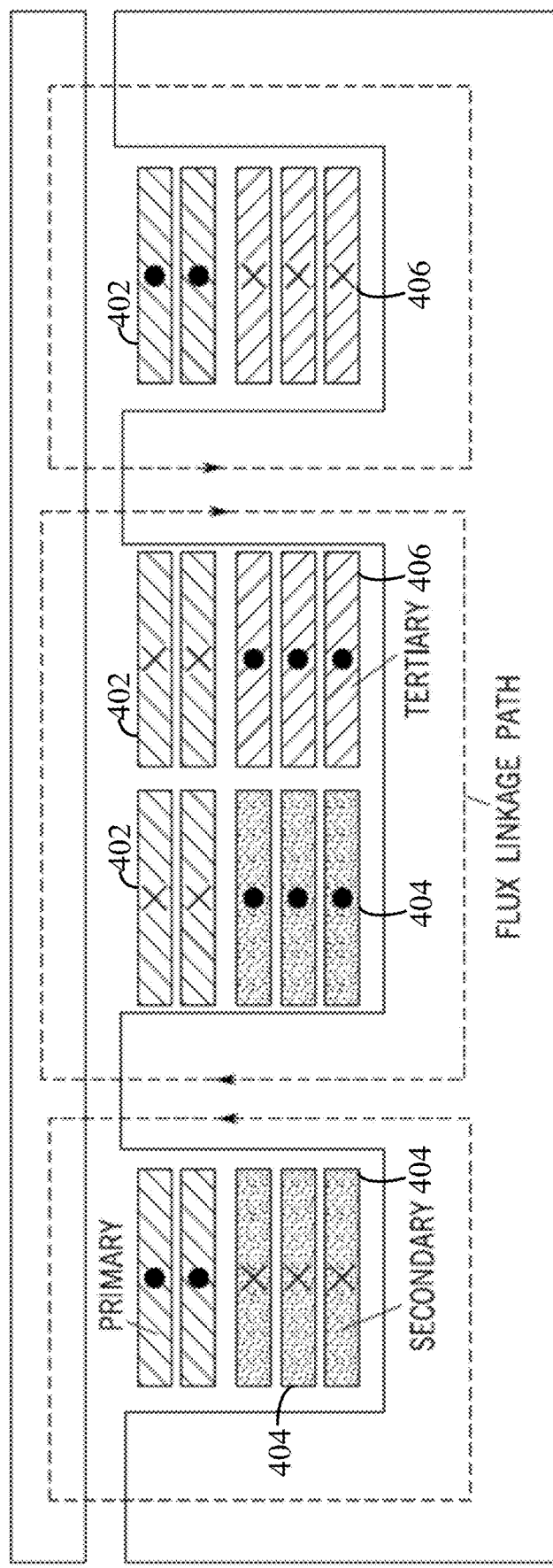
FIG. 16(a) shows a matrix transformer with an integrated EI-UI core: configuration I.
Figure 16B:
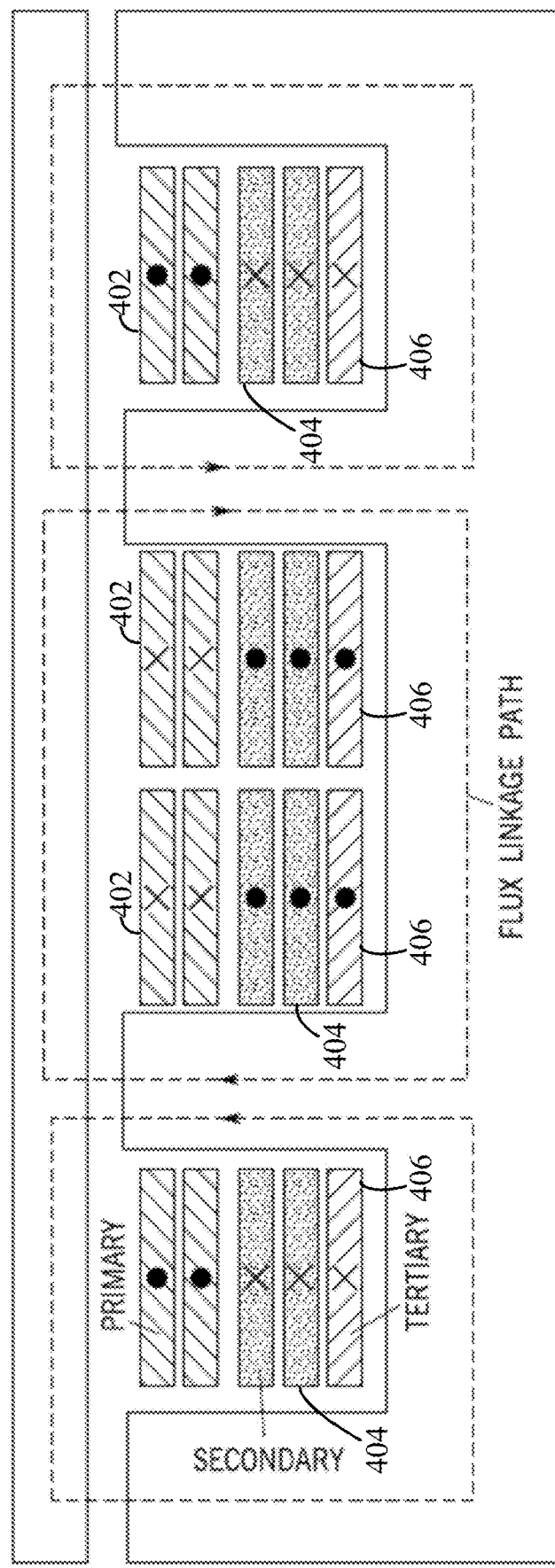
FIG. 16(b) shows a matrix transformer with an integrated EI-UI core: configuration II.
Figure 17A:
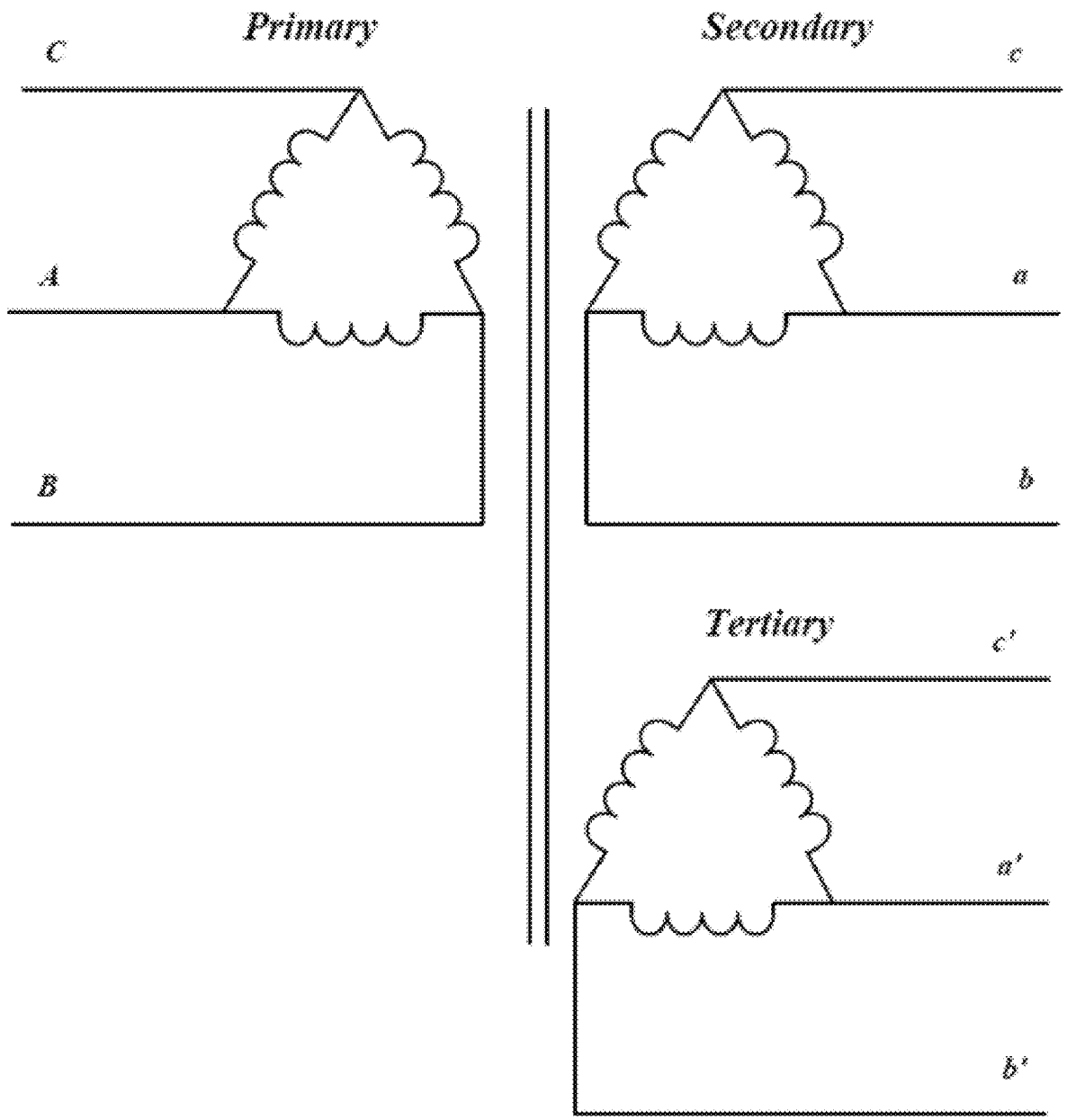
FIG. 17(a) shows a schematic diagram of a delta-delta connection.
Figure 17B:
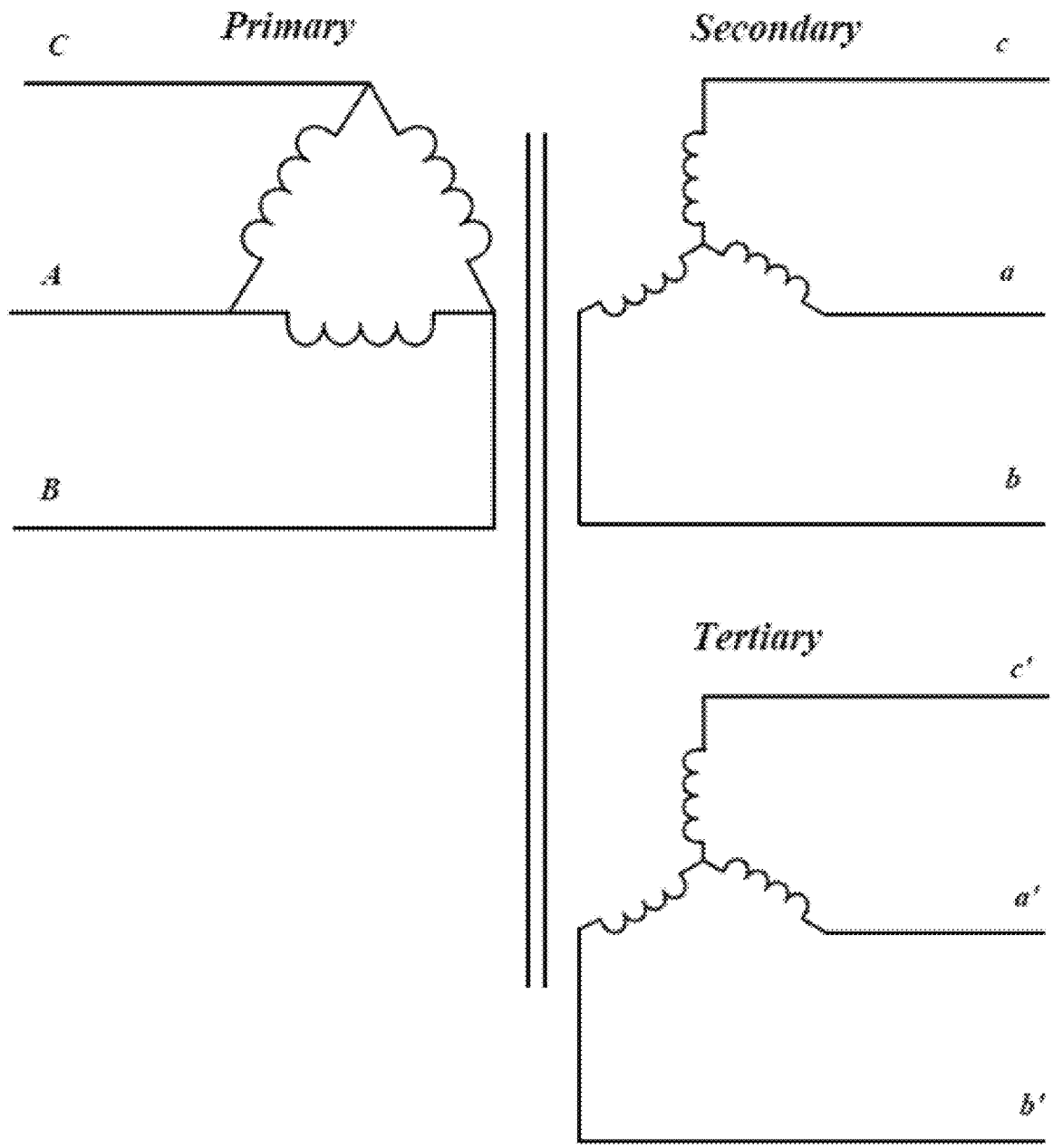
FIG. 17(b) shows a schematic diagram of a star-star connection.
Figure 17C:
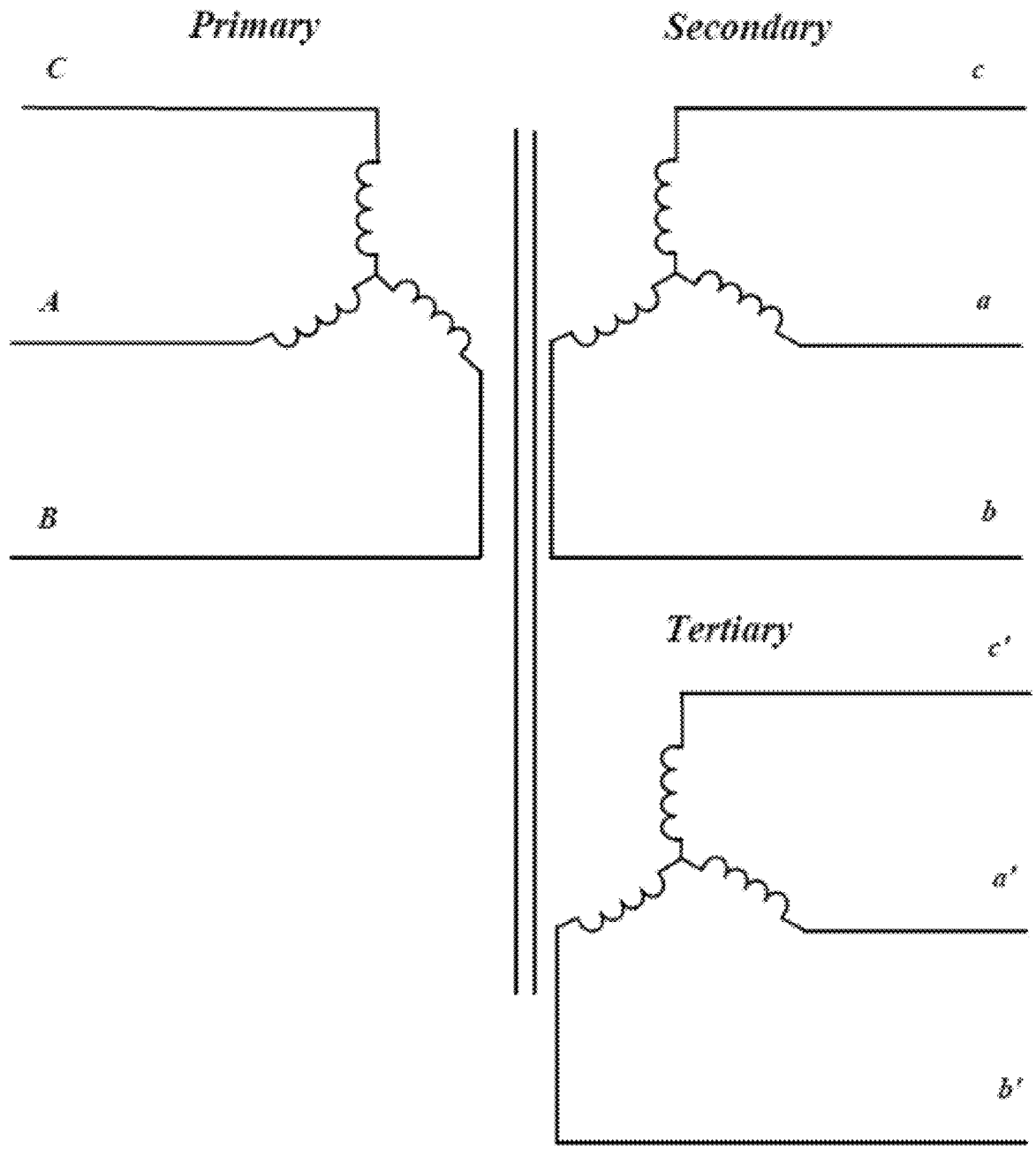
FIG. 17(c) shows a schematic diagram of a star-delta connection.
Figure 17D:
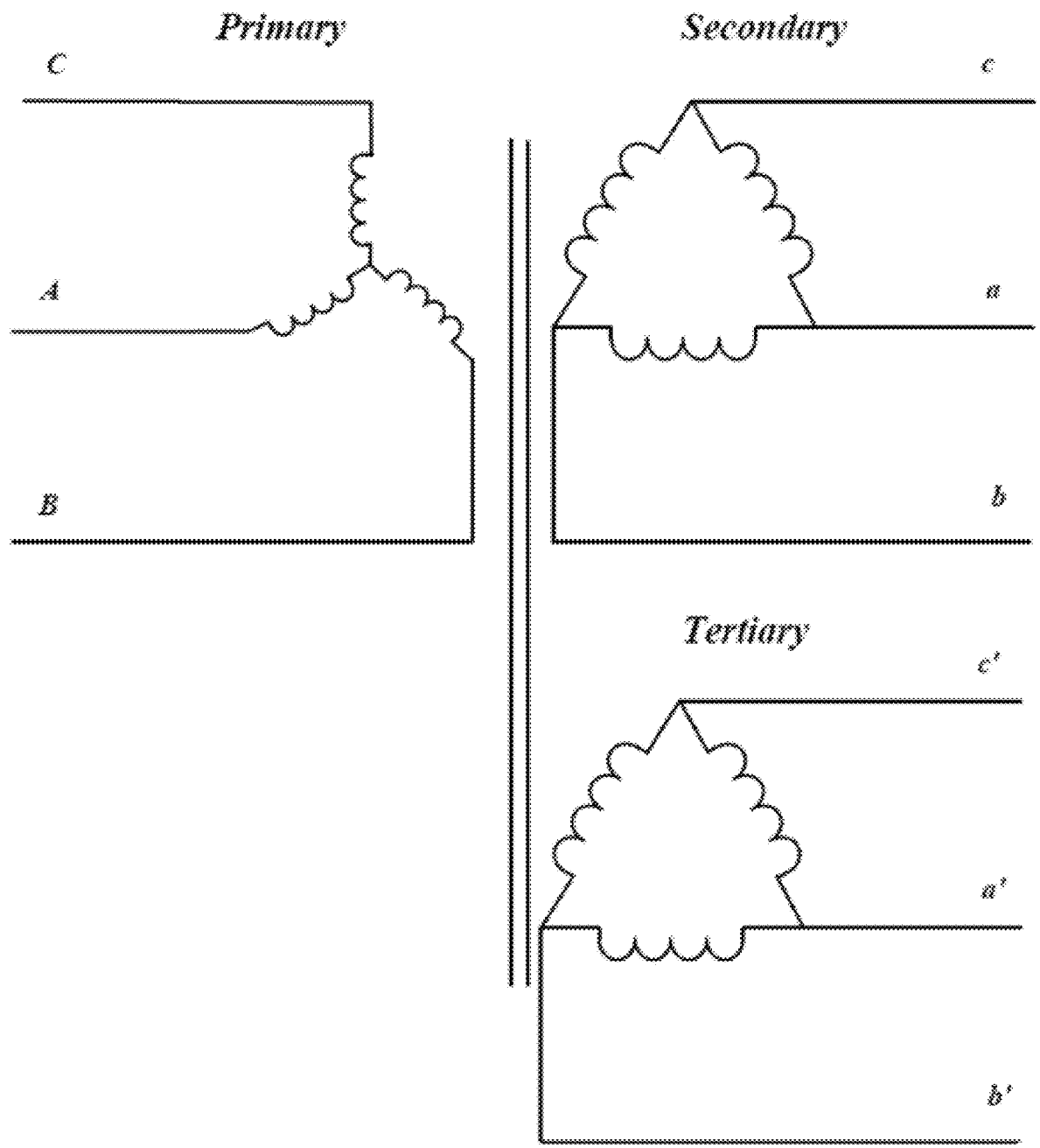
FIG. 17(d) shows a schematic diagram of a delta-star connection.

Similar to EI-shape and UI-core, an integrated EI+UI core can be achieved based on the matrix transformer idea, where the core loss and volume are kept low due to flux cancellation and split current path. The primary winding 402 is split into two phases in a symmetric fashion. Half-turn implementations can be achieved in the secondary and tertiary windings 406 with the integrated EI+UI core. Each primary phase generates the same flux in the two inner posts and this flux flows through the core. The cross section of the transformer core with the winding placement is shown in FIG. 16(a)-16(b).

Type-4: Three-Phase Category

Single-phase integrated transformers provide great flexibility and reliability by splitting the power flow when connected together. The terminals can either be parallel connected, star-connected or delta-connected, depending on the circuit configuration. Four types of the transformer connections are shown in FIG. 17(a)-17(d).

Figure 18:
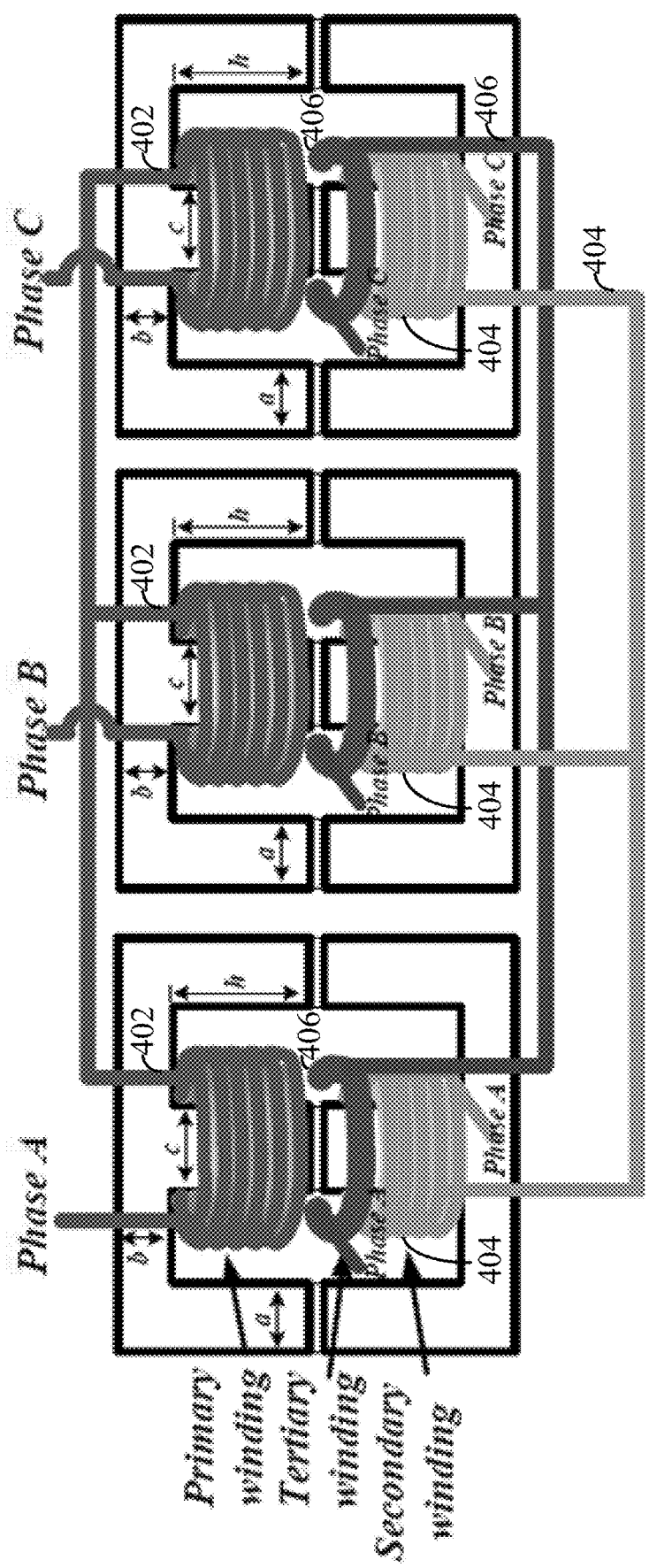
FIG. 18 shows a diagram of three sets of single-phase integrated transformers forming star-connected three-phase interim stage.

In addition, the secondary and tertiary windings 404, 406 can both be separately connected to split the current, which means that the following stages are configured in parallel. The diagram of a three-phase transformer using three single-phase EE-shape cores with the Litz non-interleaved center-leg winding is illustrated in FIG. 18. The connection type can be delta-delta, star-star, star-delta and delta-star.

Figure 19A:
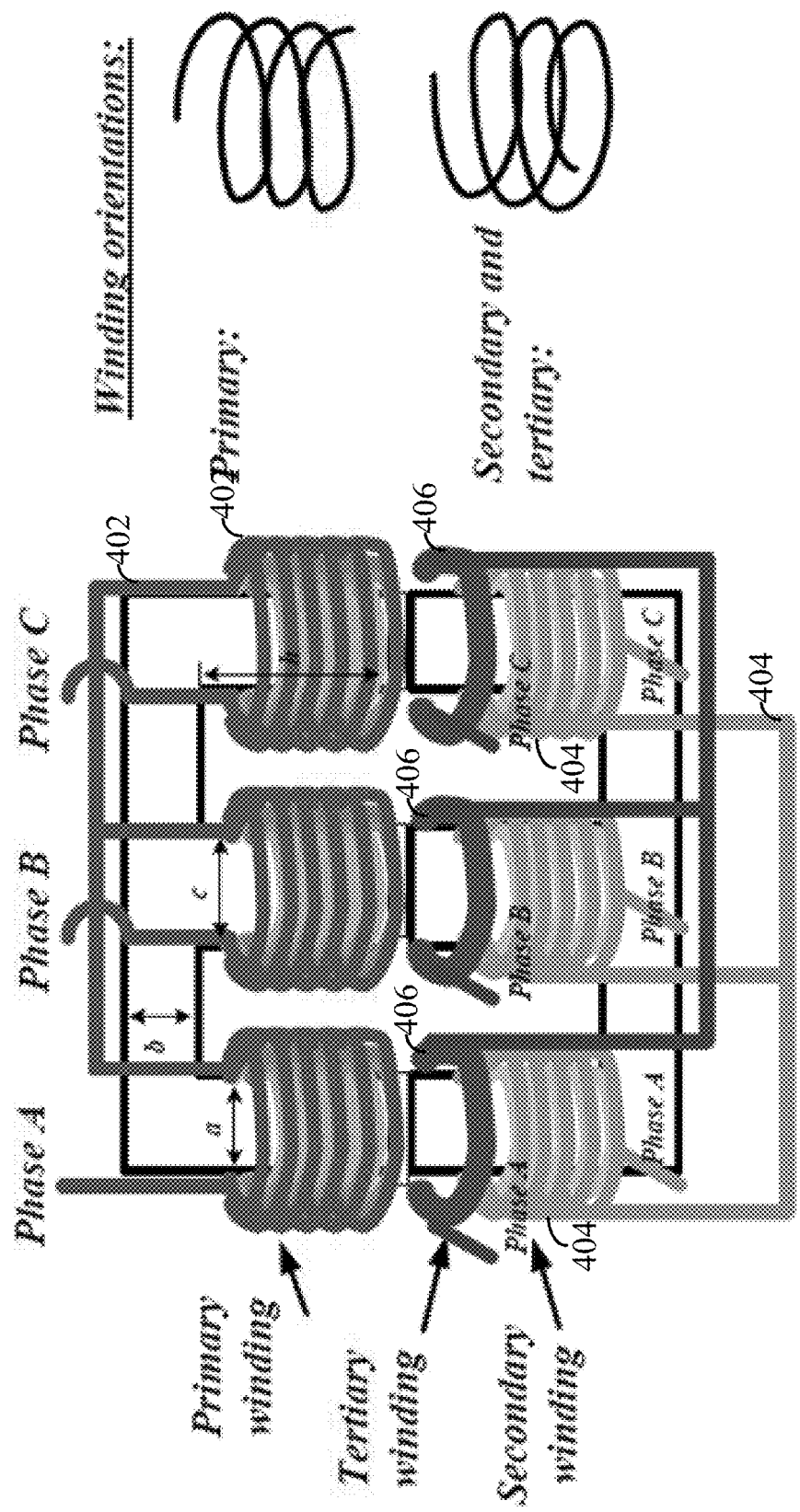
FIG. 19(a) shows a schematic diagram of a set of three-phase integrated transformer using the non-interleaved Litz wire: three-column compact core.
Figure 19B:
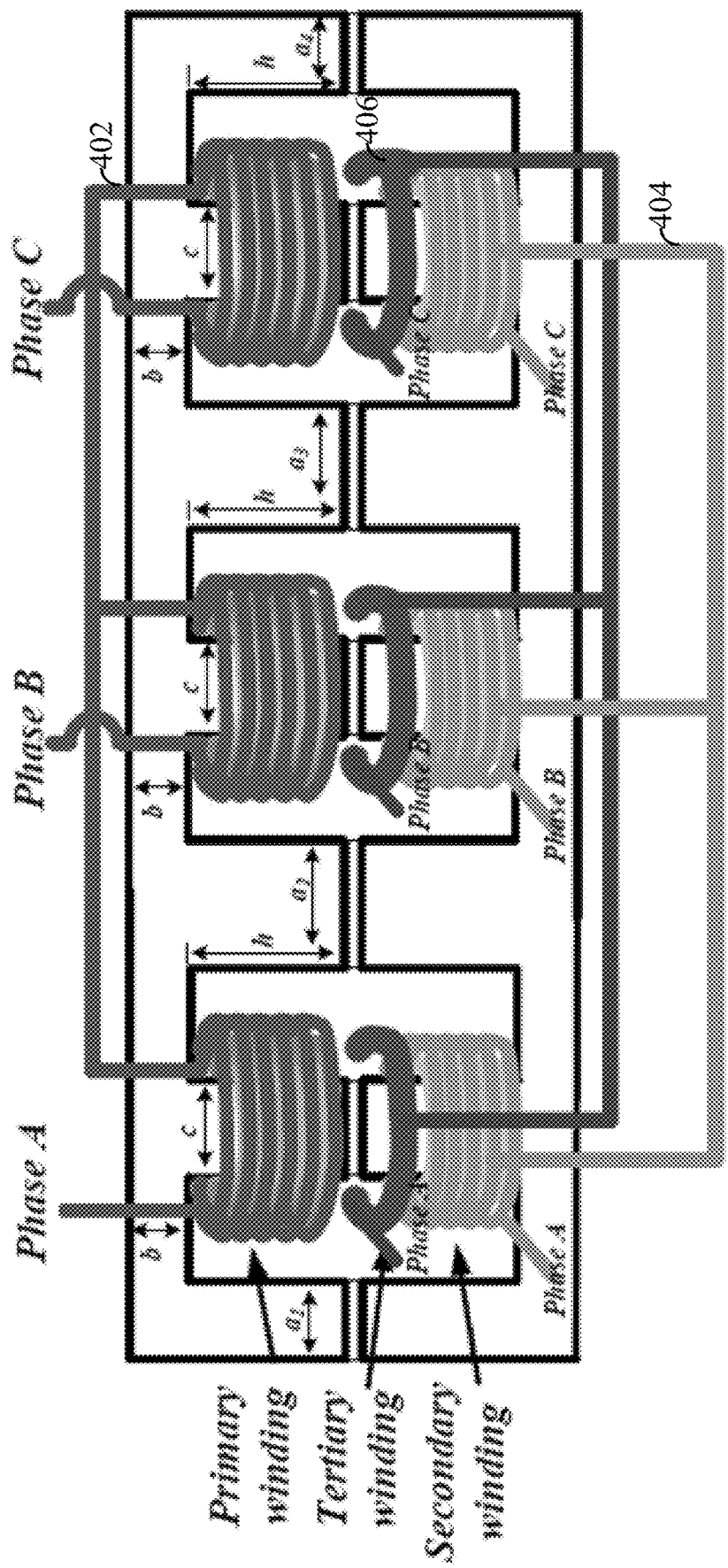
FIG. 19(b) shows a schematic diagram of a set of three-phase integrated transformer using the non-interleaved Litz wire: seven-column compact core.

A three-phase integrated transformer can be utilized, which has advantages in terms of volume and cost. By engaging the tertiary winding 406 in three columns of the EE-shape core, LV side bridges can be integrated with HV side. As it is a three-phase system with three windings, the flux balance can be achieved by proper selection of three leg width. Like in the single-phase EE-shape cores, the width a and height h of side legs can be adjusted to reduce the core loss while maintaining enough magnetizing inductance. FIG. 19(a) shows the diagram of a three-phase integrated transformer with the three-column compact core using the non-interleaved Litz wire, where the tertiary winding 406 can either be series connected along three columns or be wound as a single turn through the outer space of the core. The winding orientation of the primary winding 402 is different from the winding orientation of the secondary winding 404 and tertiary winding 406. If the primary winding orientation is clockwise, the secondary and tertiary winding orientation is counter-clockwise to maintain the flux balance. The air gap control needs to be carefully considered since this structure has the interleaved flux link between phases. In FIG. 19(b), the three-phase integrated transformer core has four extra columns, which gives the full potential to adjust the leakage and magnetizing inductances, core loss, and winding loss. The leg width $a_{1-4}$ and the height h of side legs can be adjusted to reduce the core loss while maintaining enough magnetizing inductance.

Figure 20A:
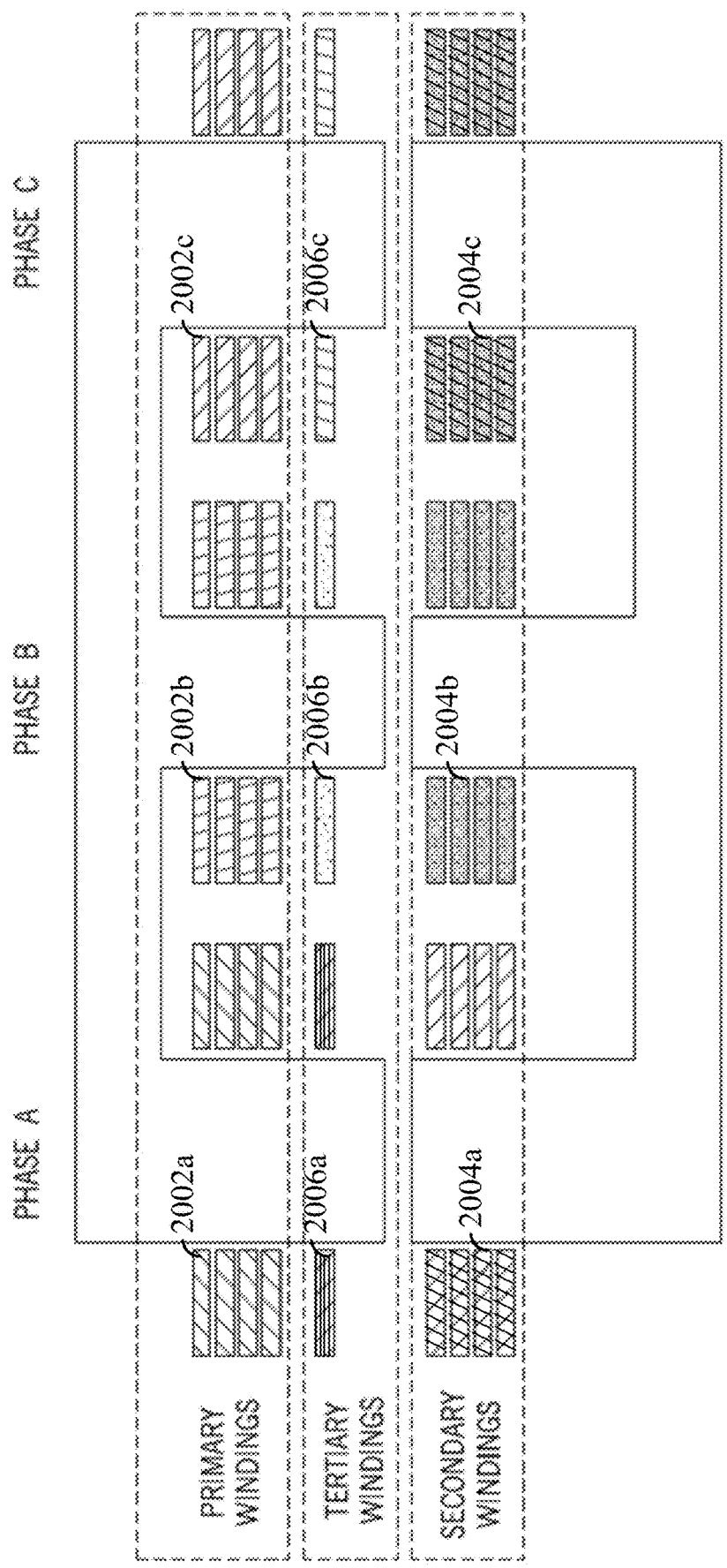
FIG. 20(a) shows a schematic diagram of a set of three-phase integrated transformer using non-interleaved PCB windings.
Figure 20B:
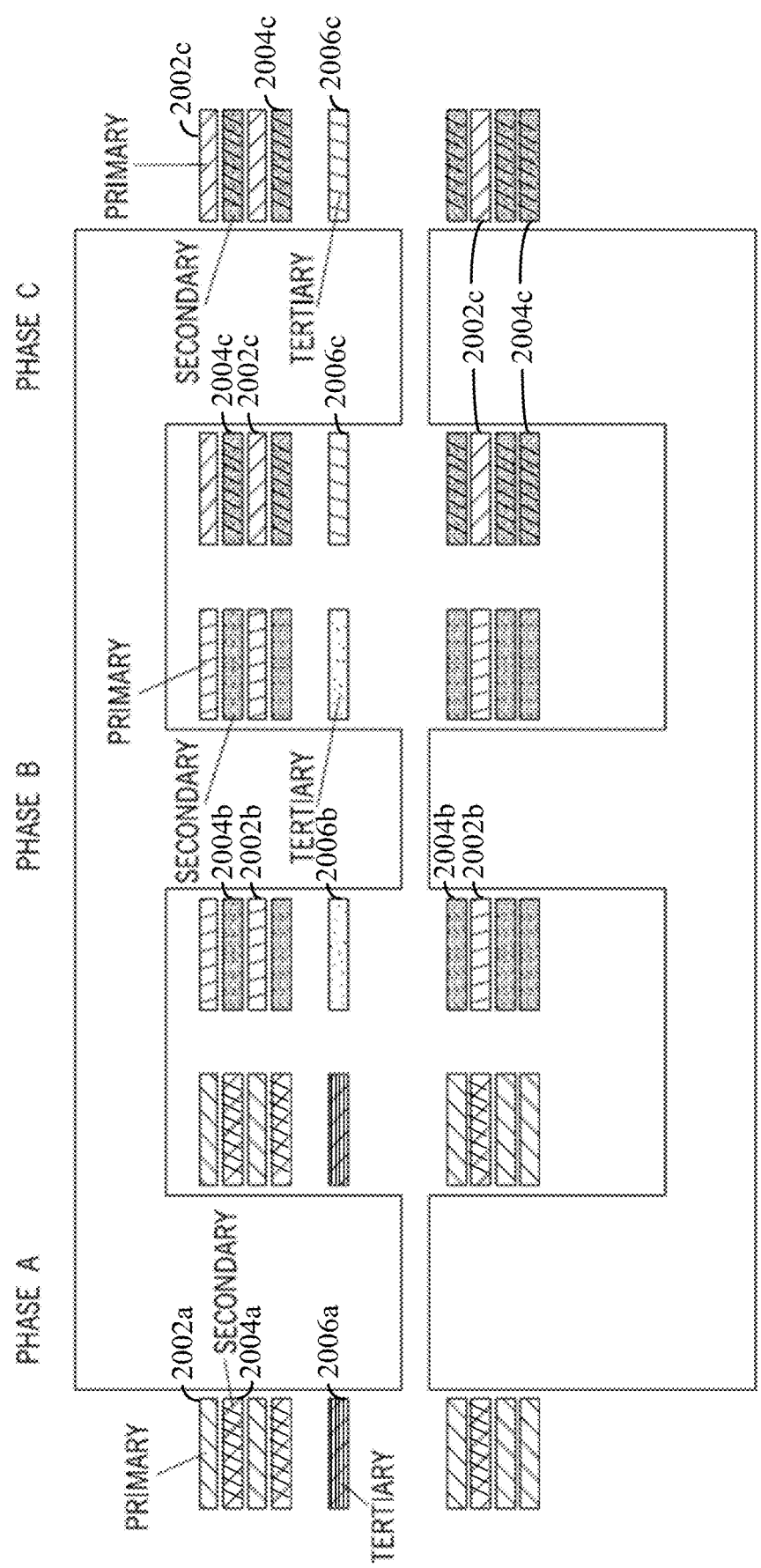
FIG. 20(b) shows a schematic diagram of a set of three-phase integrated transformer using interleaved PCB windings.
Figure 21A:
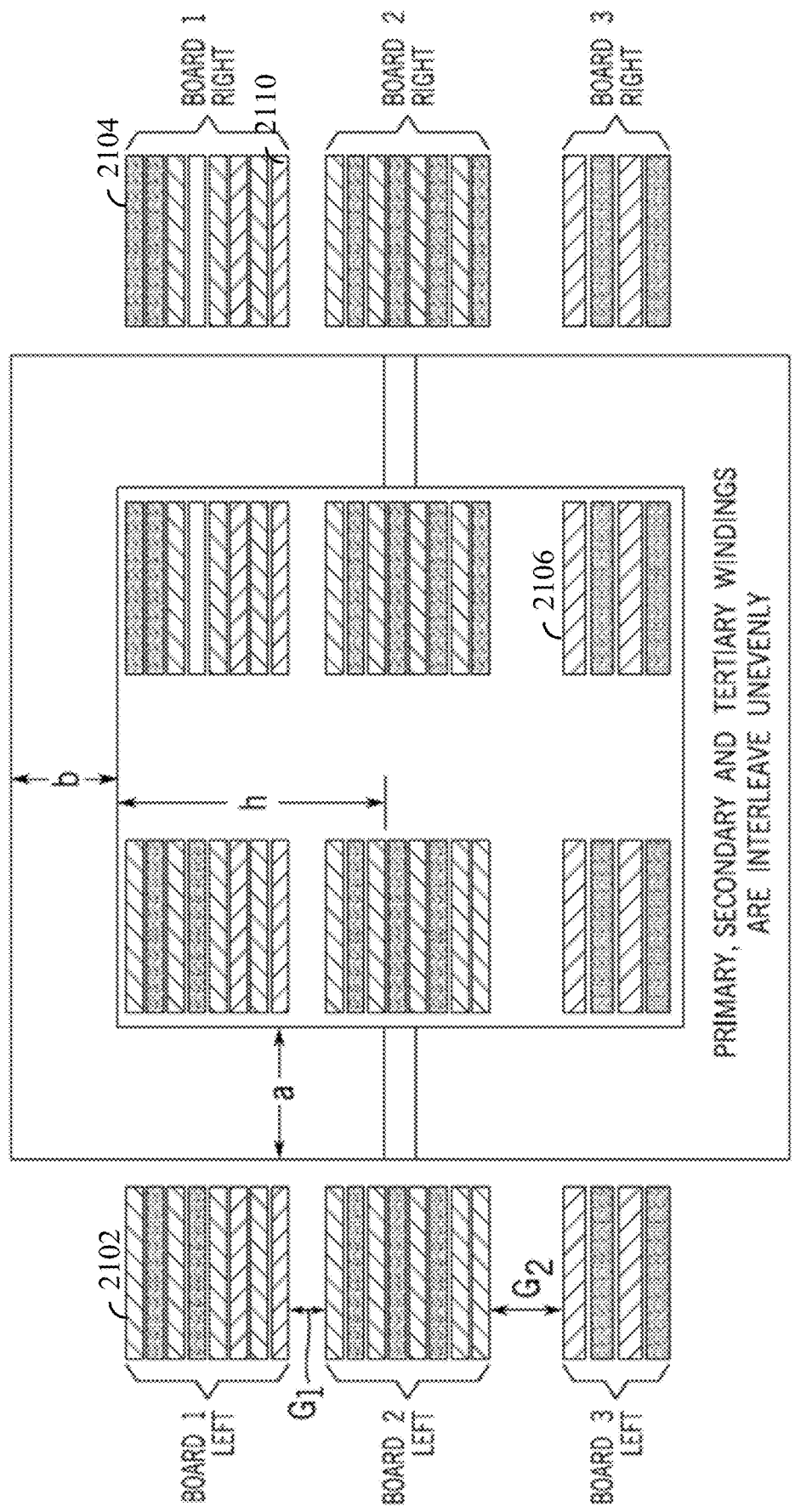
FIG. 21(a) shows a diagram of a set of three-phase integrated transformer with three general windings: interleaved PCB windings using UU core.
Figure 21B:
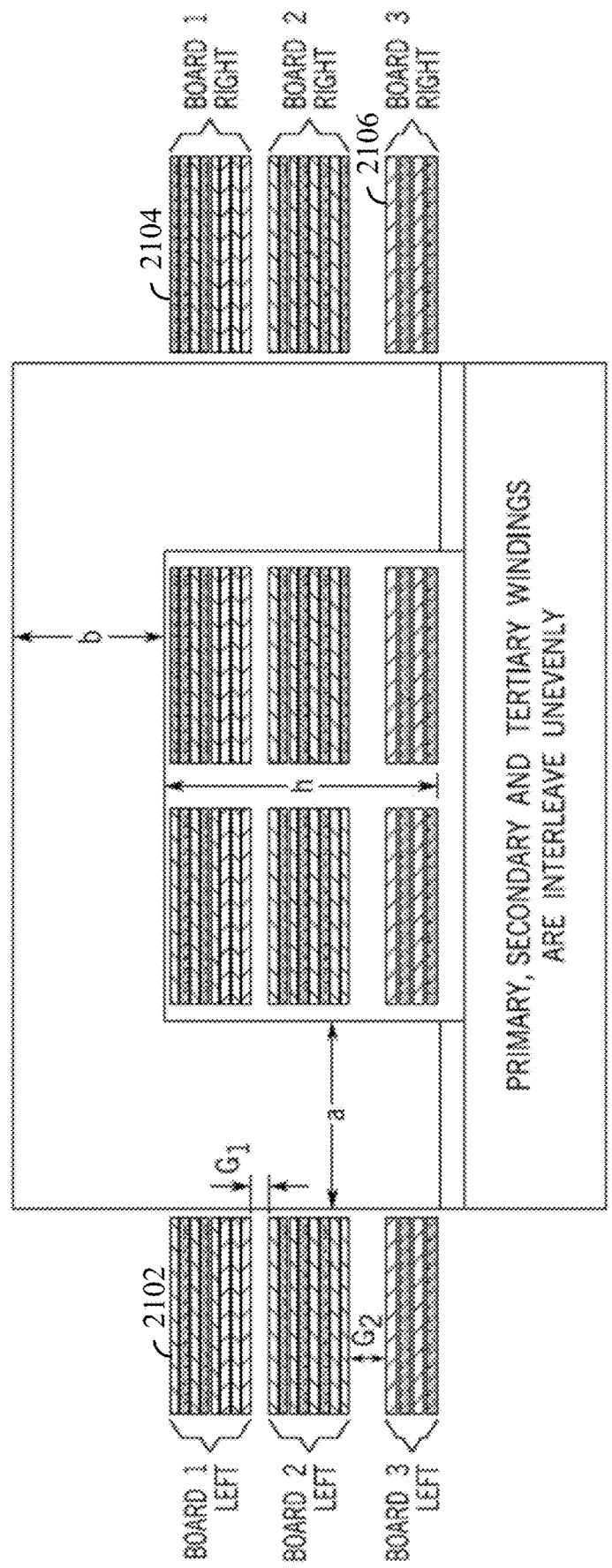
FIG. 21(b) shows a diagram of a set of three-phase integrated transformer with three general windings: interleaved PCB windings using UI core.
Figure 21C:
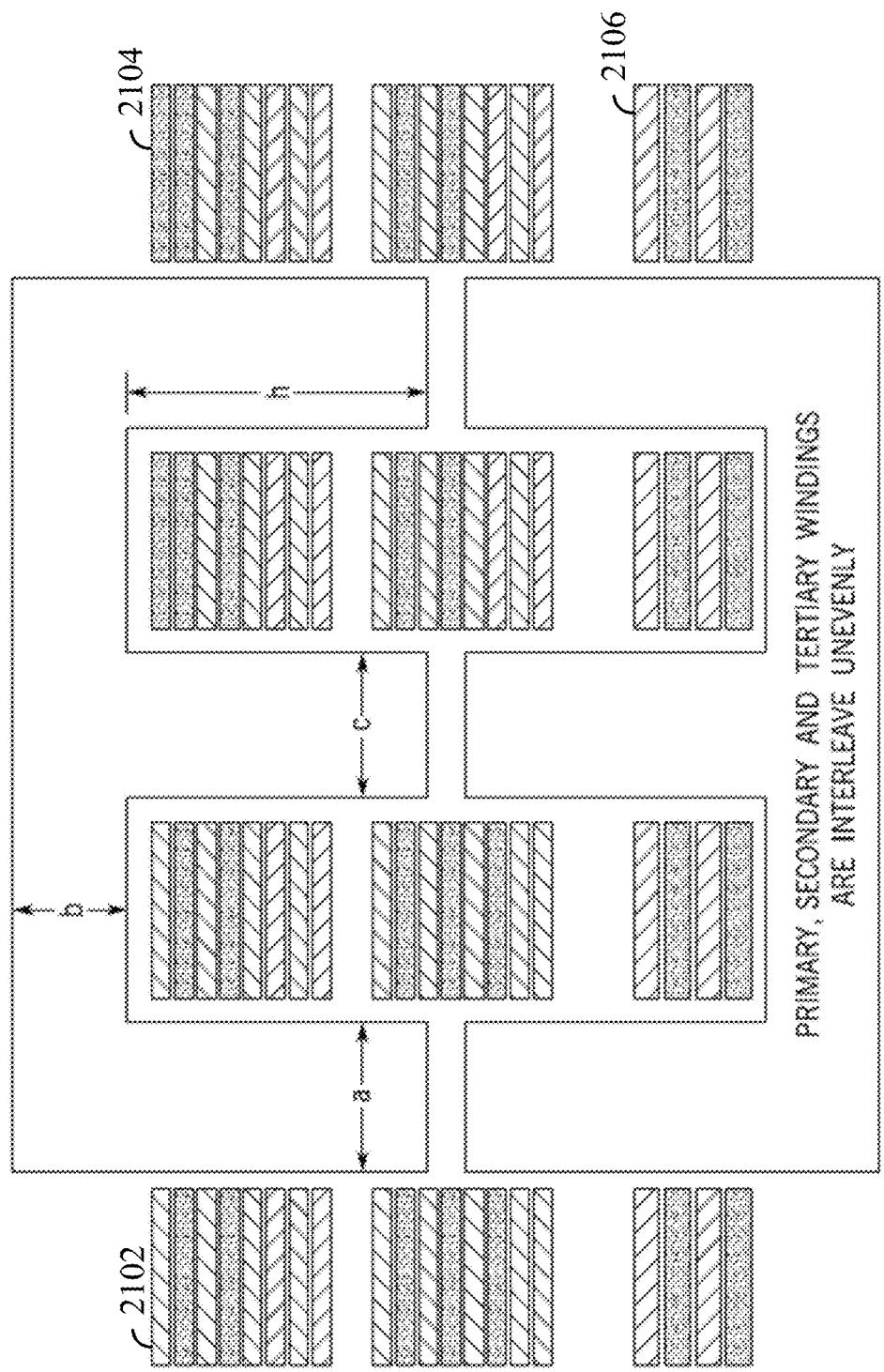
FIG. 21(c) shows a diagram of a set of three-phase integrated transformer with three general windings: interleaved PCB windings using EE core, configuration I.
Figure 21D:
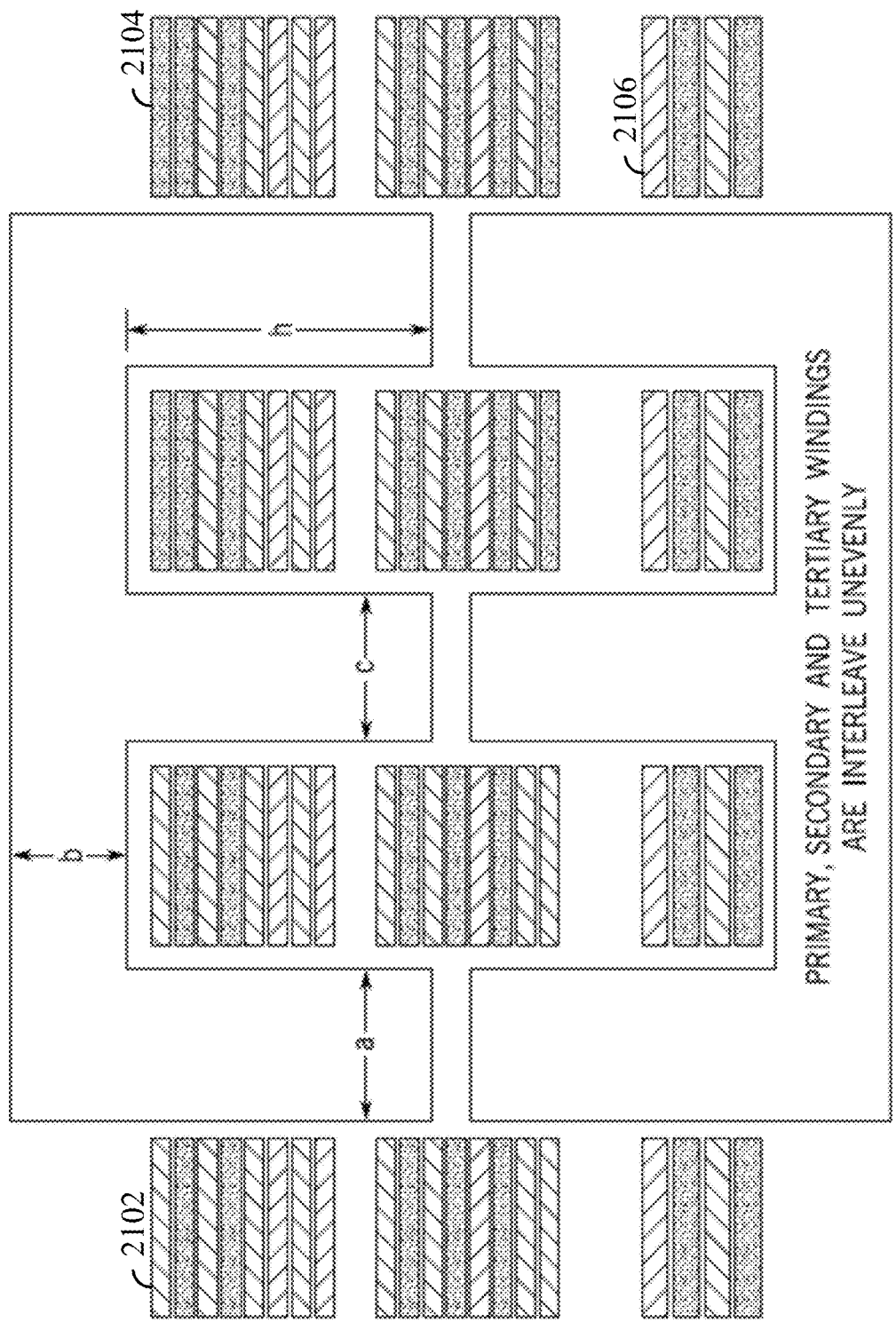
FIG. 21(d) shows a diagram of a set of three-phase integrated transformer with three general windings: interleaved PCB windings using EE core, configuration II.
Figure 22A:
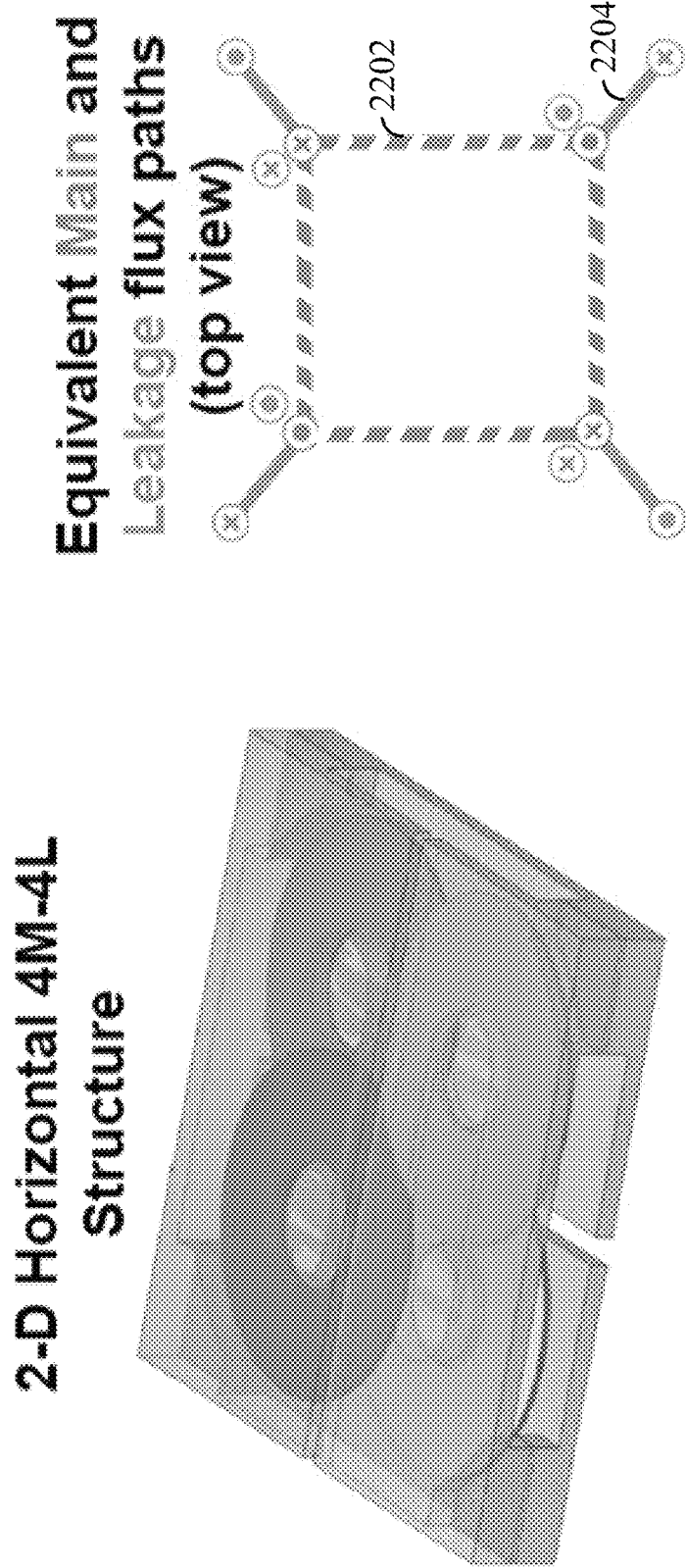
FIG. 22(a) shows a visual illustration of an exemplary MWIT structure using the disclosed design method.
Figure 22C:
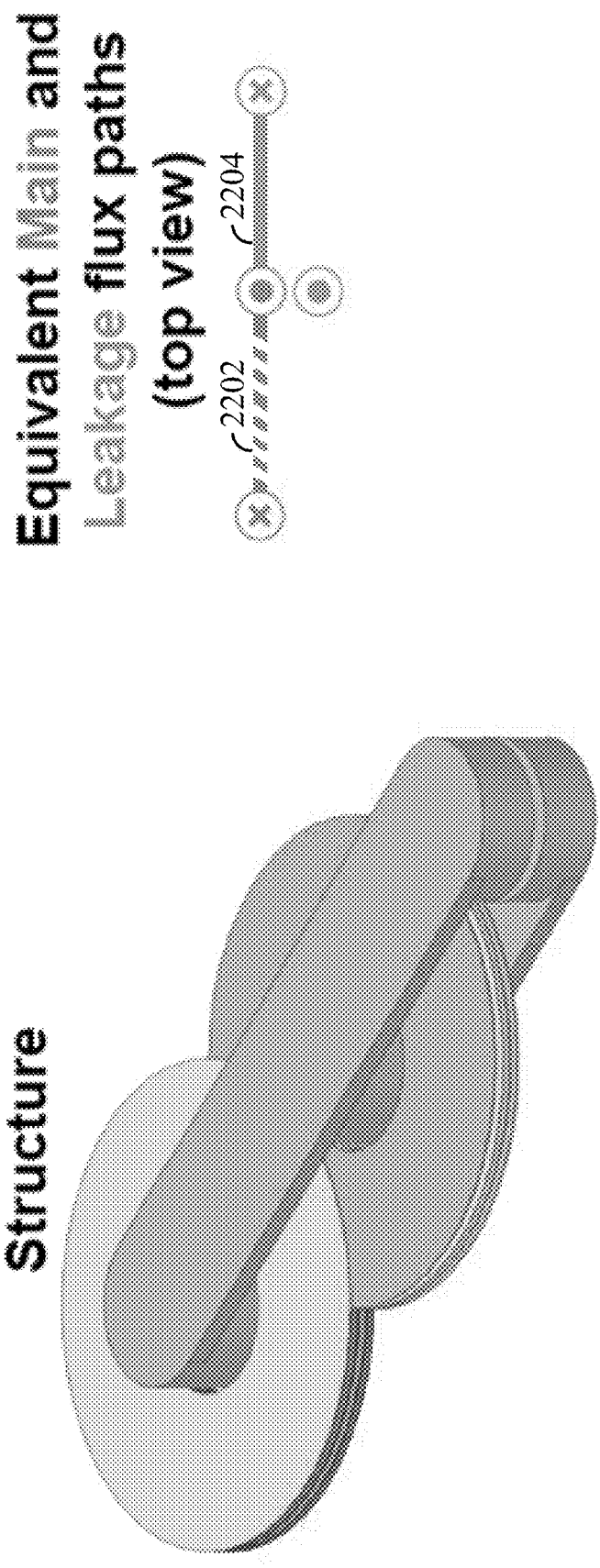
FIG. 22(c) shows a visual illustration of an another exemplary MWIT structure using the disclosed design method.
Figure 22D:
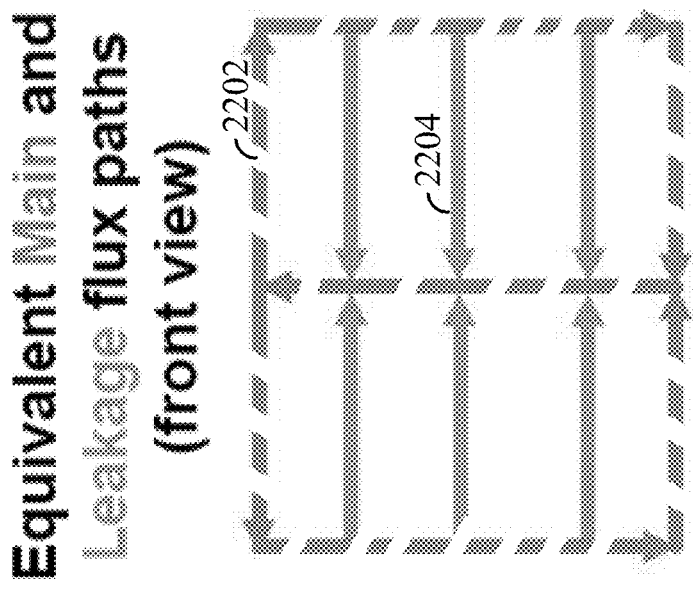
FIG. 22(d) shows a visual illustration of an another exemplary MWIT structure using the disclosed design method.

Moreover, the PCB windings can be implemented in the three-phase integrated transformer. The winding configurations are shown in FIG. 20(a)-20(b). In FIG. 20(a), each leg is wound with one phase PCB winding (primary windings 2002a, 2002b, 2002c; secondary windings 2004a, 2004b, 2004c; tertiary windings 2006a, 2006b, 2006c), and the parasitic capacitances are suppressed through the distance adjustment of the layers. FIG. 20(b) illustrates the interleaved PCB winding configuration (primary windings 2002a, 2002b, 2002c; secondary windings 2004a, 2004b, 2004c; tertiary windings 2006a, 2006b, 2006c), where the primary 2002a, 2002b, 2002c and secondary 2004a, 2004b, 2004c windings are asymmetrically placed in each leg. The width ratio between the center and side legs contributes to the core loss and the leakage inductance.

Type-5 General Three-Winding Category

In the case of the tertiary winding where the high step-down turns ratio is not needed, it can be configured with the similar winding arrangement in the primary/secondary windings. For example, all three windings can be designed with the similar current/voltage rating in the energy storage systems, regardless of Litz wire or PCB windings. In the interleaved winding structures, the tertiary winding can be viewed as the additional variable to control the leakage inductance and winding loss. All the windings can be interleaved partially/fully in two/three PCB boards, depending on the design requirement. The core selection follows the previous discussion: EE-shape, UU-shape, EI-shape, ER-shape, UI-shape, or PQ-shape can be utilized with the customized dimensions and flux cancellation technique. The winding diagrams are shown in FIG. 21(a)-21(d) (primary windings 2102, secondary windings 2004, and tertiary windings 2006).

Type-6 Generalized N-Port Multi-Winding Integrated Leakage Transformer (MWIT)

As the number of electrical ports coupled by the transformer increases, a key challenge in leakage integrated multi-winding transformer designs is achieving controllable leakage on all ports without compromising the transformer efficiency. There are fundamentally two approaches in achieving integrated leakage inductance in a transformer, namely, (a) by storing the leakage energy in a magnetic shunt, see J. Zhang, Z. Ouyang, M. C. Duffy, M. A. E. Andersen, and W. G. Hurley, "Leakage Inductance Calculation for Planar Transformers With a Magnetic Shunt," IEEE Transactions on Industry Applications, vol. 50, no. 6, pp. 4107-4112, November 2014; and (b) by storing the leakage energy in the air or dielectric gaps between windings, see P. He, A. Mallik, G. Cooke, and A. Khaligh, "High-power-density high-efficiency LLC converter with an adjustable-leakage-inductance planar transformer for data centers," IET Power Electronics, vol. 12, no. 2, pp. 303-310, 2019. A new family of multi-port transformer design structures is disclosed herein, which enables the design of compact and highly efficient multi-port converters. The disclosed family of multi-port transformers feature a single main flux path 2202 (dotted lines) consisting of two or more legs (henceforth referred to as '1\4' legs), and one or more independently configurable leakage flux paths (2204 (solid lines) (henceforth referred to as 'L' legs). The orientation and number of 'M' and 'L' legs determine the flexibility in achieving desired leakage inductances on each port, and can further influence the volume, cost, efficiency, and parasitics of the multi-port transformer.

To achieve fully controllable leakage inductance on each port that is not dependent on the leakage inductances on other ports, a necessary condition is that the number of 'L' legs must be equal to or greater than the number of ports (or windings), minus one. Thus, as illustrated in Table 2 and FIG. 22(a)-22(d), a large number of unique MWIT designs are realizable through different arrangements of a varying number of M and L legs in 1-D (linear), 2-D (horizontal or vertical spread), and 3-D (horizontal and vertical spread) configurations.

TABLE 2

Some possible combinations of MWITs that can be realized with the disclosed design method

| Flux Path Dimension | Flux Path Direction | Number of 'M' Legs | Number of 'L' Legs | Winding configuration |
|---|---|---|---|---|
| 1-D | Horizontal | ≥2 | ≥1 | Planar/Non-planar Interleaved/Non-Interleaved |
| 2-D | Horizontal | ≥2 | ≥1 | Planar/Non-planar Interleaved/Non-Interleaved |
|  | Vertical | 1 | ≥1 | Planar/Non-planar Interleaved/Non-Interleaved |
| 3-D | Horizontal + Vertical | ≥2 | ≥1 | Planar/Non-planar Interleaved/Non-Interleaved |

Figure 23A:
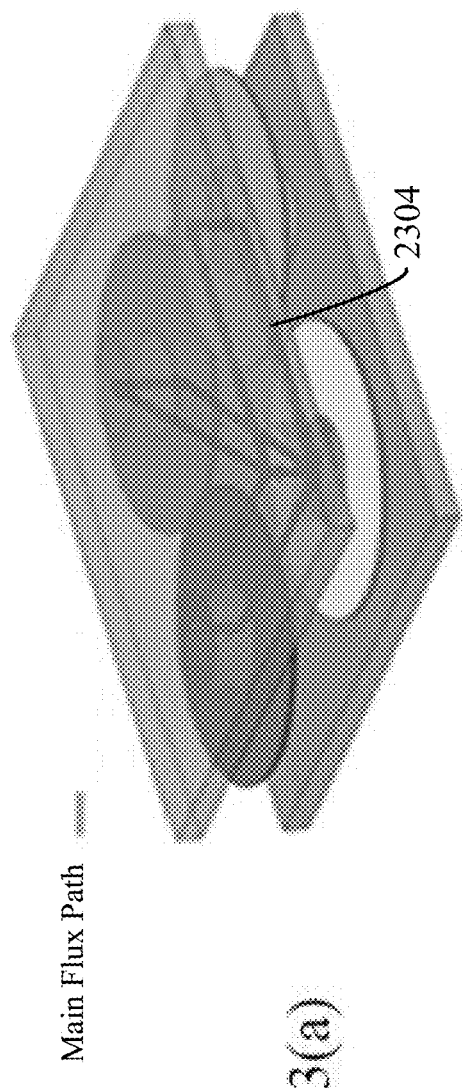
FIG. 23(a) shows an example of flux bifurcation generated from windings of one leg connected to ferrite planes.
Figure 23B:
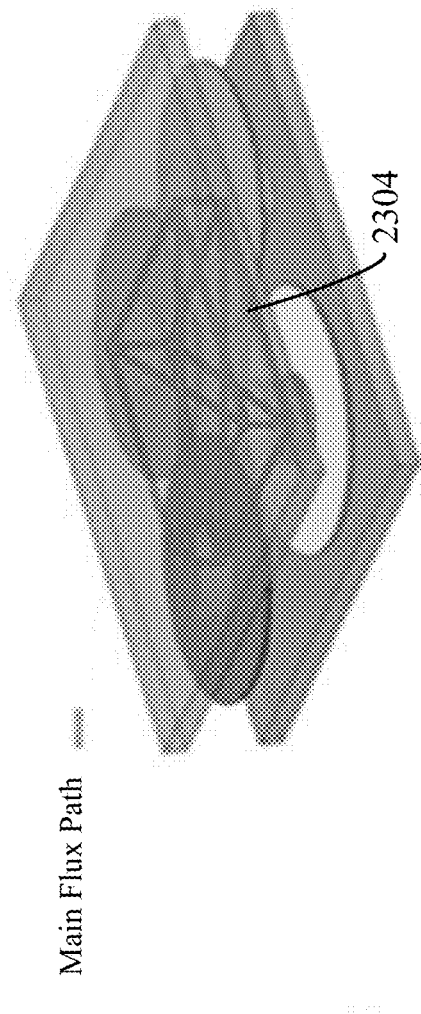
FIG. 23(b) shows example of all possible flux bifurcations due to all legs connected to ferrite planes.

A key distinguishing feature of the disclosed family of multi-winding integrated leakage transformers is the presence of a single main flux path 2202 (dotted lines). This implies that the magnetizing flux is not asymmetrically bifurcated for all the 2-D and 3-D flux path designs in Table 2. In contrast, the typical 2-D and 3-D flux path designs, see C. Fei, F. C. Lee and Q. Li, "High-Efficiency High-Power-Density LLC Converter With an Integrated Planar Matrix Transformer for High-Output Current Applications," in IEEE Transactions on Industrial Electronics, vol. 64, no. 11, pp. 9072-9082, November 2017, utilize continuous ferrite planes, which result in the bifurcation of the magnetizing flux among various legs, as shown in FIG. 23(a)-23(b) with main flus path 2304. This bifurcation results in poor control over leakage inductance of individual ports. As a result, most of such designs with 2-D flux paths are non-integrated in nature, and the windings are arranged such that the leakage inductance is minimized, and a single magnetizing flux path emerges.

Figure 24:
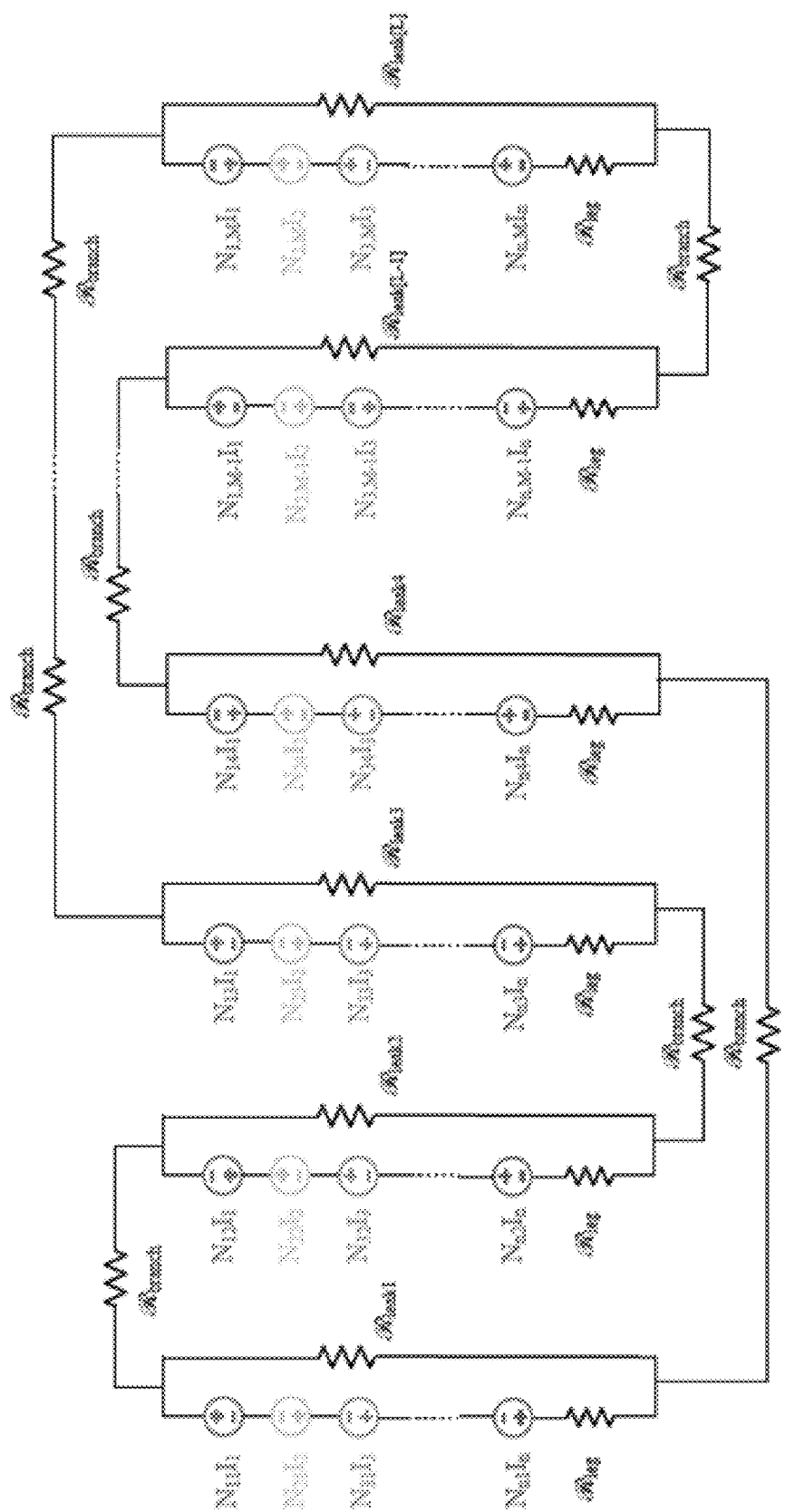
FIG. 24 shows a reluctance diagram of an n-port MWIT transformer with M-main legs and L-leakage legs.

To prevent magnetizing flux bifurcation irrespective of the winding configuration, the disclosed family of designs feature strategically placed air gaps between the ferrite blocks. This allows integration and excellent control of leakage inductances, and the flexibility in winding configuration allows for interleaving of windings to reduce the AC resistance and hence the conduction losses. In addition to the independent control on the leakage inductance of each port which is achieved by adjusting the reluctance of each 'L' leg, the reluctance of the main 'M' legs are independently adjustable (by varying the dimensions and/or air gap in the path) to achieve the desired core loss performance. A typical reluctance diagram for an n-port design is shown in FIG. 24. This concept is not limited to the reluctance diagram shown in FIG. 24. For example, the 'L' legs can be designed such that some of them are coupled to each other. Such an arrangement can yield optimal designs in multi-port converters where distribution between currents on different ports can change significantly, but the net currents remain almost constant.

It is noted that while the exemplary design diagrams depict planar windings, this family of multi-winding transformers can be constructed as planar foil or PCB or non-planar Litz-wire windings. In addition to interleaving between windings on different ports, the current capacity of a given winding can be increased using matrix-based winding configurations. The large contact area between the windings and the ferrite core is utilized for efficient heat extraction from the transformer.

Figure 25A:
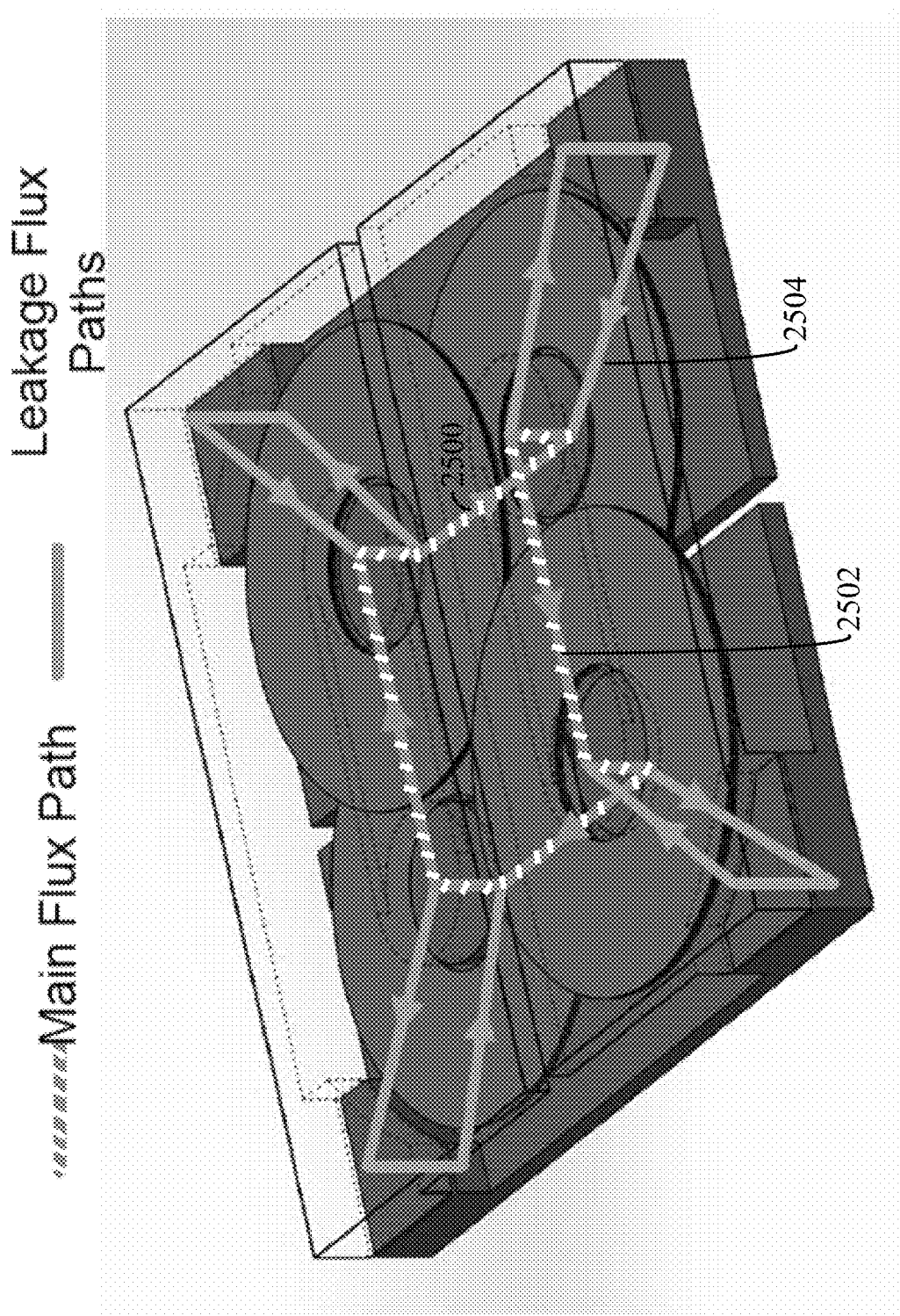
FIG. 25(a) shows a planar multi-winding transformer with integrated leakage: one possible physical implementation (4M-4L Horizontal).
Figure 25B:
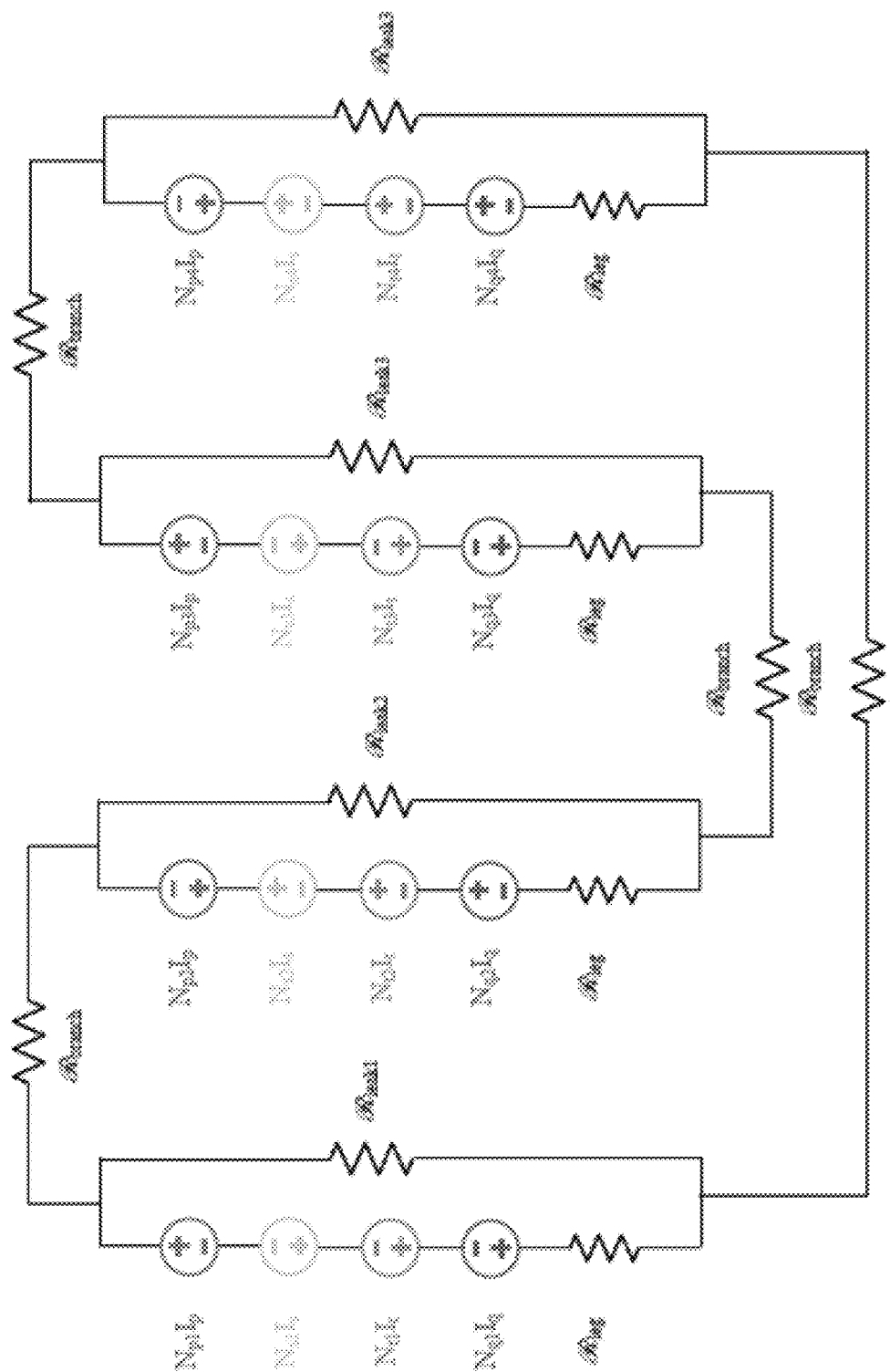
FIG. 25(b) shows a planar multi-winding transformer with integrated leakage: reluctance modeling of the disclosed transformer.

An exemplary embodiment of the disclosed family of MWITs is shown in FIG. 25(a), with the equivalent reluctance model described in FIG. 25(b). By ensuring a single main flux path 2502, any undesirable flux bifurcations are avoided, see G. C. Knabben, J. Schafer, L. Peluso, J. W. Kolar, M. J. Kasper, and G. Deboy, "New PCB Winding "Snake-Core" Matrix Transformer for Ultra-Compact Wide DC Input Voltage Range Hybrid B+DCM Resonant Server Power Supply," in 2018 IEEE International Power Electronics and Application Conference and Exposition (PEAC), November 2018, and precise control over leakage inductance associated with each winding is possible by regulating the effective reluctance of each leg. The single main flux path 2502 (dotted line) also enables asymmetric interleaving of different windings on different legs of the magnetic structure, which provides low winding AC resistance by mitigating proximity effects. Additionally, this disclosed structure allows compatibility with matrix transformer configurations which are especially suited for high-current winding implementations. It is noted that for converters operating at high switching frequency and high-power levels, the value of required branch inductances can be significantly lower. These low values of required inductances enable the use of the gaps in between windings to create leakage in addition to the magnetic shunt leakage paths 2504 (solid line) in the disclosed magnetic structure.

Figures 26A, 26B, 26C:
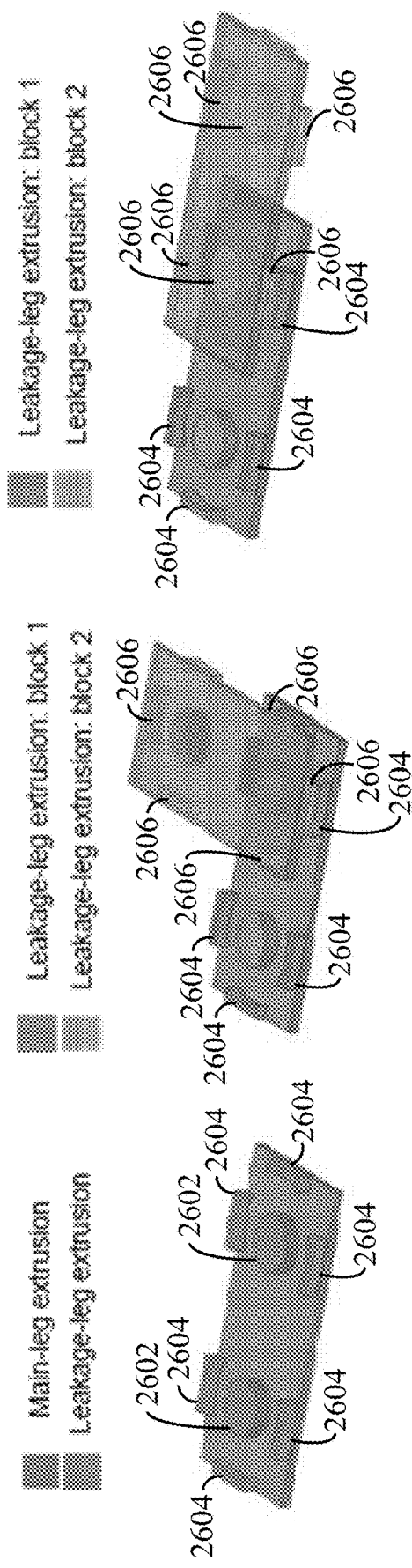
FIG. 26(a) shows Ferrite core element configuration to create the disclosed transformer structure: Fundamental building block.
FIG. 26(b) shows Ferrite core element configuration to create the disclosed transformer structure: Right angle placement of two ferrite blocs.
FIG. 26(c) shows Ferrite core element configuration to create the disclosed transformer structure: Linear placement of two ferrite blocks.
Figures 27A, 27B, 27C:
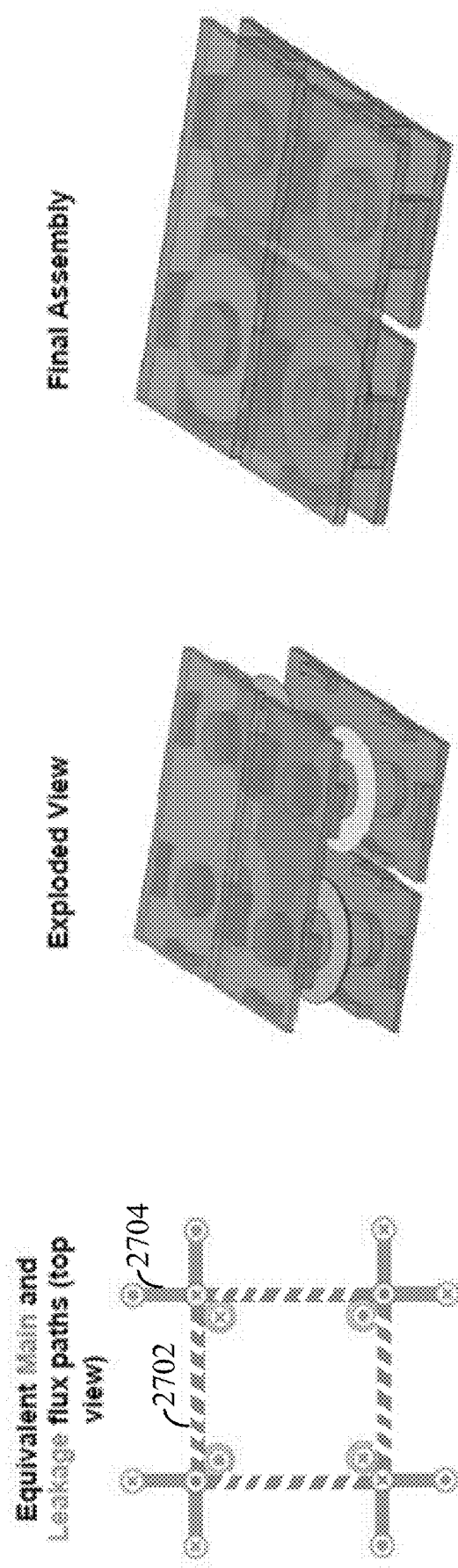
FIG. 27(a) shows a main and leakage flux path of a 4M-8L structure.
FIG. 27(b) shows an exploded view of a 4M-8L structure.
FIG. 27(c) shows 3D model of the fully assembled 4M-8L MWIT.
Figures 28A, 28B, 28C:
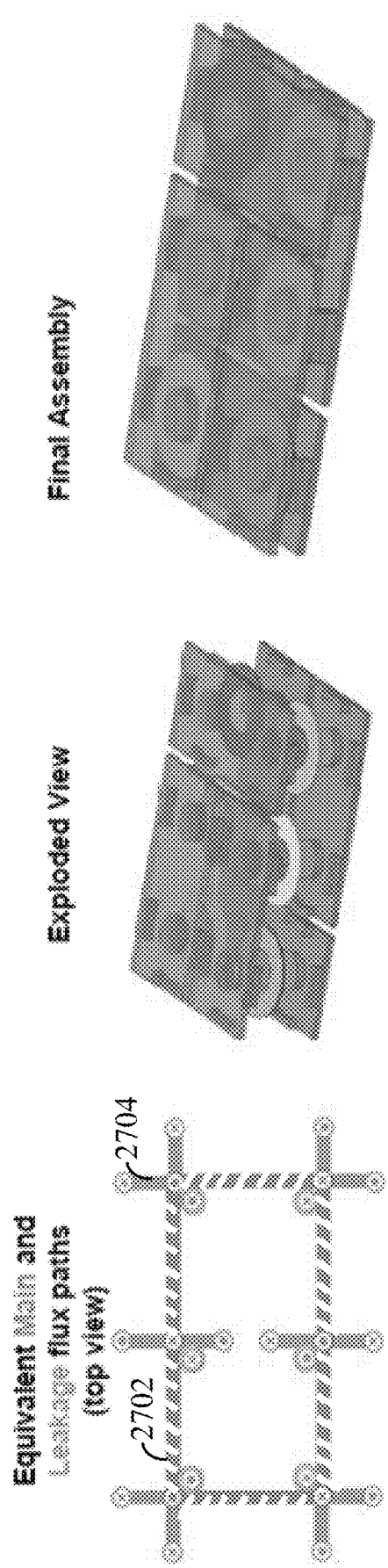
FIG. 28(a) shows a main and leakage flux path of a 6M-12L structure.
FIG. 28(b) shows an exploded view of a 6M-12L structure.
FIG. 28(c) shows 3D model of the fully assembled 6M-12L MWIT.

While the MWIT structure presented above describes a four-winding structure, the generality of this disclosed configuration and design methodology allows easy extension to higher winding numbers, thus resulting in a truly extendable design framework for MWITs. The following embodiments introduce a fully extendable structure that can be used for an n-winding MWIT, that can be constructed by repeating the fundamental building block shown in FIG. 26(a). The building block comprises a ferrite material with two types of extrusions: main leg ('M') 2602 and leakage leg (1') 2604. The height of the main leg extrusion is greater than that of the leakage leg to introduce an airgap in the core. FIG. 26(b) and FIG. 26(c) illustrate two possible arrangements in which the building block can be placed. It is noted that in both cases, the overlapping main leg extrusions of the two blocks are in full contact with each other (no airgap) whereas two leakage leg extrusions 2604, 2606 overlap to form an airgap. Furthermore, there will be an additional non-overlapping leakage-leg extrusion that has a significantly larger airgap between the other block and will not form a leakage leg. To summarize, by placing two ferrite blocks as shown in FIG. 26(b) and FIG. 26(c), one main flux path and two-leakage paths are formed. The reluctance of these leakage paths can be controlled by varying the length of leakage-leg extrusions.

Figure 30:
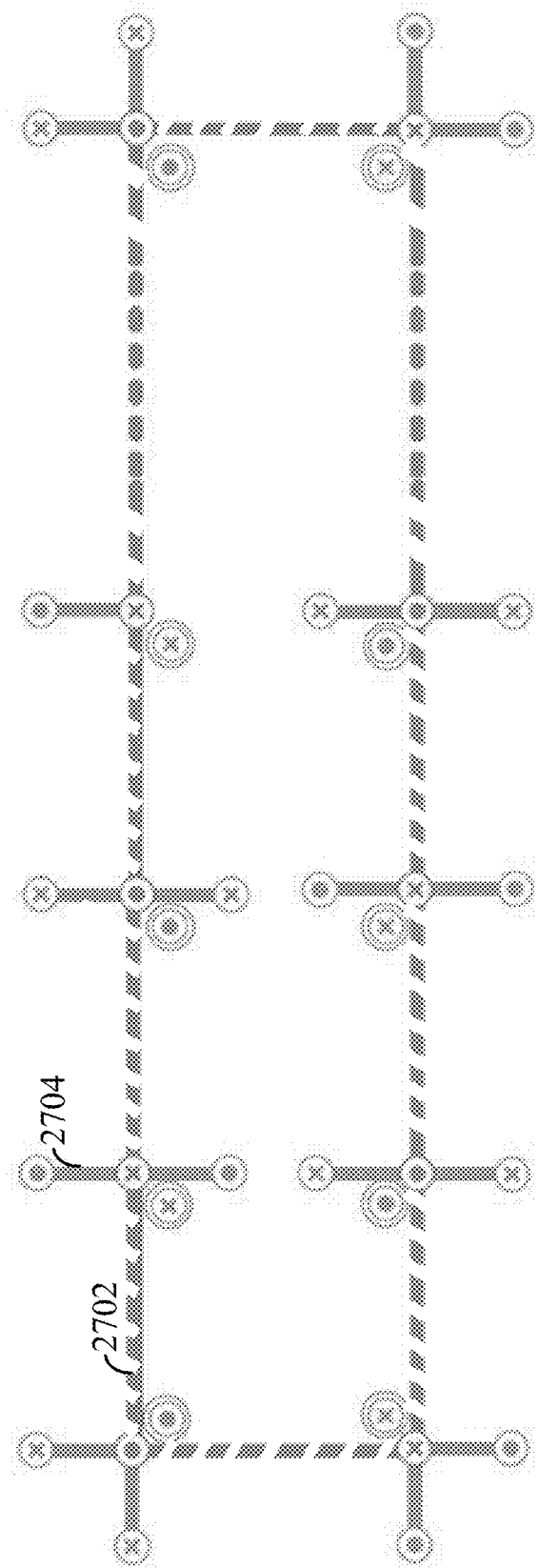
FIG. 30 shows a main and leakage flux path of an nM-2 nL structure.

FIG. 27(a)-27(c), FIG. 28(a)-28(c), and FIG. 29(a)-29(c) illustrate the embodiments realizing 4M-8L, 6M-12L, and 8M-16L MWIT structures. The main 2702 and leakage 2704 flux paths for each design along with their 3D models are presented for all three designs. It is noted that this structure can be easily extended to an arbitrary number of main legs as shown in FIG. 30, by introducing additional fundamental building blocks. The generality of this disclosed configuration and design methodology allows easy extension to higher winding numbers, thus resulting in a truly extendable design framework for MWITs.

2. Systematic MWIT Design and Optimization Process

Figure 31:
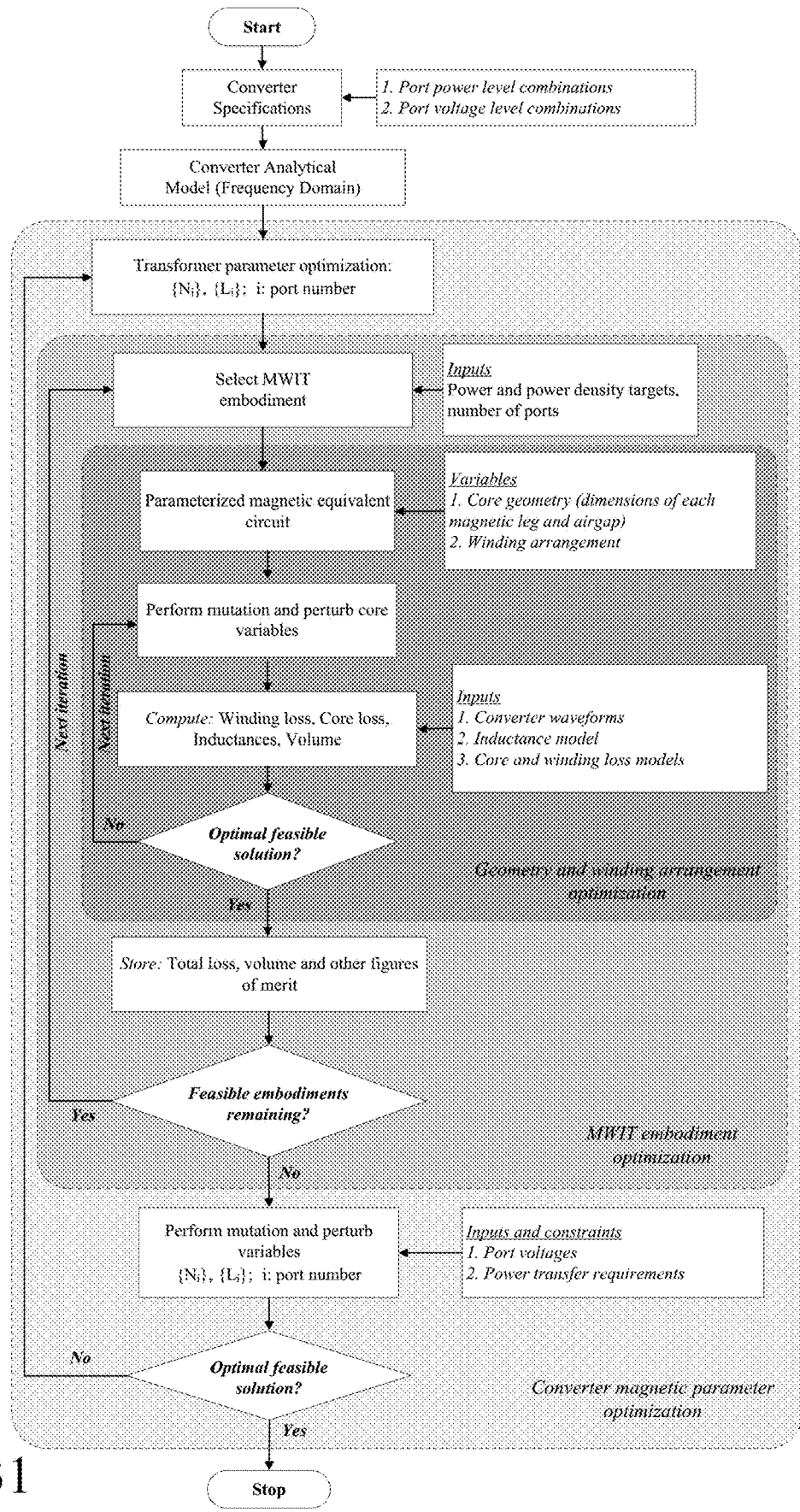
FIG. 31 shows a flow-chart of the MWIT design and optimization methodology.

In this section, a unified design approach for the (MWIT is discussed, which is used to obtain multi-objective optimized transformer design. The disclosed family of MWITs use multiple leakage and main magnetic flux paths to achieve full controllability over the magnetizing, mutual and leakage inductances. However, the increased number of ports and sophisticated core geometries present a complex optimization problem for a MWIT designed to a specific requirement. The disclosed optimization strategy seeks to systemize this process and is applicable to all the MWIT designs covered in this disclosure. As the MWIT optimization depends on the converter topology, the disclosed optimization algorithm considers all Multi-Active-Bridge (MAB)-derived converter topologies, including resonant and non-resonant versions. To accomplish this, an analytical model of the MAB converter is used. For example, a Generalized Harmonic Approximation (GHA) based frequency domain converter model can be used for this purpose, see Zou, S., Lu, J. and Khaligh, A. (2020), Modelling and control of a triple-active-bridge converter. IET Power Electronics, 13: 961-969. Due to the sophisticated correlations between MWIT design and overall converter performance, the optimization consists of three iterative/genetic algorithm-based processes. FIG. 31 shows the flow-chart of the disclosed MWIT design methodology. The design process is initiated by defining the converter specifications including port voltages and power levels.

The innermost loop optimizes the MWIT geometry and winding arrangement, which is vital to realize a feasible and optimal MWIT design for a given number of turns and an MWIT embodiment. For this purpose, the MWIT geometry is parameterized using its key dimensions. Subsequently, a magnetic equivalent circuit which captures the magnetic behavior of the winding arrangement is developed. The obtained parameterized equivalent circuit model is fed to a genetic algorithm which performs mutations and perturbations of core dimension and winding arrangement parameters to evaluate a multitude of MWIT realizations. It is worth noting that other optimization processes/algorithms can also be used in place of genetic algorithms without any major changes to the disclosed optimization flow. Each perturbation is analyzed to compute the corresponding inductances and AC resistances on each port. Furthermore, the obtained inductances and AC resistances are used to obtain converter waveforms using the analytical model of the converter. These voltage and current waveforms are then used to compute the winding and core losses of the transformer as well as the overall converter performance (in terms of overall efficiency and achieving soft switching). The winding and core loss computation methods for a given transformer geometry and winding arrangement are well-established from existing literature. Feasible and optimal design realizations are then stored in a database with key performance parameters including total loss and volume. The middle-loop sweeps through available set of feasible MWIT embodiments (e.g. FIG. 22(a)-22(d)) to evaluate the performance across different design structures. The outer-most loop consists of an algorithm to mutate and perturb the number of turns (Ni) and target leakage inductance (Li) of each port to capture the effects on MWIT as well as overall converter performance. As a result of the optimization process, a pareto-optimal MWIT realization in terms of total losses and volume is selected from the generated MWIT realization database.

The abovementioned MWIT design process combines the transformer core geometry, inductance, winding and core losses, volume, as well as the realistic converter operation in a holistic multi-dimensional and multi-objective framework to systemize the MWIT design process. Moreover, it is noted that optimal design realization of an MWIT is not possible without such a multi-dimensional multi-objective optimization process.

What is claimed is:

1. A planar integrated transformer device comprising:
   a multi-legged core comprising one or more main legs and one or more leakage legs;
   one or more vertically stacked printed circuit boards (PCBs) located around each main leg; and
   two or more windings each located over one or more of the vertically-stacked PCBs, wherein
   each winding of the two or more windings being operably associated with an electrical port,
   wherein values of reluctance of the one or more main legs and the one or more leakage legs depend on dimensions of the one or more main legs and the one or more leakage legs and dimensions of air gaps introduced in series with the one or more main legs and the one or more leakage legs.

2. The planar integrated transformer according to claim 1, wherein
   the air gaps are located in a core of the transformer in a direction along a main flux path, to avoid flux bifurcations in the main flux path.

3. The planar integrated transformer according to claim 1, wherein
   the main flux path and a leakage flux path propagate in either one-dimensional (1D), two-dimensional (2D), or three-dimensional (3D) paths within a core geometry.

4. The planar integrated transformer device according to claim 1, wherein
   windings associated with different ports are asymmetrically distributed across the one or more main legs of the multi-legged core, and the windings associated with different ports are interleaved or non-interleaved, and arranged in any order from top to bottom on each main leg.

5. The planar integrated transformer device according to claim 1, wherein two or more windings from the same port are connected in parallel.

6. The planar integrated transformer device according to claim 1, wherein one or more of windings of the transformer are Litz wire windings.

7. The planar integrated transformer device according to claim 1, wherein
   each of one or more vertically stacked PCBs comprises at most twelve winding layers.

8. The planar integrated transformer device according to claim 1, wherein
   a core is made of ferrite, or any other magnetic material.

9. The planar integrated transformer according to claim 1, wherein
   multiple windings are operably associated with the same electrical port.

* * * * *